United States Patent
Oh et al.

(10) Patent No.: US 11,462,171 B2
(45) Date of Patent: Oct. 4, 2022

(54) GATE DRIVING CIRCUIT AND FLEXIBLE DISPLAY USING THE SAME

(71) Applicant: LG Display Co., Ltd., Seoul (KR)

(72) Inventors: Dae Seok Oh, Paju-si (KR); Soon Hwan Hong, Paju-si (KR); Seung Tae Jin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/116,852

(22) Filed: Dec. 9, 2020

(65) Prior Publication Data

US 2021/0201813 A1 Jul. 1, 2021

(30) Foreign Application Priority Data

Dec. 31, 2019 (KR) .................. 10-2019-0179497

(51) Int. Cl.
*G09G 3/3266* (2016.01)
*G09G 3/3275* (2016.01)
(Continued)

(52) U.S. Cl.
CPC ........... *G09G 3/3266* (2013.01); *G09G 3/035* (2020.08); *G09G 3/3233* (2013.01);
(Continued)

(58) Field of Classification Search
CPC ........ G09G 3/3266; G09G 3/035; G09G 3/00; G09G 2310/08; G09G 2310/0286;
(Continued)

(56) References Cited

U.S. PATENT DOCUMENTS

| 2012/0038609 A1* | 2/2012 | Chung | ................. G09G 3/3266 345/211 |
| 2015/0061982 A1* | 3/2015 | Woo | ..................... G09G 3/3266 345/82 |

(Continued)

FOREIGN PATENT DOCUMENTS

| KR | 10-2009-0110750 A | 10/2009 |
| KR | 10-2014-0138440 A | 12/2014 |

*Primary Examiner* — Nitin Patel
*Assistant Examiner* — Amen W Bogale
(74) *Attorney, Agent, or Firm* — Seed IP Law Group LLP

(57) ABSTRACT

Disclosed herein are a gate driving circuit and a flexible display using the same. In gate driving circuit, a control block including an $n^{th}$ controller configured to generate one among a gate-off voltage, an EM start signal, and a carry signal from a $(n-1)^{th}$ EM signal transfer part as an $n^{th}$ EM output control signal to apply the $n^{th}$ EM output control signal to a start terminal of an $n^{th}$ EM signal transfer part on the basis of an $n^{th}$ scan signal (n is a natural number) from the first shift register, a first control signal designating an off-driving signal transfer parts and an on-driving signal transfer parts among the EM signal transfer parts, a second control signal designating a first on-driving signal transfer part, and a third control signal designating second to last on-driving signal transfer parts.

17 Claims, 44 Drawing Sheets

(51) Int. Cl.
    *G09G 3/3233*    (2016.01)
    *G09G 5/14*    (2006.01)
    *G09G 3/00*    (2006.01)
(52) U.S. Cl.
    CPC ............. *G09G 3/3275* (2013.01); *G09G 5/14* (2013.01); *G09G 2310/0286* (2013.01); *G09G 2310/0291* (2013.01); *G09G 2310/08* (2013.01); *G09G 2330/021* (2013.01); *G09G 2340/0407* (2013.01); *G09G 2380/02* (2013.01)
(58) Field of Classification Search
    CPC ..... G09G 2330/021; G09G 2340/0407; G09G 2360/02; G09G 2360/04; G09G 2380/02; G09G 5/14; G11C 19/287
    See application file for complete search history.

(56) References Cited

U.S. PATENT DOCUMENTS

| | | | | |
|---|---|---|---|---|
| 2015/0138180 | A1* | 5/2015 | Park | G09G 3/3233 |
| | | | | 345/212 |
| 2015/0371584 | A1* | 12/2015 | Lin | G09G 3/3266 |
| | | | | 345/214 |
| 2016/0035262 | A1* | 2/2016 | Lee | G09G 3/3266 |
| | | | | 345/690 |
| 2016/0133185 | A1* | 5/2016 | Yoon | G09G 3/3233 |
| | | | | 345/76 |
| 2016/0275845 | A1* | 9/2016 | Tsai | G09G 3/3258 |
| 2017/0061878 | A1* | 3/2017 | Park | G09G 3/3233 |

\* cited by examiner

FIG. 11
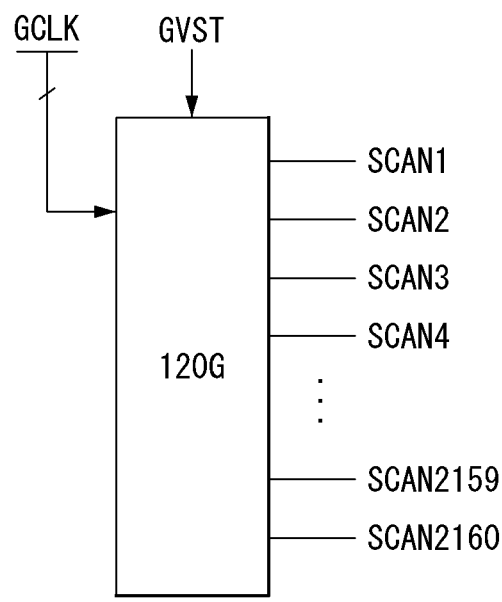
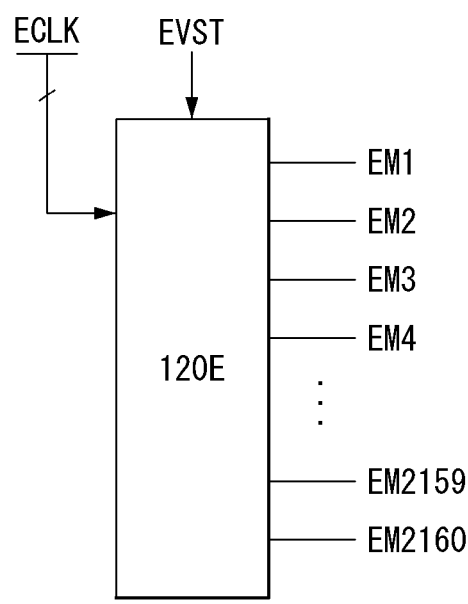

FIG. 16A
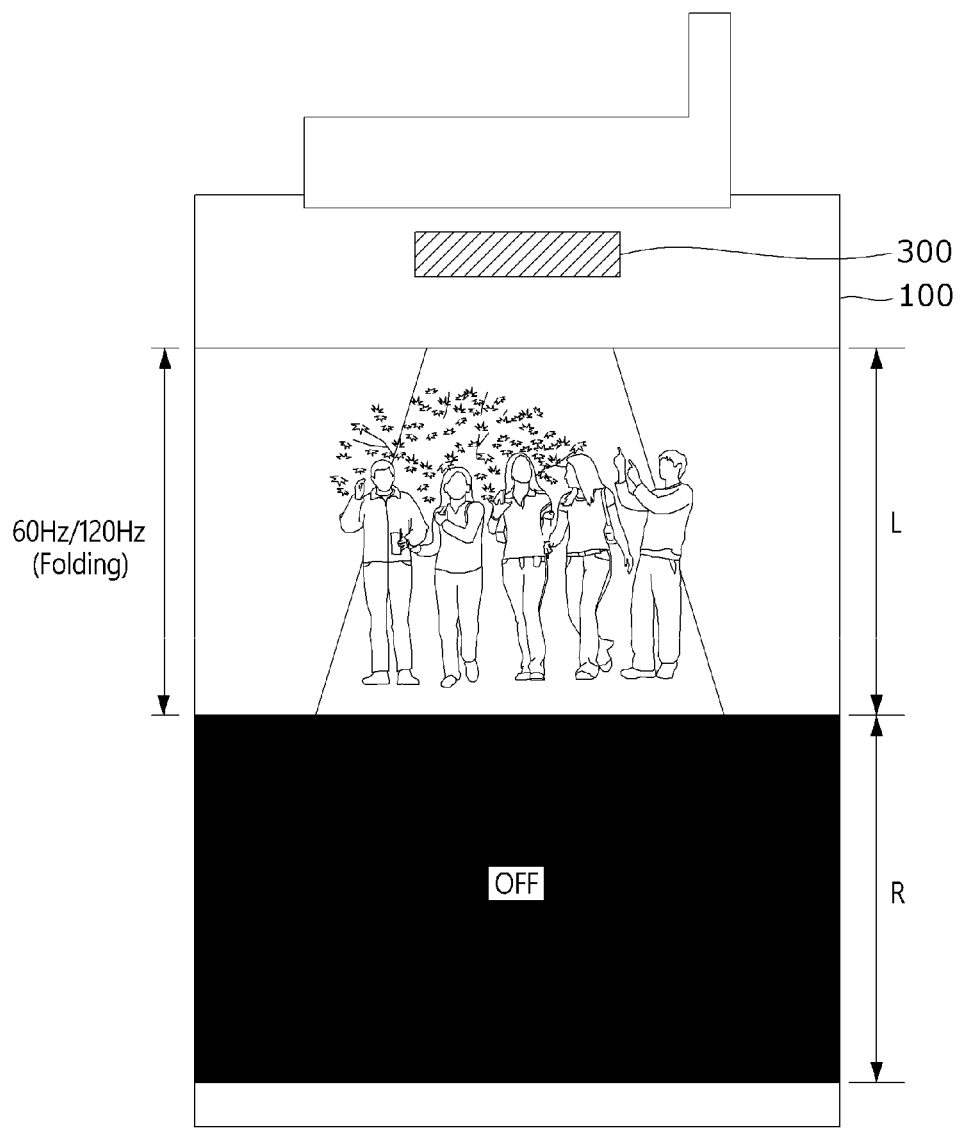
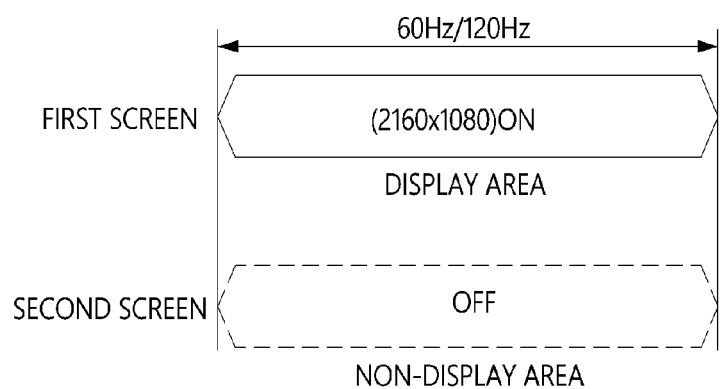

FIG. 16B
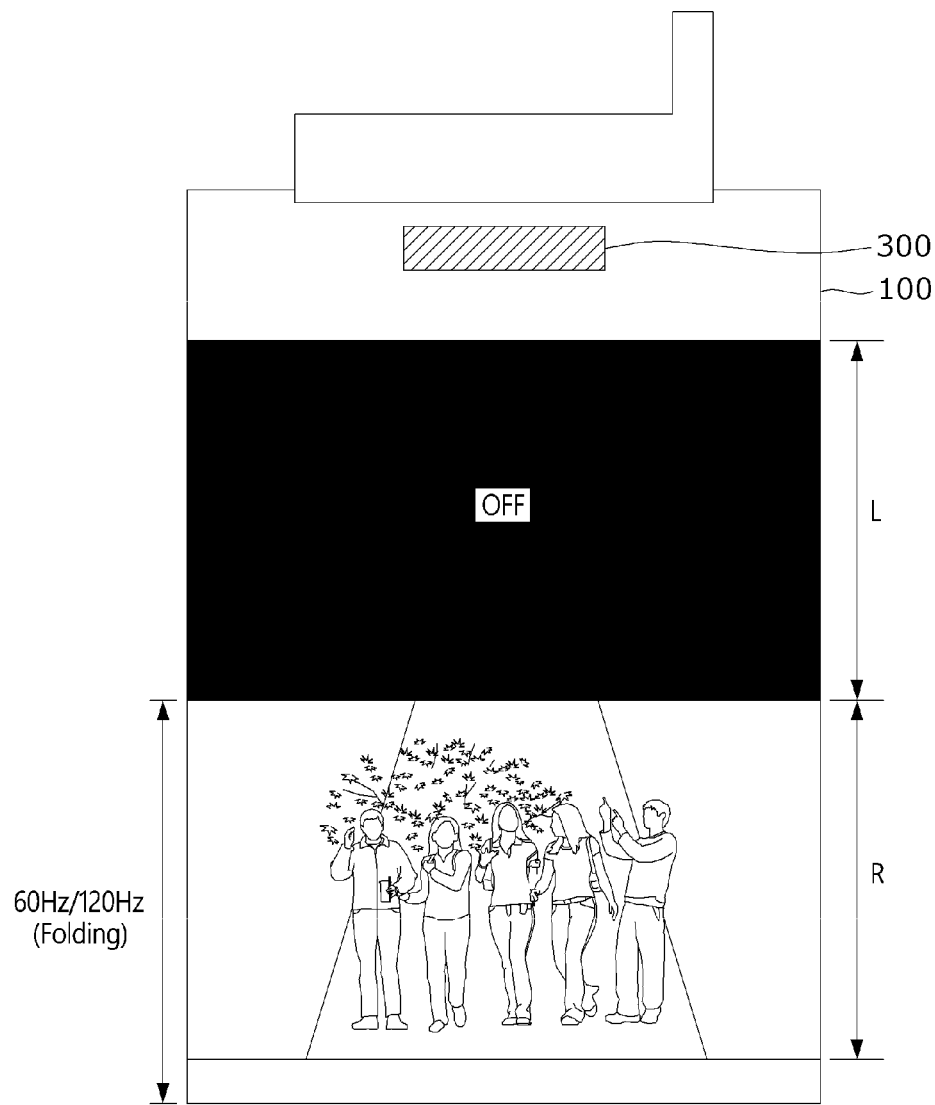
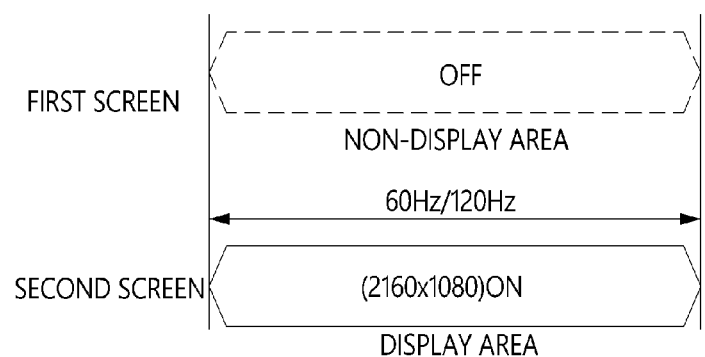

FIG. 17
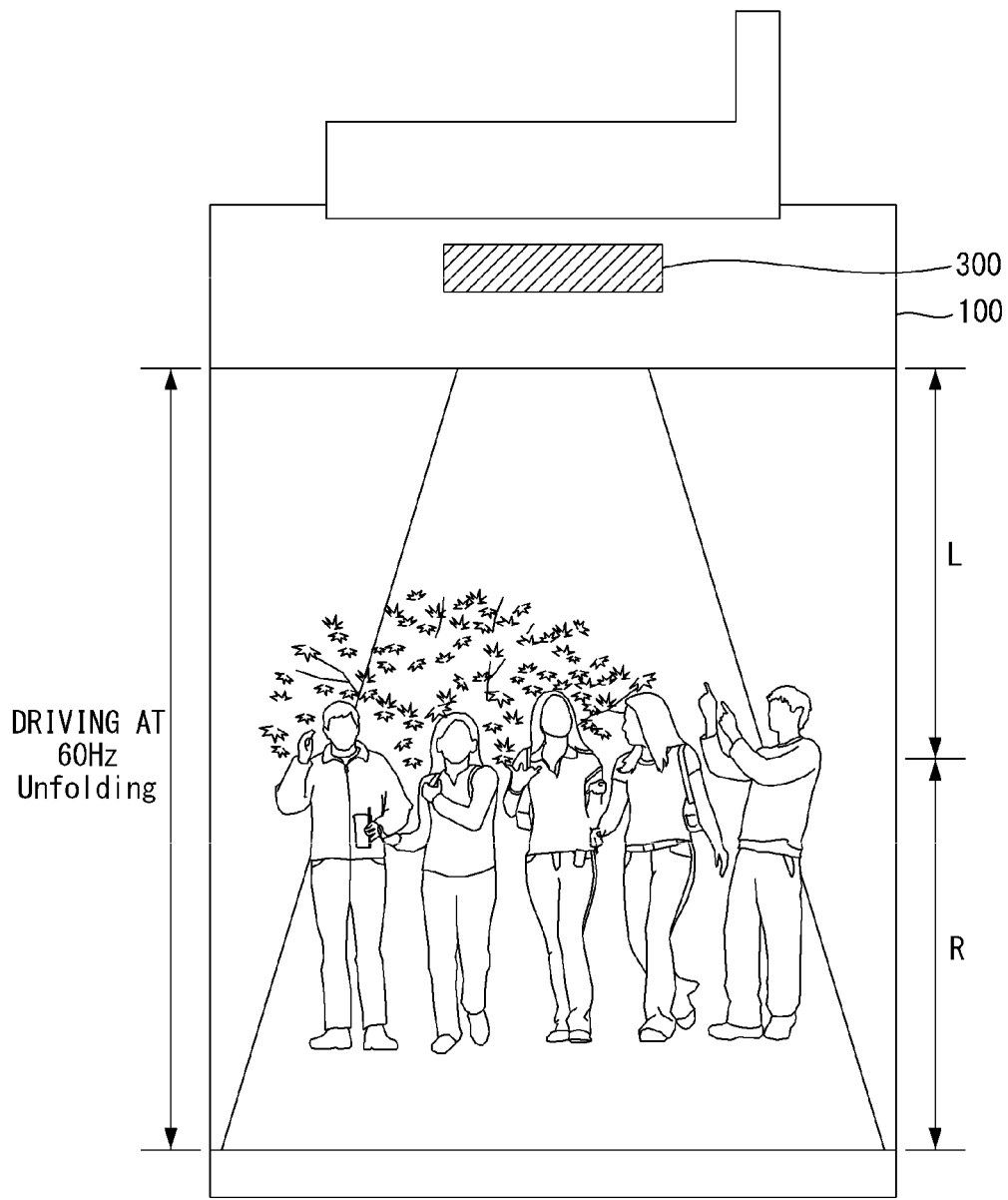
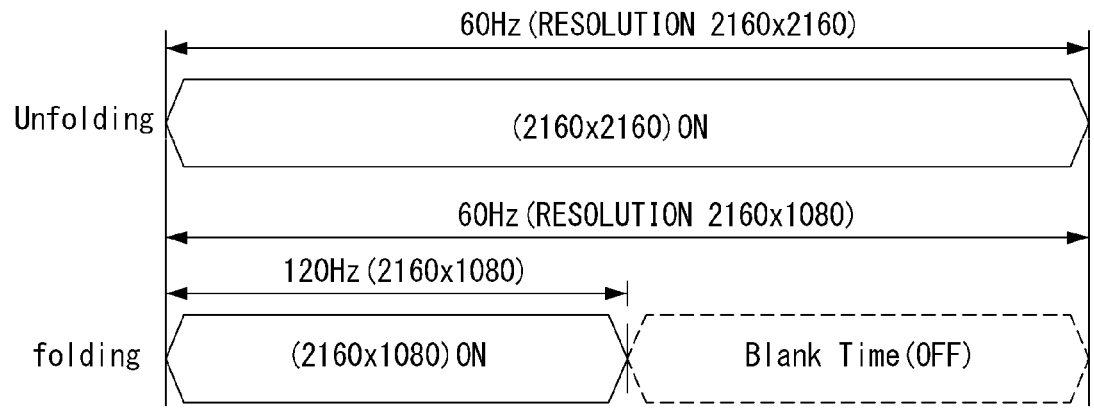

FIG. 24
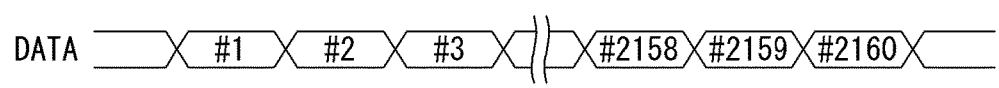
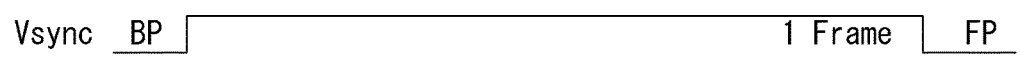
FIG. 25
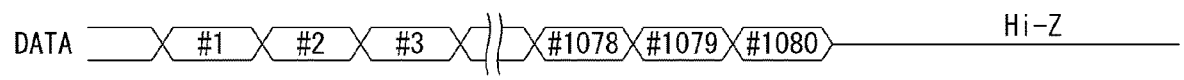
FIG. 26
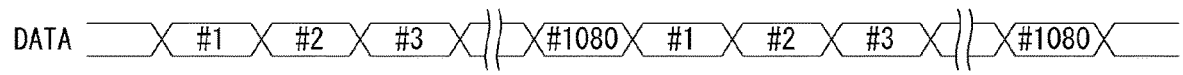
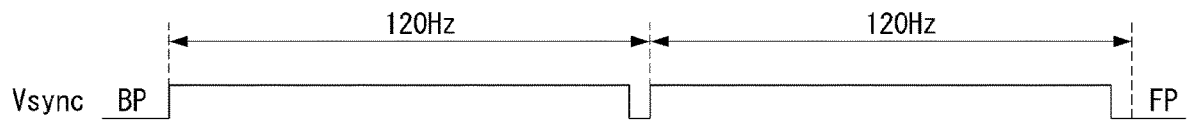

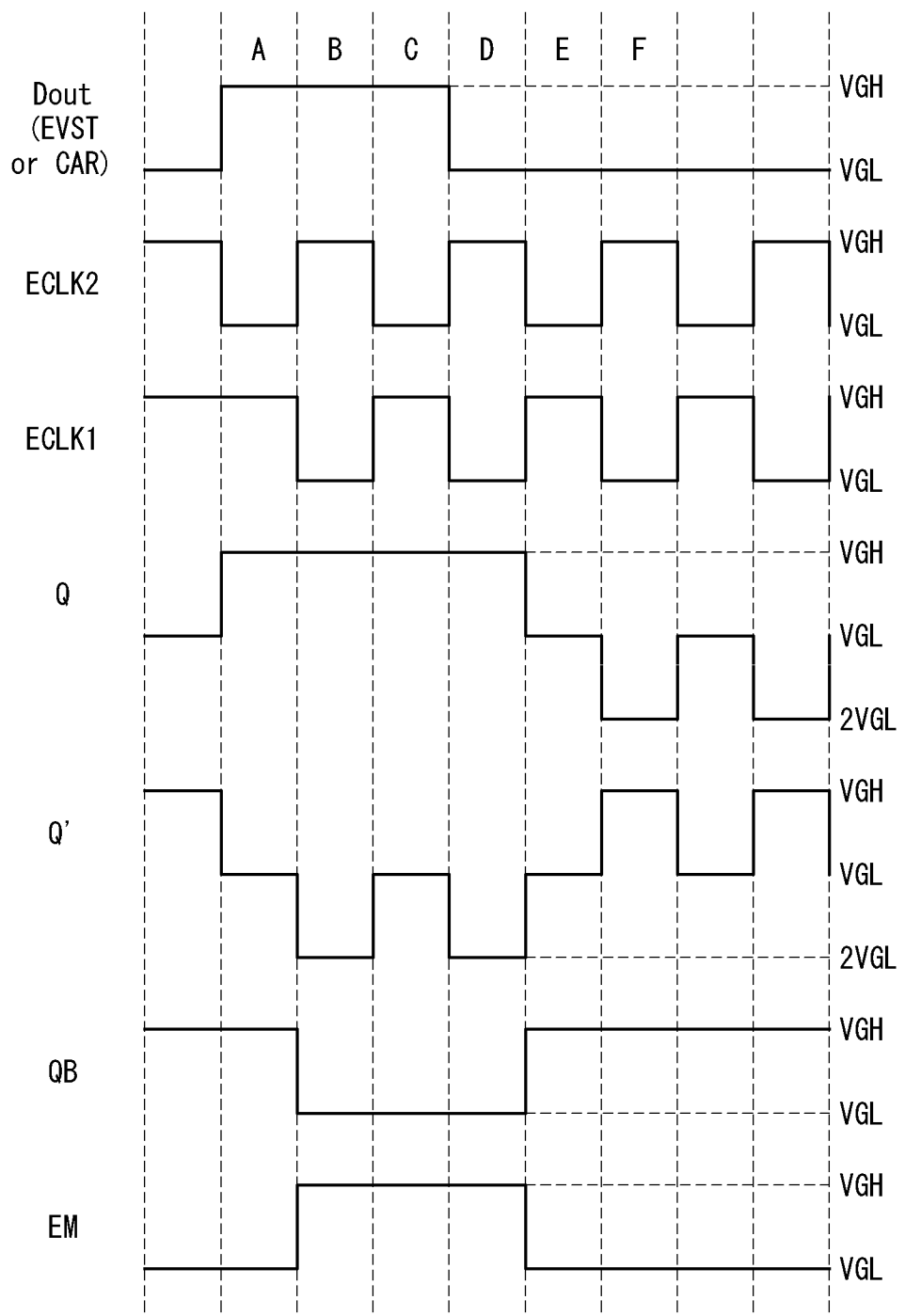

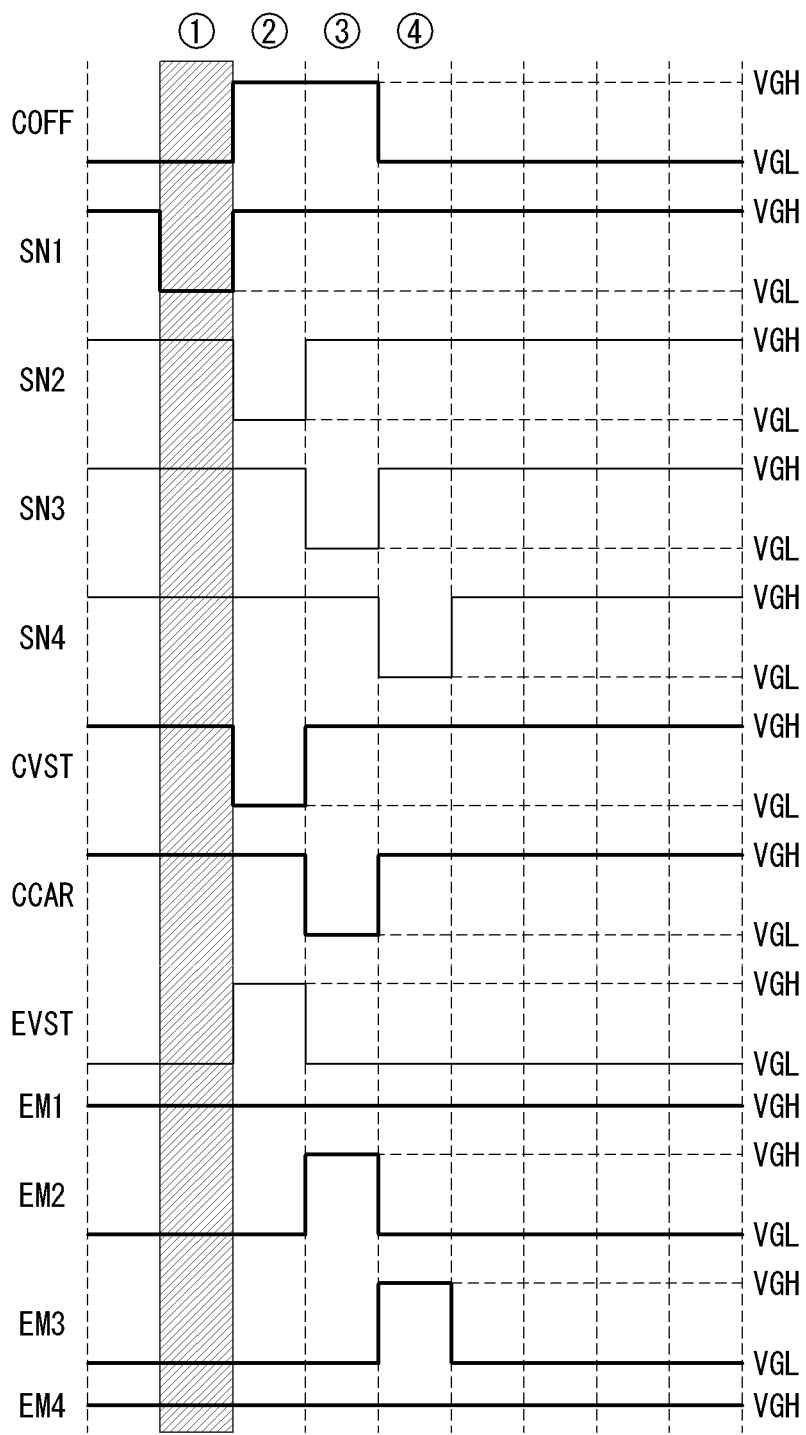

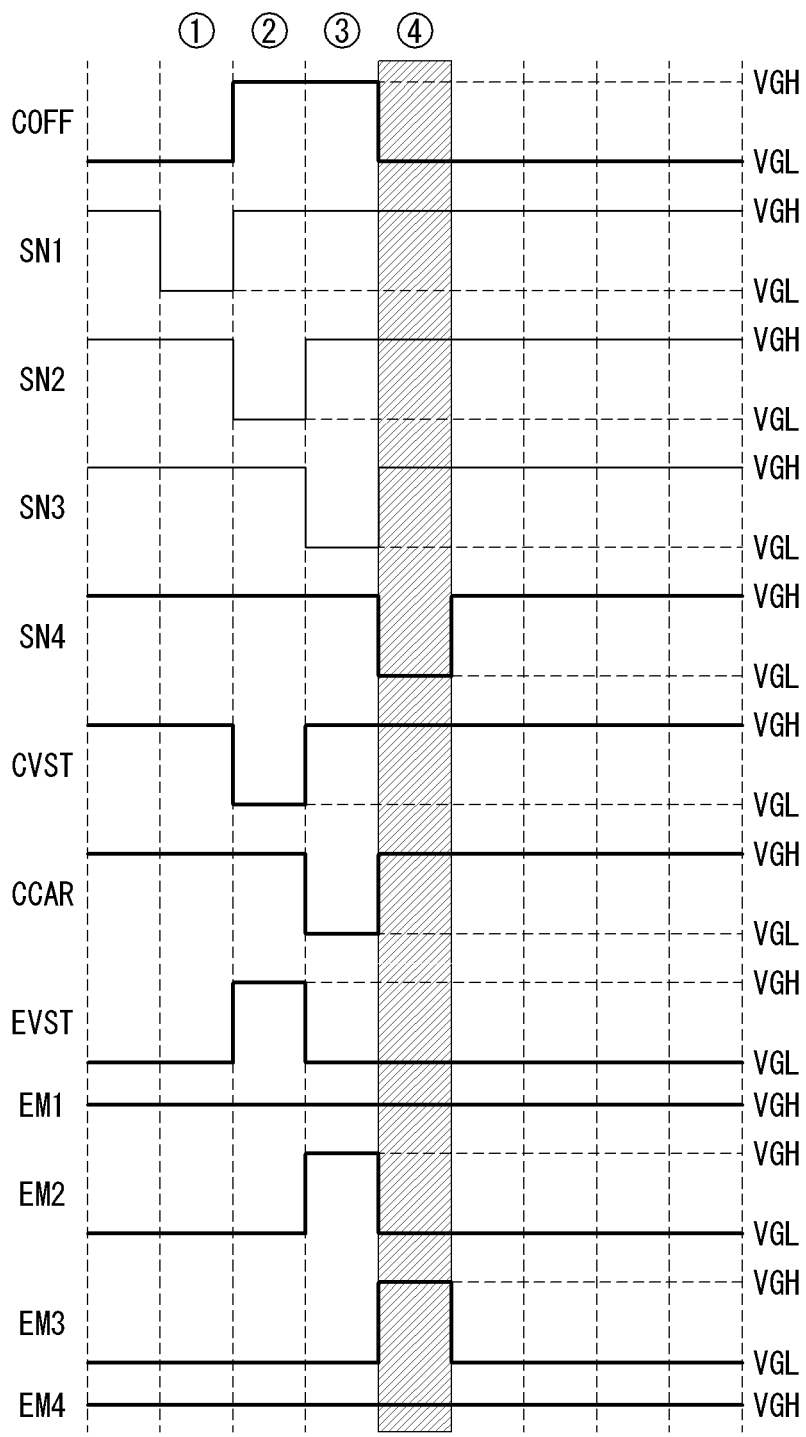

FIG. 37
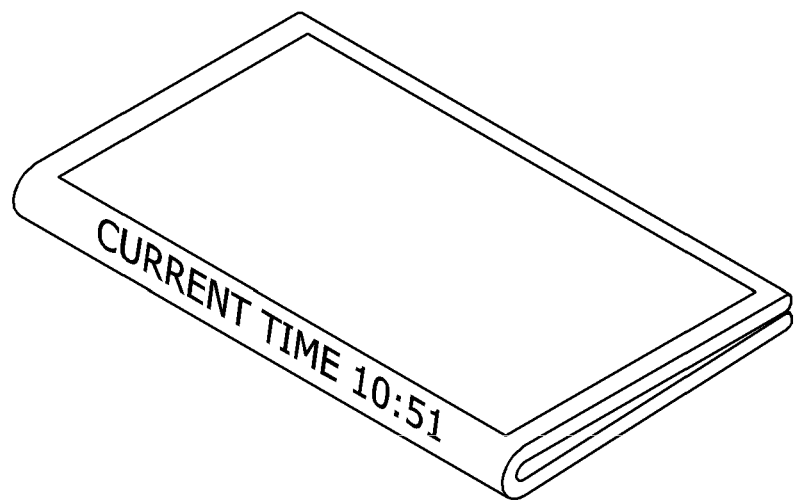
< FOLDING STANDBY STATE >
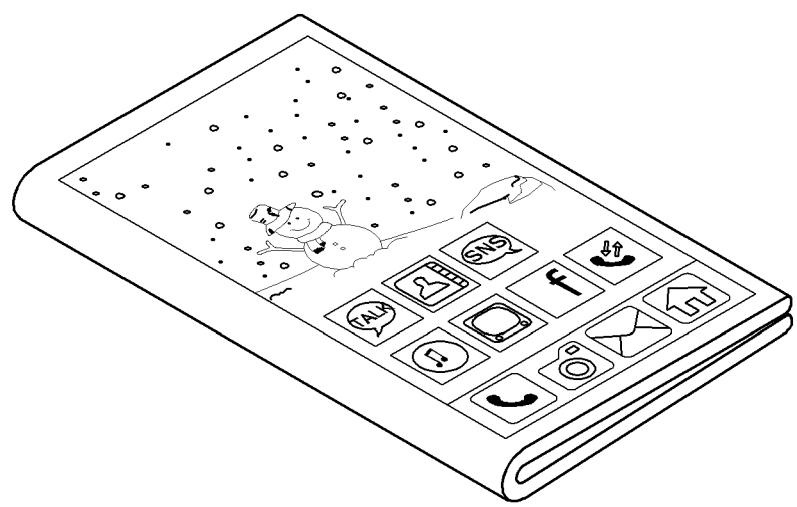
< FOLDING HALF DRIVING>

FIG. 39
(a) 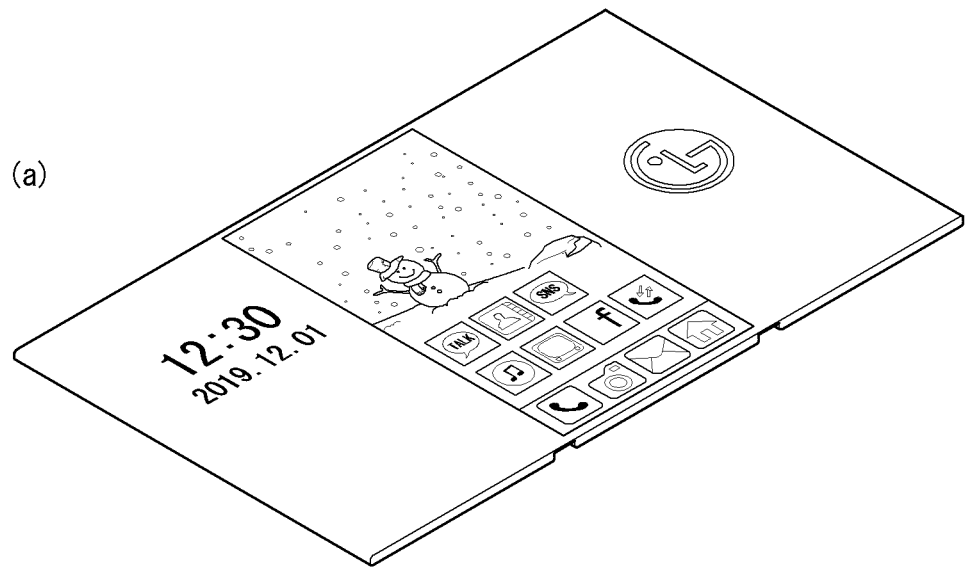
(b) 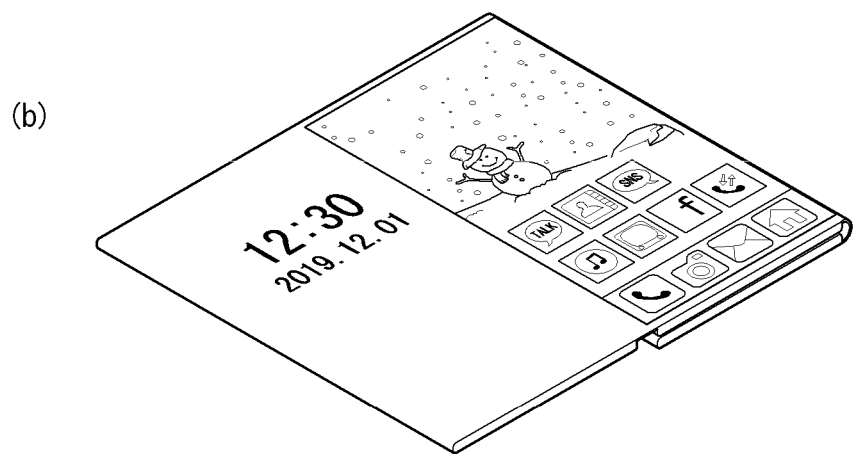
(c) 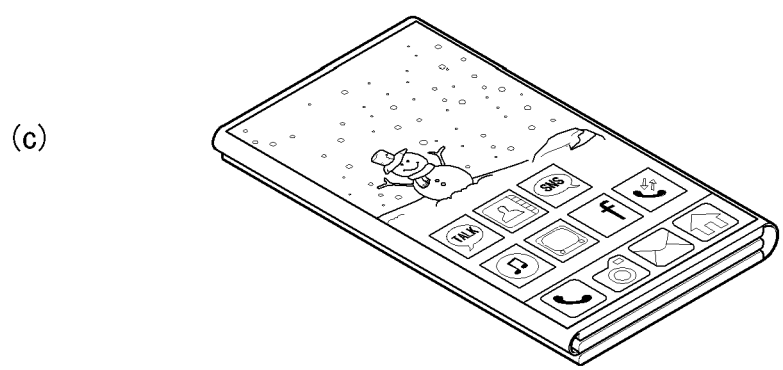

GATE DRIVING CIRCUIT AND FLEXIBLE DISPLAY USING THE SAME

CROSS-REFERENCE TO RELATED APPLICATION(S)

This application claims priority to and the benefit of Korean Patent Application No. 10-2019-0179497, filed Dec. 31, 2019, the disclosure of which is incorporated herein by reference in its entirety.

BACKGROUND

Technical Field

The present disclosure relates to a gate driving circuit and a flexible display using the same.

Description of the Related Art

Electroluminescent display devices are roughly classified into inorganic light emitting display devices and organic light emitting display devices according to materials of light emitting layers. Active matrix type organic light emitting display devices include organic light emitting diodes (hereinafter referred to as "OLEDs"), which emit light by themselves, and have fast response speeds and advantages in which light emission efficiencies, brightness, and viewing angles are high. In the organic light emitting display devices, the OLEDs are formed in pixels. Since the organic light emitting display devices have fast response speeds and are excellent in light emission efficiency, brightness, and viewing angle as well as capable of exhibiting a black gray scale in a full black color, the organic light emitting display devices are excellent in a contrast ratio and color reproducibility.

The organic light emitting display devices do not require backlight units and may be implemented on a plastic substrate, a thin glass substrate, or a metal substrate, which is made of a flexible material. Therefore, flexible displays may be implemented as the organic light emitting display devices.

A screen size of the flexible display may be varied by winding, folding, and bending a flexible display panel. The flexible display may be implemented as a rollable display, a bendable display, a foldable display, a slidable display, or the like. The flexible display devices may be applied not only to mobile devices such as smartphones and tablet personal computers (PCs), but also to televisions (TVs), vehicle displays, and wearable devices, and application fields of the flexible display device are expanding.

The screen size of the foldable display may be varied by folding or unfolding a large screen. An information device employing a foldable display has a problem in that power consumption is greater than that of a conventional mobile device due to a large screen. For example, since a foldable phone employs a foldable display of 7 inches or more, a load of a display panel increases 5.7 times as compared to that of the existing smart phone, and thus power consumption increases largely. The increase in power consumption causes a reduction in battery lifetime. Consequently, the foldable phone requires a battery which is much larger in capacity than that of the existing smart phone.

BRIEF SUMMARY

The present disclosure is directed to solving all the above-described necessity and problems.

The present disclosure is directed to a gate driving circuit allowing an activated area in a screen to be freely adjusted and a flexible display allowing power consumption to be reduced and varying a driving frequency of the activated area using the gate driving circuit.

It should be noted that objectives of the present disclosure are not limited to the above-described objectives, and other objects of the present disclosure will be apparent to those skilled in the art from the following descriptions.

According to an aspect of the present disclosure, there is provided a gate driving circuit including a first shift register configured to output scan signals of a gate-on voltage, wherein phases of the scan signals are sequentially delayed; a second shift register having a plurality of light emission (EM) signal transfer parts which are connected in cascade through a clock line and a carry signal line, wherein each of the EM signal transfer parts operates as off-driving signal transfer parts which output an EM signal of a gate-off voltage or operates as on-driving signal transfer parts which output an EM signal including a gate-on voltage, according to an EM output control signal input to a start terminal; and a control block including an $n^{th}$ controller configured to generate one among the gate-off voltage, an EM start signal, and a carry signal from a $(n-1)^{th}$ EM signal transfer part as an $n^{th}$ EM output control signal to apply the $n^{th}$ EM output control signal to a start terminal of an $n^{th}$ EM signal transfer part on the basis of an $n^{th}$ scan signal (n is a natural number) from the first shift register, a first control signal designating the off-driving signal transfer parts and the on-driving signal transfer parts among the EM signal transfer parts, a second control signal designating a first on-driving signal transfer part among the on-driving signal transfer parts, and a third control signal designating second to last on-driving signal transfer parts among the on-driving signal transfer parts.

BRIEF DESCRIPTION OF THE SEVERAL VIEWS OF THE DRAWINGS

The above and other objects, features and advantages of the present disclosure will become more apparent to those of ordinary skill in the art by describing exemplary embodiments thereof in detail with reference to the attached drawings, in which:

FIG. 11 is a diagram illustrating first and second shift registers of the gate driver;

FIGS. 16A and 16B are diagrams illustrating screens in a folded state on the foldable display of the present disclosure;

FIG. 17 is a diagram illustrating a screen in an unfolded state on the foldable display of the present disclosure;

FIG. 24 is a waveform diagram illustrating a data signal and a vertical synchronization signal when the entire screen is activated;

FIG. 25 is a waveform diagram illustrating a data signal and a vertical synchronization signal when the first screen is driven at the frame frequency of 60 Hz;

FIG. 26 is a waveform diagram illustrating a data signal and a vertical synchronization signal when the first screen is driven at the frame frequency of 120 Hz;

FIG. 31A is a timing diagram illustrating driving an EM signal transfer part, which drives an activated area, once;

FIGS. 33A to 36B are diagrams for sequentially describing that first and fourth EM signal transfer parts of the second shift register are driven to be turned off and second and third EM signal transfer parts thereof are driven to be turned on;

FIGS. 37 and 38 are diagrams illustrating a display state of a screen and data driving timing for reduction in power consumption during folding waiting and folding half driving; and FIGS. 39 and 40 are diagrams illustrating a display state of the screen and data driving timing for reduction in power consumption during multi-folding.

DETAILED DESCRIPTION

Figure 1:
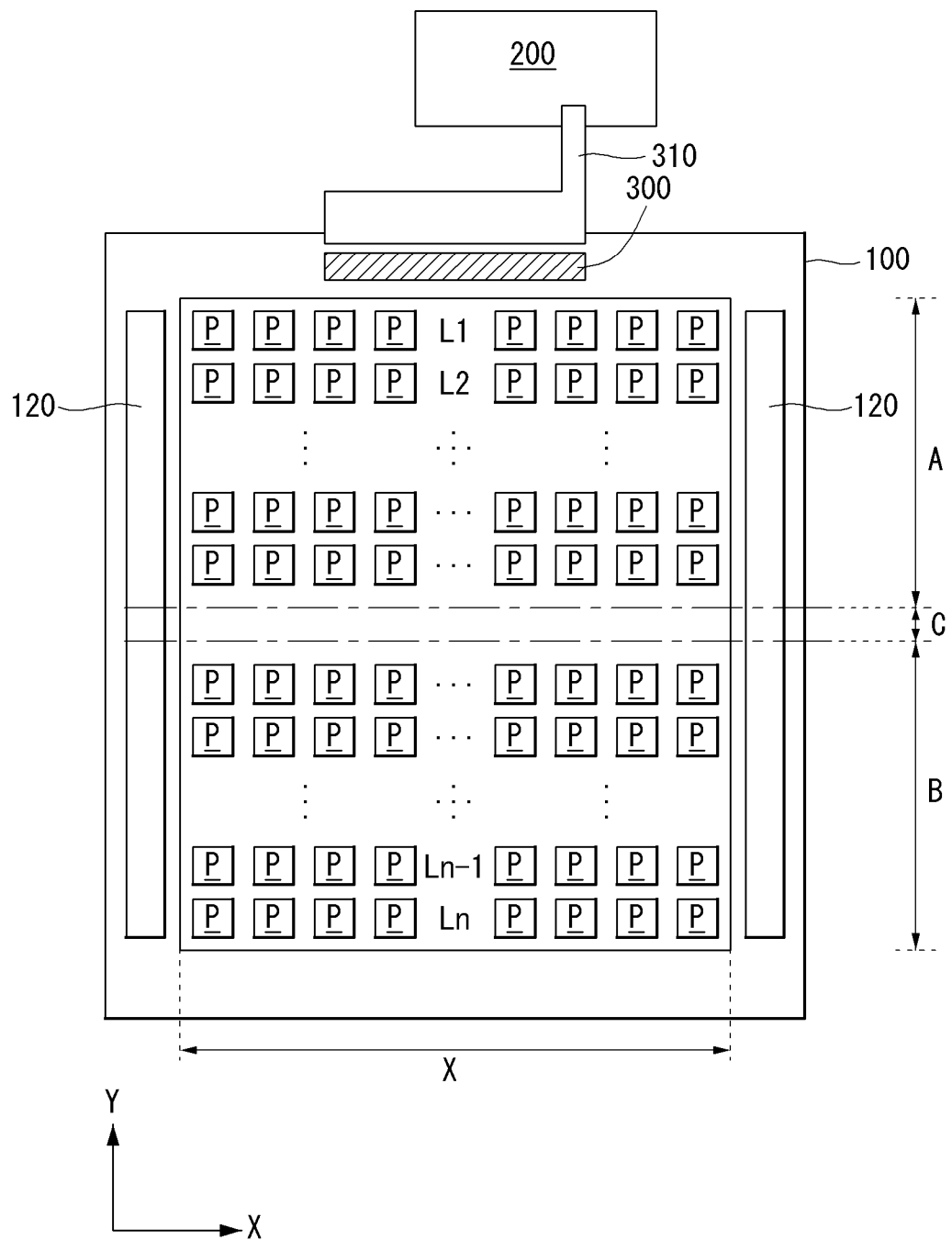
FIG. 1 is a block diagram illustrating a foldable display according to one embodiment of the present disclosure.

Advantages, features, and implementations thereof will be apparent from embodiments which are described in detail below together with the accompanying drawings. The present disclosure may, however, be implemented in many different forms and should not be construed as being limited to the embodiments set forth herein, and the embodiments are provided such that this disclosure will be thorough and complete and will fully convey the scope of the present disclosure to those skilled in the art to which the present disclosure pertains, and the present disclosure is defined by only the scope of the appended claims.

Shapes, sizes, ratios, angles, numbers, and the like disclosed in the drawings for describing the embodiments of the present disclosure are illustrative, and thus the present disclosure is not limited to the illustrated matters. The same reference numerals refer to the same components throughout this disclosure. Further, in the following description of the present disclosure, when a detailed description of a known related art is determined to be unnecessary to understand the gist of the present disclosure, the detailed description thereof will be omitted herein.

When the terms "including," "having," "consisting of," and the like mentioned in this disclosure are used, other parts may be added unless the term "only" is used herein. When a component is expressed as a singular number, the plural number is included unless otherwise specified.

In analyzing a component, it is interpreted as including an error range even when there is no explicit description.

In describing a positional relationship, for example, when a positional relationship of two parts is described as being "on," "above," "below, "next to," or the like, unless "immediately" or "directly" is used, one or more other parts may be located between the two parts.

In describing the embodiments, although the terms first, second, and the like are used to describe various components, these components are not substantially limited by these terms. These terms are used only to distinguish one component from another component. Therefore, a first component described below may substantially be a second component within the technical spirit of the present disclosure.

The same reference numerals refer to the same components throughout this disclosure.

Features of various embodiments of the present disclosure may be partially or entirely coupled or combined with each other and may technically be various interlocking and driving, and the embodiments may be independently implemented with respect to each other or implemented together with a correlation.

In a foldable display of the present disclosure, each of a pixel circuit and a gate driver may include a plurality of transistors. The transistors may be implemented as oxide thin film transistors (TFTs) including oxide semiconductors, low temperature poly silicon (LTPS) TFTs including LTPSs, and the like. Each of the transistors may be implemented as a p-channel TFT or an n-channel TFT. In the embodiment, the transistors of a pixel circuit are mainly described as an example implemented as p-channel TFTs, but the present disclosure is not limited thereto.

The transistor is a three-electrode element including a gate, a source, and a drain. The source is an electrode for supplying a carrier to the transistor. In the transistor, the carries begins to flow from the source. The drain is an electrode in which the carrier is discharged from the transistor to the outside. In the transistor, the carrier flows from the source to the drain. In the case of an n-channel transistor, since the carrier is an electron, a source voltage is lower than a drain voltage so as to allow electrons to flow from the source to the drain. In the n-channel transistor, a current flows in a direction from the drain to the source. In the case of a p-channel transistor (a p-type metal oxide semiconductor (PMOS)), since the carrier is a hole, the source voltage is higher than the drain voltage so as to allow holes to flow from the source to the drain. In the p-channel transistor, since the holes flow from the source to the drain, a current flows from the source to the drain. It should be noted that the source and the drain of the transistor are not fixed. For example, the source and the drain may be changed according to an applied voltage. Therefore, the present disclosure is not limited due to the source and the drain of the transistor. In the following description, the source and the drain of the transistor will be referred to as a first electrode and a second electrode, respectively.

A gate signal swings between a gate on voltage and a gate off voltage. The gate on voltage is set to a voltage that is higher than a threshold voltage of the transistor, and the gate off voltage is set to a voltage that is lower than the threshold voltage of the transistor. The transistor is turned on in response to the gate on voltage, whereas the transistor is turned off in response to the gate off voltage. In the case of the n-channel transistor, the gate on voltage may be a gate high voltage (VGH), and the gate off voltage may be a gate low voltage (VGL). In the case of the p-channel transistor, the gate on voltage may be the VGL, and the gate off voltage may be the VGH.

In the following embodiments, a flexible display is mainly described focusing on a foldable display and a rollable display, but the present disclosure is not limited thereto.

An activated area, a deactivated area, a high-speed driving area, and a low-speed driving area, which are described in the following embodiments, are defined as follows.

A screen of the foldable display may be folded. In a folded state and an unfolded state of the foldable display, a resolution and a size of the screen may be varied. In the folded state in which the flexible display panel is folded, a portion of the screen may be activated, whereas the remaining portion thereof may be deactivated. Pixels of the activated area display an input image. Pixels of the deactivated area display a black gradation. The activated area may be a display area in which an input image is reproduced. The deactivated area may be a non-display area in which the input image is not reproduced. The activated area may be considered as an area of the display in which light is emitted from the pixels and the deactivated area may be considered as an area of the display in which light is not emitted from the pixels, Pixel data of the input image may be written in pixels in the high-speed driving area at a high frame frequency. As in the deactivated area, a black gradation irrelevant to the input image may be written in pixels in the low-speed driving area. Alternatively, the pixel data of the input image may be written in the pixels in the low-speed driving area at a low frame frequency.

Scanning speeds or data addressing speeds of the pixels in the high-speed driving area are relatively fast. On the other hand, scanning speeds or data addressing speeds of the pixels in the low-speed driving area are relatively slower than those of the pixels in the high-speed driving area, or a scan signal is not shifted in the low-speed driving area.

The high-speed driving area may be the activated area or may be a main screen which displays a moving image with a large amount of image change or an image with fast movement. The low-speed driving area may be a deactivated area or a waiting screen which displays a still image with a small amount of image change or an image with relatively slow movement.

Hereinafter, various embodiments of the present disclosure will be described in detail with reference to the accompanying drawings.

Referring to FIGS. 1 to 6, a foldable display includes a flexible display panel 100 and display panel drivers 120 and 300.

When the flexible display panel 100 is unfolded, the display panel drivers 120 and 300 activate all screens of the flexible display panel 100 to display an image on a maximum screen. When the flexible display panel 100 is folded, the display panel drivers 120 and 300 activate a part of all the screens to display an image in an activated area that is smaller than the maximum screen and display black on a deactivated screen.

As shown in FIGS. 1 to 6, the display panel drivers 120 and 300 include a gate driver 120 for supplying gate signals to gate lines GL1 and GL2 of the flexible display panel 100, a data driver 306 for converting pixel data into voltages of data signals and supplying the voltages to data lines through activated data output channels, and a timing controller 303 for controlling operating timings of the data driver 306 and the gate driver 120. The data driver 306 and the timing controller 303 may be integrated in a drive integrated circuit (IC) 300.

In the flexible display panel 100, a screen which reproduces an input image includes data lines DL1 to DL6, the gate lines GL1 and GL2 crossing the data lines DL1 to DL6, and a pixel array in which pixels P are disposed in the form of a matrix. The screen is at least divided into a first screen A and a second screen B. A folding boundary C may be present between the first screen A and the second screen B. The screen of the flexible display panel 100 may include a plurality of folding boundaries C to be folded in various forms.

Figure 2A:
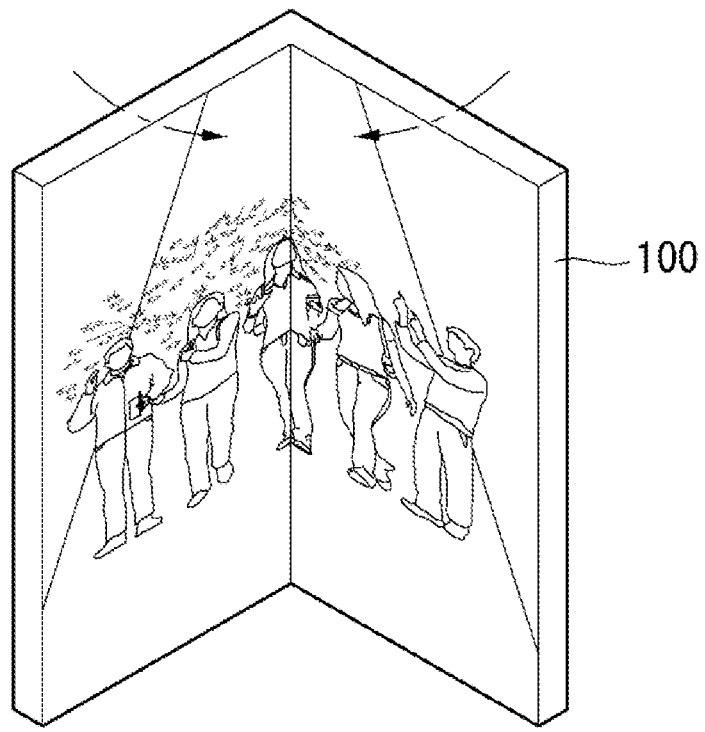
FIGS. 2A and 2B are diagrams illustrating examples in which the foldable display is folded.
Figure 2B:
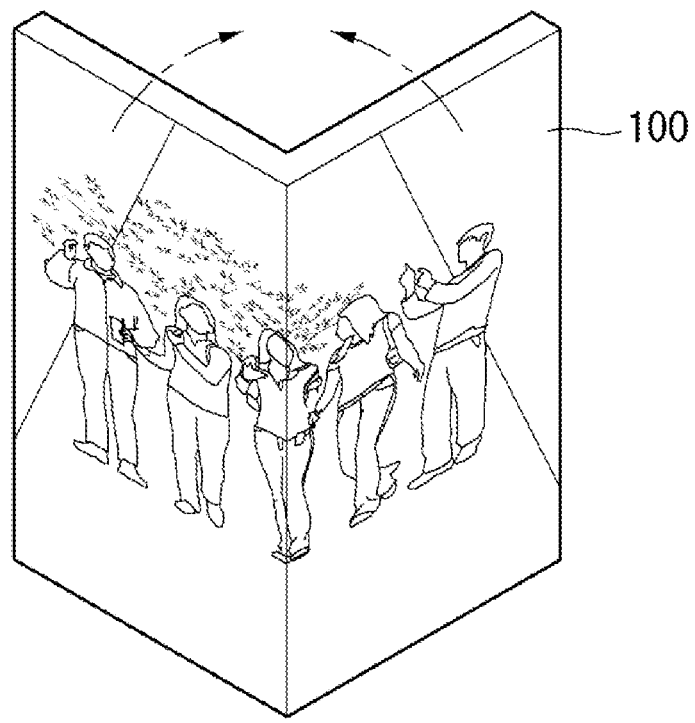

As shown in FIGS. 2A and 2B, the flexible display panel 100 may be folded with respect to the folding boundary C as a boundary. The first screen A, the second screen B, and the folding boundary C are selectively driven according to folded/unfolded states, a folding angle, and the like of the flexible display panel 100, and thus a size and a resolution of an activated screen displaying an image or information may be varied.

The timing controller 303 may determine a folded or unfolded state of the flexible display panel 100 on the basis of an enable signal EN from a host system 200 and further determine a folding angle of the flexible display panel 100. The timing controller 303 may control a size and a resolution of the activated screen in the unfolded state of the flexible display panel 100 as a maximum screen and a maximum resolution thereof. In the unfolded state of the screen, the first screen A is substantially coplanar with the second screen B.

The flexible display panel 100 may be folded in an in-folding method shown in FIG. 2A or an out-folding method shown in FIG. 2B. In the in-folding method, as shown in FIG. 2A, the first screen A is brought into contact with the second screen B inside the folded flexible display panel 100. In the in-folding method, since the first screen A and the second screen B are disposed inside the folded flexible display panel 100, the first screen A and the second screen B are not exposed to the outside.

In the out-folding method, as shown in FIG. 2B, the flexible display panel 100 is folded in the form in which the first screen A and the second screen B are back to back. Thus, when the out-folding type foldable display is folded, the first screen A and the second screen B are exposed to the outside.

Pixels P may be disposed in the folding boundary C. In this case, an input image or information may also be displayed on the pixels P of the folding boundary C. Since the pixels P are disposed in the folding boundary C, in an unfolded state in which the first screen A and the second screen B are unfolded, a portion in which an image is cut off is not present between the first screen A and the second screen B.

Figure 3:
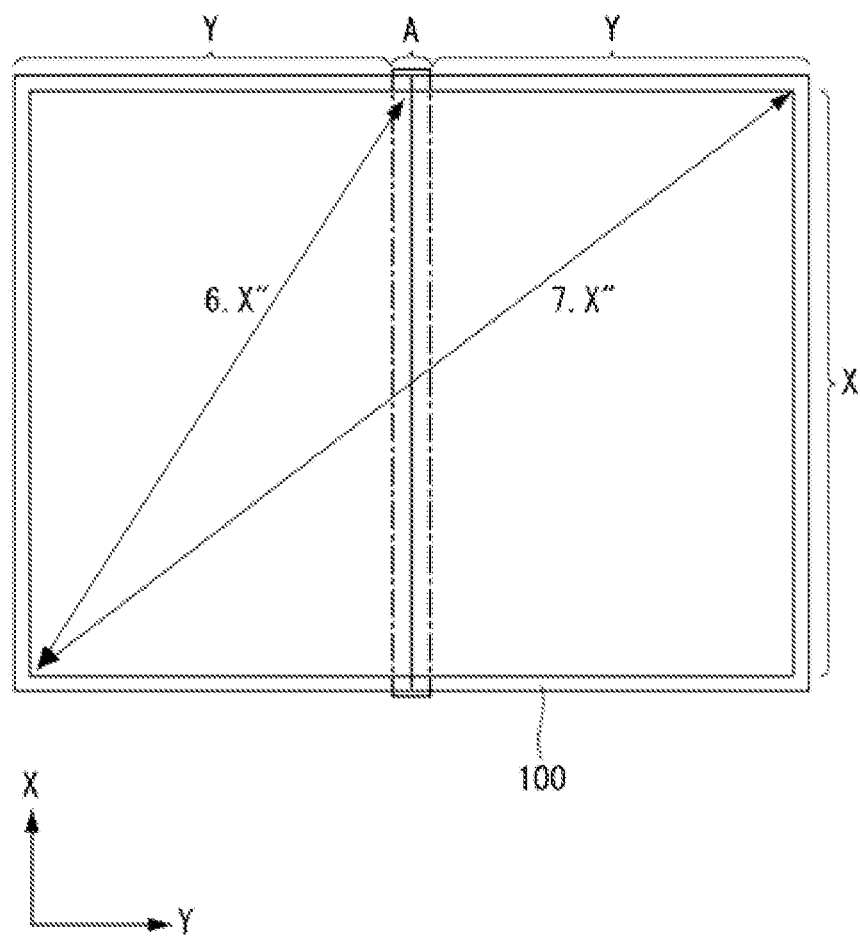
FIG. 3 is a diagram illustrating an example in which a screen size of a flexible display panel is varied.

A width of the folding boundary C, that is, a length in a Y-axis, is determined according to a curvature of the folding boundary C. A curvature of the folding boundary C may be varied according to a folding angle of the flexible display panel 100. A resolution and a size of the folding boundary C are proportional to a curvature of the folding boundary C. For example, the size of the folding boundary increases when the flexible display panel 100 is folded in half and becomes minimal when the flexible display panel 100 is unfolded as shown in FIG. 3.

When the flexible display panel 100 is unfolded and all of the first screen A, the second screen B, and the folding boundary C are driven, the sizes and the resolution of the screens A, B, and C may be maximized. When the flexible display panel 100 is folded in half with respect to the folding boundary C and either the first screen A or the second screen B is driven, the size and the resolution of the screen are reduced. For example, as shown in FIG. 3, when either the first screen A or the second screen B is driven, a size of an activated area which displays an image may be reduced to six inches (6.x") and a resolution of the activated area may be 2160*1080. Meanwhile, when all the screens A, B, and C are driven, a size of a screen which displays an image may be increased to seven inches (7.x") and a resolution of the screen may be increased to 2160*2160.

Figure 7A:
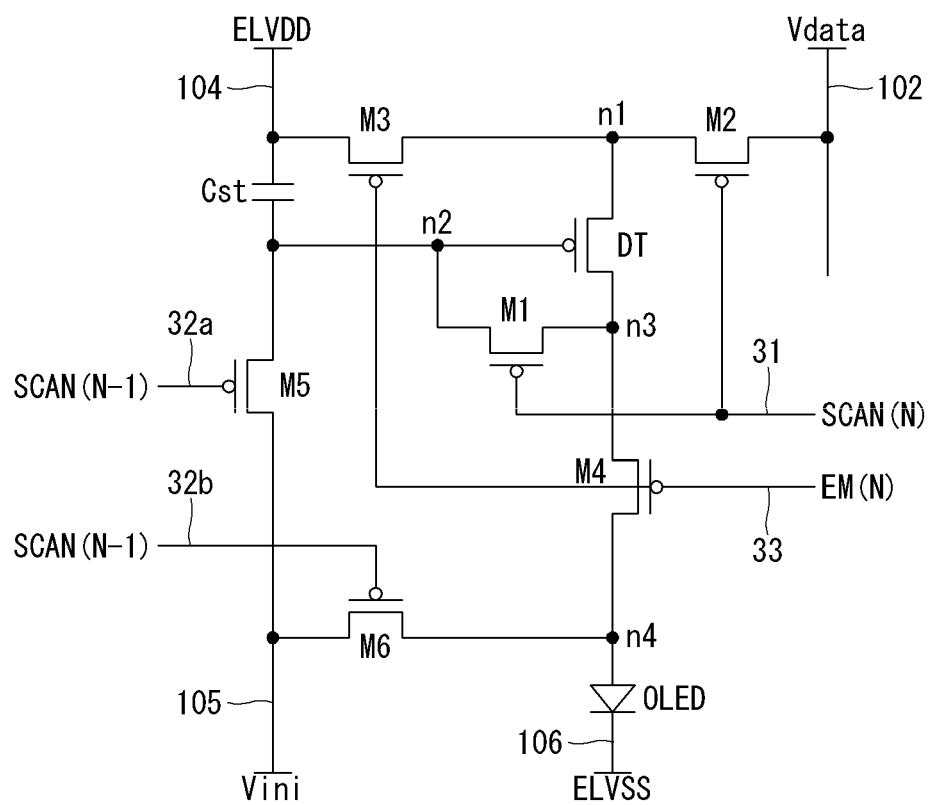
FIG. 7A is a circuit diagram illustrating an example of a pixel circuit.

In order to implement colors, each of the pixels P includes sub-pixels having different colors. The sub-pixels include red (hereinafter referred to as an "R sub-pixel"), green (hereinafter referred to as a "G sub-pixel"), and blue (hereinafter referred to as a "B sub-pixel"). Although not shown in the drawings, a white sub-pixel may be further included. As shown in FIG. 7A, each of the sub-pixels may be implemented as a pixel circuit including an internal compensation circuit. The pixel circuit includes OLED used as a light emitting element and a driving element for driving the light emitting element OLED and having a programmed conduction condition as well as includes a plurality of switching elements for switching current paths between the driving element and the light emitting element OLED and a capacitor connected to the driving element.

Figure 4:
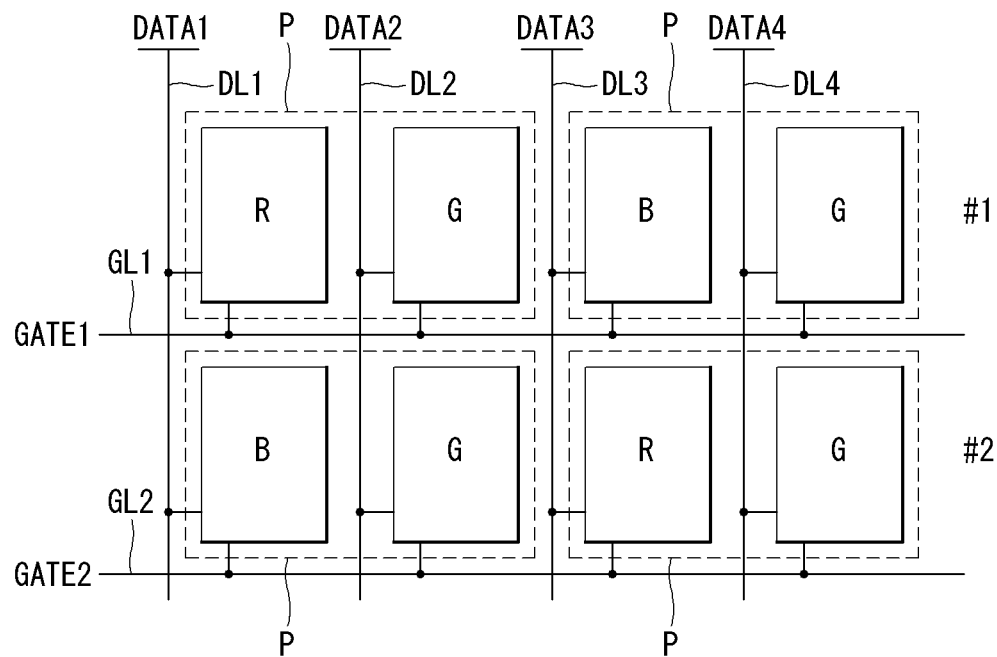
FIG. 4 is a diagram illustrating an example of a pentile pixel arrangement.

The pixels P may be implemented as real color pixels and PenTile pixels. As shown in FIG. 4, the PenTile pixel may drive two sub-pixels having different colors as one pixel P using a preset PenTile pixel rendering algorithm to implement a resolution that is higher than that of the real color pixel. The PenTile pixel rendering algorithm compensates for a color expression, which is insufficient in each of the pixels P, with a color of light emitted from pixels adjacent thereto.

Figure 5:
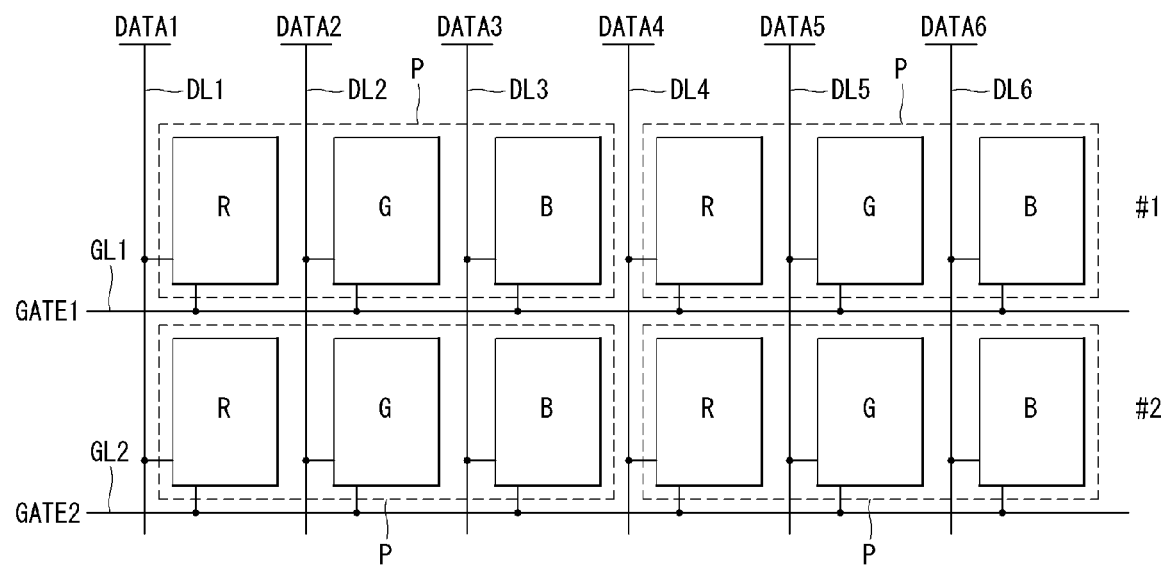
FIG. 5 is a diagram illustrating an example of a real color pixel arrangement.

The drive IC 300 drives a pixel array of the screens A, B, and C displaying an image or information. As shown in FIG. 4 or 5, in the pixel array, the data lines DL1 to DL6 cross the gate lines GL1 and GL2. The pixel array includes the pixels P disposed in the form of a matrix defined by the data lines DL1 to DL6 and the gate lines GL1 and GL2.

As shown in FIG. 5, in the case of the real color pixel, one pixel P includes R, G, and B sub-pixels.

In FIGS. 4 and 5, when a resolution of the pixel array is m*n, the pixel array includes m pixel columns and n pixel lines #1 to #n crossing the m pixel columns. The pixel column includes pixels disposed in a Y-axis direction. The pixel line includes pixels disposed in an X-axis direction. One horizontal time 1H is a time obtained by dividing one frame interval by the n pixel lines.

The flexible display panel 100 may be implemented as a plastic organic light emitting diode (OLED) panel. The plastic OLED panel includes a pixel array on an organic thin film bonded to a back plate. A touch sensor array may be formed on the pixel array.

The back plate may be a polyethylene terephthalate (PET) substrate. An organic thin film is formed on the back plate. A pixel array and a touch sensor array may be formed on the organic thin film. In order to prevent the pixel array from being exposed to humidity, the back plate blocks moisture permeation toward the organic thin film. The organic thin film may be a thin polyimide (PI) film substrate. A multi-layer buffer film may be formed of an insulating material (not shown) on the organic thin film. Lines for supplying power or signals applied to the pixel array and the touch sensor array may be formed on the organic thin film.

The gate driver 120 may be mounted on a substrate of the flexible display panel 100 together with the pixel array. The gate driver 120 may be implemented as a gate in panel (GIP) circuit which is directly formed on the flexible display panel 100.

The gate driver 120 may be disposed on one of a left bezel and a right bezel of the flexible display panel 100 to supply gate signals to the gate lines GL1 and GL2 in a single feeding manner. In this case, one of the two gate drivers 120 in FIG. 1 is not necessary.

The gate driver 120 may be disposed on each of the left bezel and the right bezel of the flexible display panel 100 to supply gate signals to the gate lines GL1 and GL2 in a double feeding manner. In the double feeding method, gate signals are simultaneously applied from the gate driver 120 connected to both sides of one gate line.

Figure 7B:
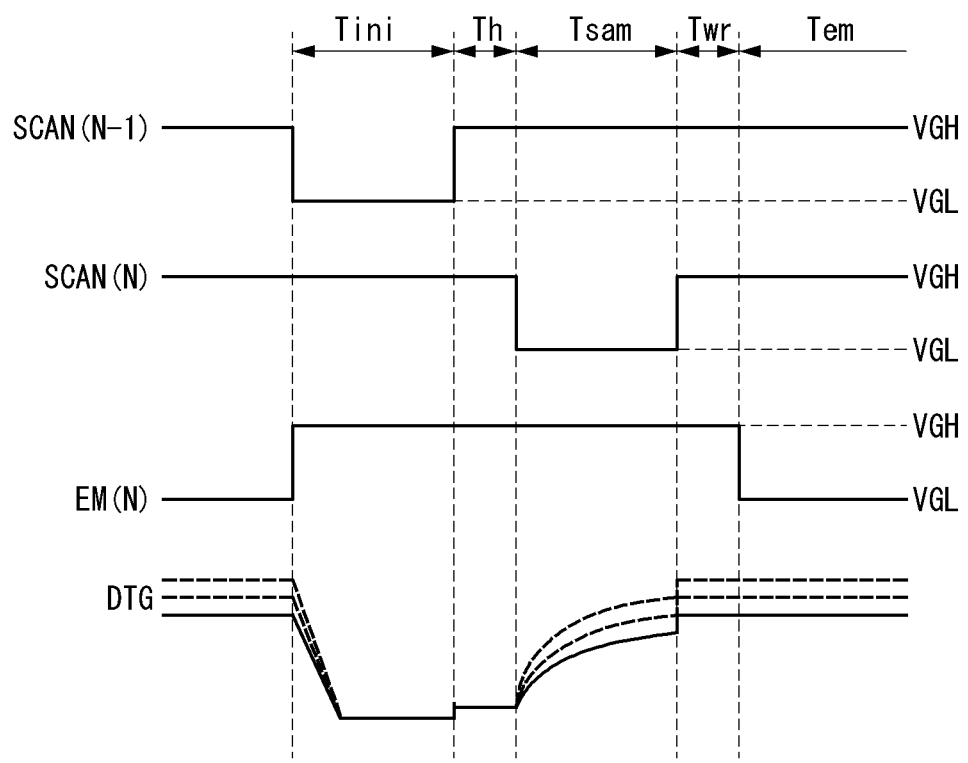
FIG. 7B is a diagram illustrating a method of driving the pixel circuit shown in FIG. 7A.

The gate driver 120 is driven in response to a gate timing signal supplied from the drive IC 300 using a shift register to sequentially supply gate signals GATE 1 and GATE 2 to the gate lines GL1 and GL2. The shift register may sequentially supply the gate signals GATE 1 and GATE 2 to the gate lines GL1 and GL2 by shifting the gate signals GATE 1 and GATE 2. The gate signals GATE 1 and GATE 2 may include scan signals SCAN(N-1) and SCAN(N), a light emission control signal EM(N), and the like which are shown in FIGS. 7A and 7B. Hereinafter, the "light emission control signal" is referred to as an EM signal. Each of the gate lines GL1 and GL2 may be divided into scan lines to which scan signals SCAN(N-1) and SCAN(N) are supplied and an EM line to which an EM signal is supplied.

The drive IC 300 is connected to the data lines DL1 to DL6 through data output channels to supply the voltages of the data signals to the data lines DL1 to DL6. The drive IC 300 may output gate timing signals for controlling the gate drivers 120 through the gate timing signal output channels.

Figure 6:
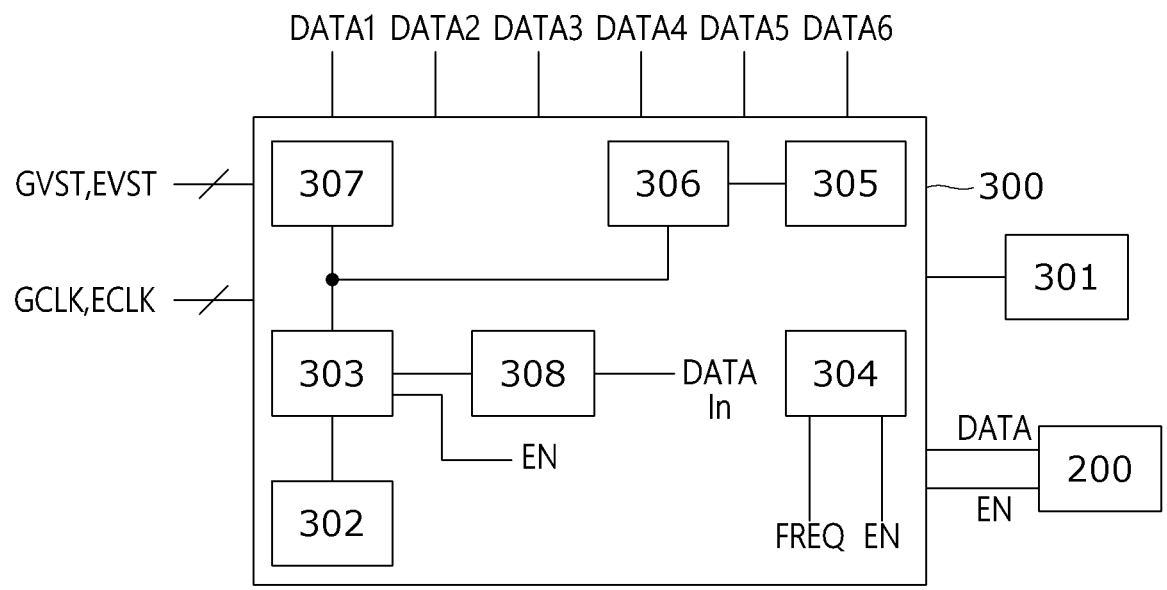
FIG. 6 is a block diagram illustrating a configuration of a drive integrated circuit (IC)

As shown in FIG. 6, the drive IC 300 is connected to the host system 200, a first memory 301, and the flexible display panel 100. The drive IC 300 includes a data receiving and calculating part 308, the timing controller 303, and the data driver 306.

The drive IC 300 may further include a gamma compensation voltage generator 305, a power supply 304, a second memory 302, and a level shifter 307.

The drive IC 300 may generate the gate timing signals for driving the gate drivers 120 through the timing controller 303 and the level shifter 307. The gate timing signal includes gate timing signals such as a gate start pulse VST and a gate shift clock CLK, and gate voltages such as a gate-on voltage VGL and a gate-off voltage VGH. The gate start pulse VST and the gate shift clock CLK swing between the gate-on voltage VGL and the gate-off voltage VGH. The gate timing control signal (VST, CLK) output from the level shifter 307 is applied to the gate driver 120 to control the shift operation of the gate driver 120. GVST and GCLK shown in FIG. 6 are gate timing control signals applied to the first shift register 120G shown in FIG. 11. EVST and ECLK illustrated in FIG. 6 are gate timing control signals applied to the second shift register 120E illustrated in FIG. 11.

The data receiving and calculating part 308 includes a receiver RX for receiving pixel data which is input as a digital signal from the host system 200, and a data calculator for processing the pixel data input through the receiver RX to improve image quality. The data calculator may include a data restoration part for decoding and restoring compressed pixel data, and an optical compensator for adding a predetermined optical compensation value to the pixel data. The optical compensation value may be set to a value for correcting a brightness of the pixel data on the basis of a brightness of the screen measured based on a camera image which is captured in a manufacturing process.

The timing controller 303 provides the data driver 306 with pixel data of an input image received from the host system 200. The timing controller 303 generates a gate timing signal for controlling the gate driver 120 and a source timing signal for controlling the data driver 306 to control operation timings of the gate driver 120 and the data driver 306.

The data driver 306 converts the pixel data (a digital signal) received from the timing controller 303 into a gamma compensation voltage through a digital-to-analog converter (DAC) to provide voltages of data signals DATA1 to DATA6 (hereinafter referred to as "data voltages"). The data voltages output from the data driver 306 are supplied to the data lines DL1 to DL6 of the pixel array through an output buffer (a source amplifier (AMP)) connected to data channels of the drive IC 300.

The gamma compensation voltage generator 305 distributes a gamma reference voltage from the power supply 304 through a voltage divider circuit to generate a gamma compensation voltage for each gradation. The gamma compensation voltage is an analog voltage in which a voltage is set for each gradation of the pixel data. The gamma compensation voltage output from the gamma compensation voltage generator 305 is provided to the data driver 306.

The level shifter 307 converts a low level voltage of the gate timing signal received from the timing controller 303 into the gate-on voltage VGL and converts a high level voltage of the gate timing signal into the gate-off voltage VGH. The level shifter 307 outputs the gate timing signal and the gate voltages VGH and VGL through the gate timing signal output channels and supplies the gate timing signal and the gate voltages VGH and VGL to the gate driver 120.

The power supply 304 generates power required for driving the pixel array, the gate driver 120, and the drive IC 300 of the flexible display panel 100 using a direct current (DC)-DC converter. The DC-DC converter may include a charge pump, a regulator, a buck converter, and a boost converter. The power supply 304 may adjust a DC input voltage from the host system 200 to generate DC power such as a gamma reference voltage, the gate-on voltage VGL, the gate-off voltage VGH, a pixel drive voltage ELVDD, a low potential power voltage ELVSS, and an initialization voltage Vini. The gamma reference voltage is supplied to the gamma compensation voltage generator 305. The gate-on voltage VGL and the gate-off voltage VGH are supplied to the level shifter 307 and the gate driver 120. Pixel power, such as the pixel driving voltage ELVDD, the low potential power voltage ELVSS, and the initialization voltage Vini, are commonly supplied to the pixels P.

The gate voltages may be set to VGH=8 V and VGL=−7 V, and the pixel power may be set to ELVDD=4.6 V, ELVSS=−2 to −3 V, and Vini=−3 to −4 V, but the present disclosure is not limited thereto. A data voltage Vdata may be set to Vdata=3 to 6 V, but the present disclosure is not limited thereto.

The initialization voltage Vini is set to a DC voltage that is lower than the pixel driving voltage ELVDD and is lower than a threshold voltage of the light emitting element OLED to suppress light emission of the light emitting element OLED. The initialization voltage Vini may be continuously applied to an anode of an OLED in a deactivated pixel for one frame interval or more. The light emitting element OLED is initialized when Vini is applied to the anode.

When power is supplied to the drive IC 300, the second memory 302 stores a compensation value, register setting data, and the like which are received from the first memory 301. The compensation value may be applied to various algorithms for improving image quality. The compensation value may include the optical compensation value.

The register setting data defines operations of the data driver 306, the timing controller 303, and the gamma compensation voltage generator 305. The first memory 301 may include a flash memory. The second memory 302 may include a static random access memory (SRAM).

The host system 200 may be implemented as an application processor (AP). The host system 200 may transmit pixel data of an input image to the drive IC 300 through a mobile industry processor interface (MIPI). The host system 200 may be connected to the drive IC 300 through a flexible printed circuit, for example, a flexible printed circuit (FPC) 310.

The host system 200 may output an enable signal EN for controlling driving of the drive IC 300 according to whether the flexible display panel 100 is folded. The enable signal EN may include information on whether the flexible display panel 100 is folded and information indicating a folding angle.

The host system 200 may detect an attitude variation of the foldable display using a tilt sensor. In response to an output signal of the tilt sensor, the host system 200 may control the drive IC 300 to control each of the first screen A and the second screen B to be turned on or off. The tilt sensor may include a gyro sensor or an acceleration sensor. The host system 200 may transmit tilt information of the foldable display panel to the drive IC 300. In response to an output signal of the acceleration sensor, the host system 200 may control the drive IC 300.

When the user folds the foldable display and looks at the first screen A, under the control of the host system 200, the drive IC 300 activates the first screen A and allows the first screen A to display an image, whereas the drive IC 300 deactivates the second screen B to control the second screen B as a deactivated area displaying a black gradation. On the other hand, when the user folds the foldable display and looks at the second screen B, under the control of the host system 200, the drive IC 300 activates the second screen B and allows the second screen B to display an image, whereas the drive IC 300 controls the first screen A as the deactivated area displaying the black gradation. When the user unfolds the foldable display and looks at the first screen A and the second screen B, under the control of the host system 200, the drive IC 300 may activate the first screen A, the folding boundary C, and the second screen B and allow all of the first screen A, the folding boundary C, and the second screen B to display an image.

A host system 200 or a drive IC 300 may sense the folded state and the unfolded state of the flexible display panel 100 by sensing a variation in resistance value of a flexible display panel 100.

FIG. 7A is a circuit diagram illustrating an example of a pixel circuit. FIG. 7B is a diagram illustrating a method of driving the pixel circuit shown in FIG. 7A.

Referring to FIGS. 7A and 7B, the pixel circuit includes a light emitting element OLED, a drive element DT for supplying a current to the light emitting element OLED, and an internal compensation circuit for sampling a threshold voltage Vth of the drive element DT using a plurality of switching elements M1 to M6 and compensating for a gate voltage of the drive element DT by as much as the threshold voltage Vth of the drive element DT. Each of the drive element DT and the switching elements M1 to M6 may be implemented as a p-channel transistor.

A driving time of each of the pixels using the internal compensation circuit is divided into an initialization time Tini, a sampling time Tsam, a data write time Twr, and a light emission time Tem. During the initialization time Tini, the (N-1)th scan signal is generated as a pulse of the gate-on voltage VGL, and a voltage of each of the Nth scan signal SCAN(N) and the light emission control signal EM(N) is generated as the gate-off voltage VGH. During the sampling time Tsam, the $N^{th}$ scan signal SCAN(N) is generated as the pulse of the gate-on voltage VGL, and a voltage of each of the $(N-1)^{th}$ scan signal SCAN(N-1) and the light emission control signal EM(N) is generated as the gate-off voltage VGH. During the data write time Twr, a voltage of each of the $(N-1)^{th}$ scan signal SCAN(N-1), the $N^{th}$ scan signal SCAN(N), and the light emission control signal EM(N) is generated as the gate-off voltage VGH. During at least some time of the light emission time Tem, the light emission control signal EM(N) is generated as the gate-on voltage, and the voltage of each of the $(N-1)^{th}$ scan signal SCAN(N-1) and the $N^{th}$ scan signal SCAN(N) is generated as the gate-off voltage VGH.

During an initialization period Tini, the fifth and sixth switching elements M5 and M6 are turned on in response to a gate-on voltage VGL of an (N-1)th scan signal SCAN(N-1) to initialize the pixel circuit. During a sampling period Tsam, the first and second switching elements M1 and M2 are turned on in response to a gate-on voltage VGL of an Nth scan signal SCAN(N) to sample the threshold voltage Vth of the drive element DT and store the sampled threshold voltage Vth in a capacitor Cst. During a data write period Twr, the first to sixth switching elements M1 to M6 are each maintained in an OFF state. During a light emission period Tem, the third and fourth switching elements M3 and M4 are turned on such that the light emitting element OLED emits light.

In the light emission period Tem, in order to precisely express a brightness of a low gradation with a duty ratio of a light emission (EM) signal EM(N), the EM signal EM(N) may swing between the gate-on voltage VGL and the gate-off voltage VGH at a predetermined duty ratio to repeat turning the third and fourth switching elements M3 and M4 on or off.

The light emitting element OLED may be implemented as an organic light emitting diode or an inorganic light emitting diode. Hereinafter, an example in which the light emitting element OLED is implemented as an organic light emitting diode will be described.

The light emitting element OLED may be implemented as an organic compound layer formed between an anode and a cathode as an OLED. The organic compound layer may include a hole injection layer HIL, a hole transport layer HTL, a light emitting layer EML, an electron transport layer ETL, and an electron injection layer EIL, but the present disclosure is not limited thereto. The anode of the light emitting element OLED is connected to a fourth node n4 between the fourth and sixth switching elements M4 and M6. The fourth node n4 is connected to the anode of the light emitting element OLED, a second electrode of the fourth switching element M4, and a second electrode of the sixth switching element M6. The cathode of the light emitting element OLED is connected to a VSS electrode 106 to which a low potential power voltage ELVSS is applied. The light emitting element OLED emits light with a current Ids which flows according to a gate-source voltage Vgs of the drive element DT. A current path of the light emitting element OLED is switched by the third and fourth switching elements M3 and M4.

The storage capacitor Cst is connected between a VDD line 104 and a second node n2. The data voltage Vdata, which is compensated for by as much as the threshold voltage Vth of the drive element DT, is charged in the storage capacitor Cst. Since the data voltage Vdata in each sub-pixel is compensated for by as much as the threshold voltage Vth of the drive element DT, a characteristic deviation of the drive element DT in each sub-pixel is compensated for.

The first switching element M1 is turned on in response to the gate-on voltage VGL of the $N^{th}$ scan signal SCAN(N) to connect a second node n2 to a third node n3. The second node n2 is connected to a gate of the drive element DT, a first electrode of the storage capacitor Cst, and a first electrode of the first switching element M1. The third node n3 is connected to a second electrode of the drive element DT, a second electrode of the first switching element M1, and a first electrode of the fourth switch element M4. A gate of the first switching element M1 is connected to a first gate line 31 to receive the $N^{th}$ scan signal SCAN(N). The first electrode of the first switching element M1 is connected to the second node n2, and the second electrode thereof is connected to the third node n3.

The second switching element M2 is turned on in response to the gate-on voltage VGL of the $N^{th}$ scan signal SCAN(N) to supply the data voltage Vdata to a first node n1. A gate of the second switching element M2 is connected to the first gate line 31 to receive the $N^{th}$ scan signal SCAN(N). A first electrode of the second switching element M2 is connected to the first node n1. A second electrode of the second switching element M2 is connected to a data line 102 to which the data voltage Vdata is applied. The first node n1 is connected to the first electrode of the second switching element M2, a second electrode of the third switching element M3, and a first electrode of the drive element DT.

The third switching element M3 is turned on in response to a gate-on voltage VGL of the EM signal EM(N) to connect the VDD line 104 to the first node n1. A gate of the third switching element M3 is connected to a third gate line 33 to receive the EM signal EM(N). A first electrode of the third switching element M3 is connected to the VDD line 104. The second electrode of the third switching element M3 is connected to the first node n1.

The fourth switching element M4 is turned on in response to the gate-on voltage VGL of the EM signal EM(N) to connect the third node n3 to the anode of the light emitting element OLED. A gate of the fourth switching element M4 is connected to the third gate line 33 to receive the EM signal EM(N). A first electrode of the fourth switching element M4 is connected to the third node n3, and a second electrode thereof is connected to the fourth node n4.

The EM signal EM(N) controls the third and fourth switching elements M3 and M4 to be turned on and off to switch the current path of the light emitting element OLED, thereby controlling a turning on/off time of the light emitting element OLED.

The fifth switching element M5 is turned on in response to a gate-on voltage VGL of the $(N-1)^{th}$ scan signal SCAN (N-1) to connect the second node n2 to a Vini line 105. A gate of the fifth switching element M5 is connected to a second-a gate line 32a to receive the $(N-1)^{th}$ scan signal SCAN(N-1). A first electrode of the fifth switching element M5 is connected to the second node n2, and a second electrode thereof is connected to the Vini line 105.

The sixth switching element M6 is turned on in response to the gate-on voltage VGL of the $(N-1)^{th}$ scan signal SCAN(N-1) to connect the Vini line 105 to the fourth node n4. A gate of the sixth switching element M6 is connected to a second-b gate line 32b to receive the $(N-1)^{th}$ scan signal SCAN(N-1). A first electrode of the sixth switching element M6 is connected to the Vini line 105, and a second electrode thereof is connected to the fourth node n4.

The drive element DT adjusts the current Ids, which flows in the light emitting element OLED according to the gate-source voltage Vgs, to drive the light emitting element OLED. The drive element DT includes the gate connected to the second node n2, the first electrode connected to the first node n1, and the second electrode connected to the third node n3.

During the initialization period Tini, the $(N-1)^{th}$ scan signal SCAN(N-1) is generated as the gate-on voltage VGL. During the initialization period Tini, the $N^{th}$ scan signal SCAN (N) and the EM signal EM(N) are each maintained at the gate-off voltage VGH. Thus, during the initialization period Tini, the fifth and sixth switching elements M5 and M6 are turned on so that the second and fourth nodes n2 and n4 are each initialized at Vini. A hold time Th may be set between the initialization period Tini and the sampling period Tsam. During the hold time Th, a voltage level of the gate signals SCAN(N-1), SCAN(N), and EM(N) are the gate-off voltage VGH.

During the sampling period Tsam, the $N^{th}$ scan signal SCAN(N) is generated as the gate-on voltage VGL. A pulse of the $N^{th}$ scan signal SCAN(N) is synchronized with a data voltage Vdata of an $N^{th}$ pixel line. During the sampling period Tsam, the $(N-1)^{th}$ scan signal SCAN(N-1) and the EM signal EM(N) are each maintained at the gate-off voltage VGH. Therefore, during the sampling period Tsam, the first and second switching elements M1 and M2 are turned on.

During the sampling period Tsam, a gate node voltage DTG of the drive element DT rises due to a current flowing through the first and second switching elements M1 and M2. Since the drive element DT is turned off, the gate node voltage DTG is Vdata−|Vth|. In this case, a voltage of the first node n1 is Vdata. During the sampling period Tsam, the gate-source voltage Vgs of the drive element DT is |Vgs|=Vdata−(Vdata−|Vth|)=|Vth|.

During the data write time Twr, the $N^{th}$ scan signal SCAN(N) is inverted to the gate-off voltage VGH. During the data write time Twr, the $(N-1)^{th}$ scan signal SCAN(N-1) and the EM signal EM(N) are each maintained at the gate-off voltage VGH. Therefore, during the data write period Twr, all the switching elements M1 to M6 remain in an off state.

During the light emission period Tem, the EM signal EM(N) may be generated as the gate-on voltage VGL. During the light emission period Tem, in order to improve a low gradation expression, the EM signal EM(N) may be turned on or off at a predetermined duty ratio to swing between the gate-on voltage VGL and the gate-off voltage VGH. Accordingly, the EM signal EM(N) may be generated as the gate-on voltage VGL for at least some period of the light emission period Tem.

When the EM signal EM(N) is the gate-on voltage VGL, a current flows between ELVDD and the light emitting element OLED so that the light emitting element OLED may emit light. During the light emission period Tem, the $(N-1)^{th}$ and $N^{th}$ scan signals SCAN(N-1) and SCAN(N) are each maintained at the gate-off voltage VGH. During the light emission period Tem, the third and fourth switching elements M3 and M4 are repeatedly turned on and off according to a voltage of the EM signal EM(N). When the EM signal EM(N) is the gate-on voltage VGL, the third and fourth switching elements M3 and M4 are turned on so that a current flows in the light emitting element OLED. In this case, Vgs of the drive element DT satisfies |Vgs|=ELVDD−Vdata, and the current flowing in the light emitting element OLED is $K(ELVDD-Vdata)^2$. K is a proportional constant determined by charge mobility, parasitic capacitance, and a channel capacity of the drive element DT.

Figure 18:
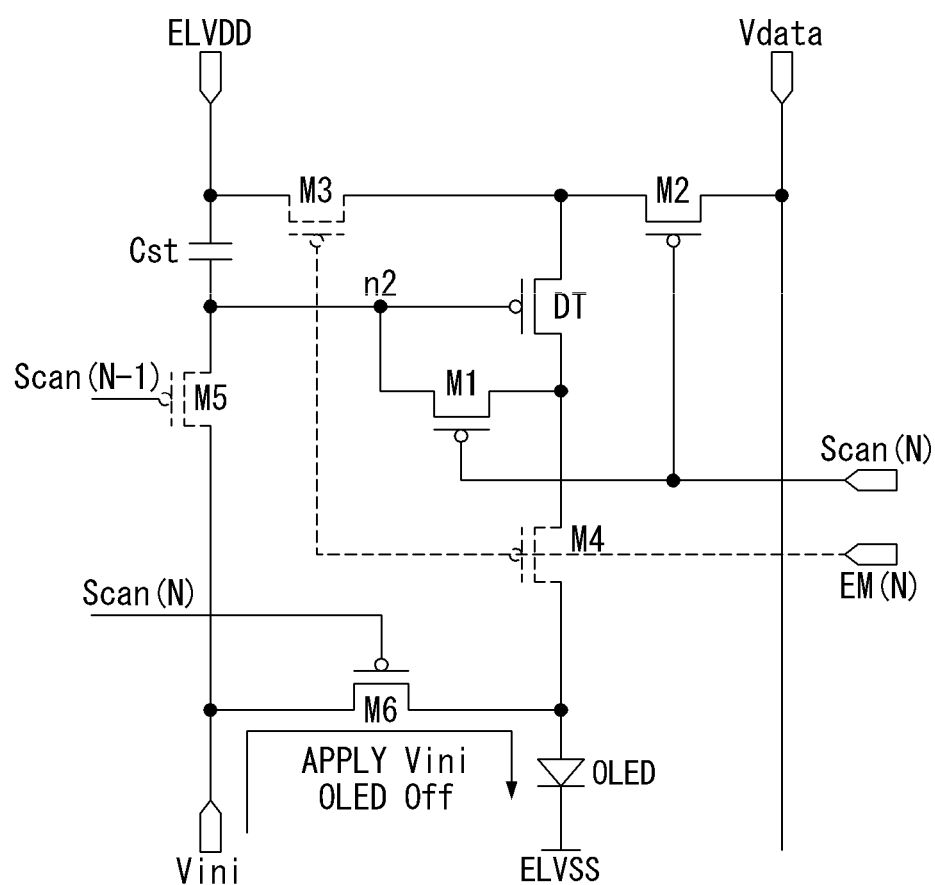
FIG. 18 is a circuit diagram illustrating an operation of a pixel in a deactivated screen.

The gates of the fifth and sixth switching elements M5 and M6 may be connected to the different gate lines 32a and 32b. As shown in FIGS. 7A and 18, a control signal of the sixth switching element M6 may be different in the activated area from the deactivated area. As shown in FIG. 7A, in the activated area, the $(N-1)^{th}$ scan signal SCAN(N-1) is applied to the gate of the sixth switching element M6. As shown in FIG. 18, in the deactivated area, the $N^{th}$ scan signal SCAN (N) is applied to the gate of the sixth switching element M6.

In the pixels in the activated area, the $(N-1)^{th}$ scan signal SCAN(N-1) is applied to the gates of the fifth and sixth switching elements M5 and M6. On the other hand, as shown in FIG. 18, in the deactivated area, the $(N-1)^{th}$ scan signal SCAN(N-1) is applied to the gate of the fifth switching element M5 and then the $N^{th}$ scan signal SCAN(N) is applied to the gate of the sixth switching element M6. In the activated area, in response to an (n-1)th scan signal of which a phase leads more than that of the nth scan signal, a switching element is configured to supply the initialization voltage Vini to the anode of the light emitting element prior to the data voltage.

In the deactivated area, in response to the $N^{th}$ scan signal SCAN(N), the sixth switching element M6 reduces an anode voltage of the light emitting element OLED to the initialization voltage Vini, thereby suppressing light emission of the light emitting element OLED. Consequently, the pixels in the deactivated area maintain a brightness of a black gradation due to not emitting light. According to the present disclosure, a brightness of the deactivated area may be controlled to that of the black gradation only by turning the sixth switching element M6 on during the sampling period Tsam and applying the initialization voltage Vini to the anode of the light emitting element OLED. In this case, as shown in FIG. 18, in order to block an influence of other nodes connected to the anode of the light emitting element OLED, it is preferable that the third and fourth switching elements M3 and M4 are turned off.

Figure 8:
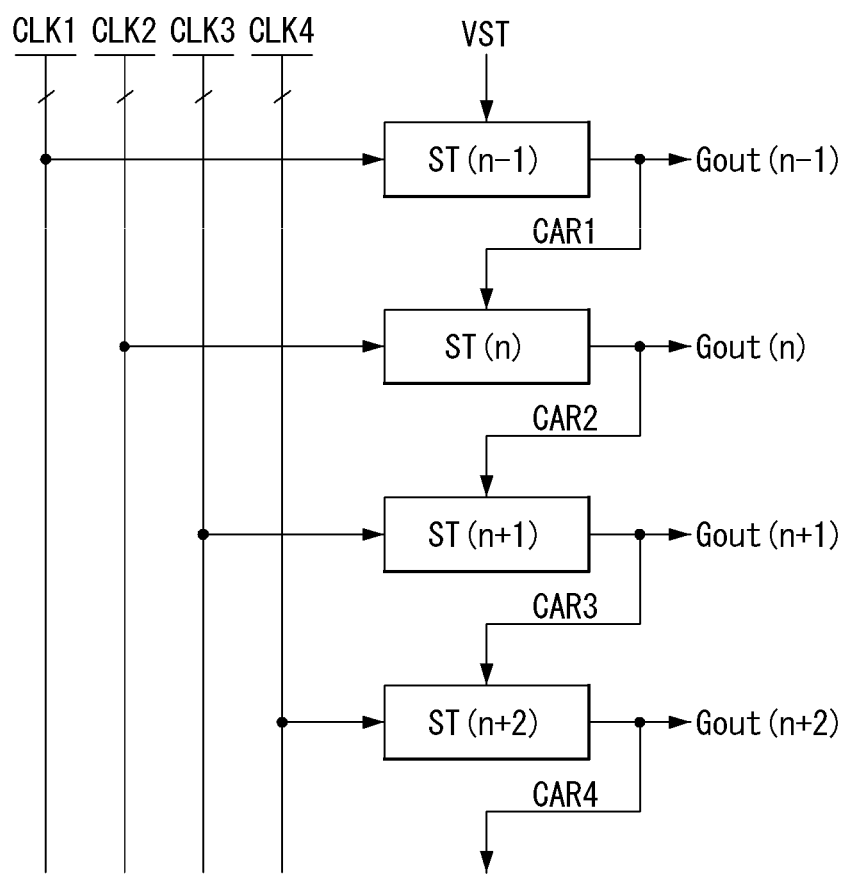
FIG. 8 is a schematic diagram illustrating a circuit configuration of a shift register in a gate driver.
Figure 9A:
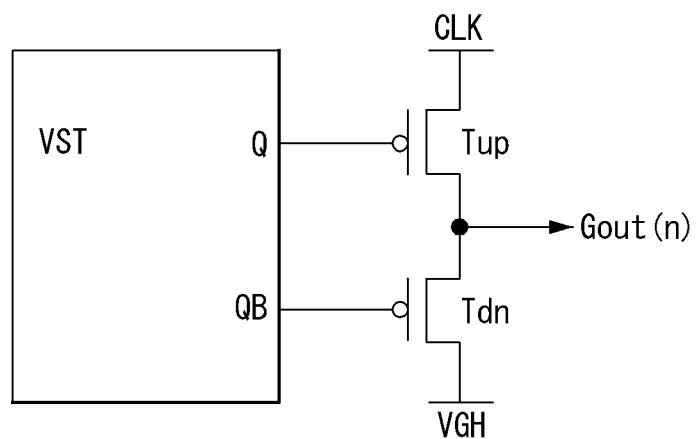
FIGS. 9A and 9B are schematic diagrams illustrating a pass gate circuit and an edge trigger circuit.
Figure 9B:
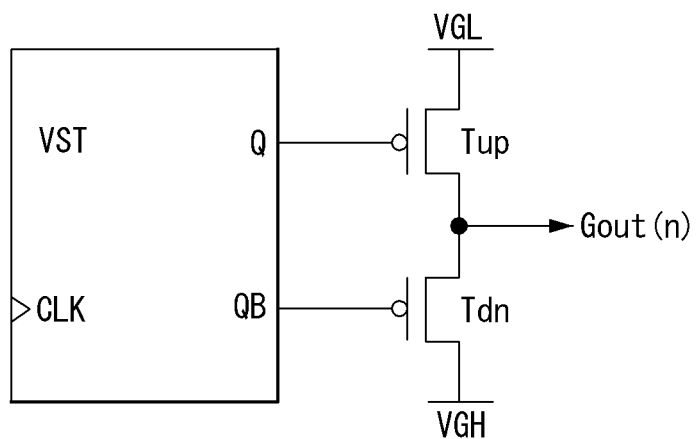

FIG. 8 is a schematic diagram illustrating a circuit configuration of the gate driver 120. FIGS. 9A and 9B are schematic diagrams illustrating a pass-gate circuit and an edge trigger circuit.

Referring to FIG. 8, the gate driver 120 may include shift registers. The shift registers include signal transfer parts ST(n-1) to ST(n+2) which are connected in cascade. The shift registers receive gate start pulses VST or carry signals CAR1 to CAR4 from previous stages, and generates outputs Gout(n-1) to Gout(n+2) in synchronization with rising edges of shift clocks CLK1 to CLK4. The output signals of the shift registers include the gate signals SCAN(N-1), SCAN (N), and EM(N).

Each of the signal transfer parts ST(n-1) to ST(n+2) of the shift registers may be implemented as the pass-gate circuit as shown in FIG. 9A or the edge trigger circuit as shown in FIG. 9B.

Figure 10:
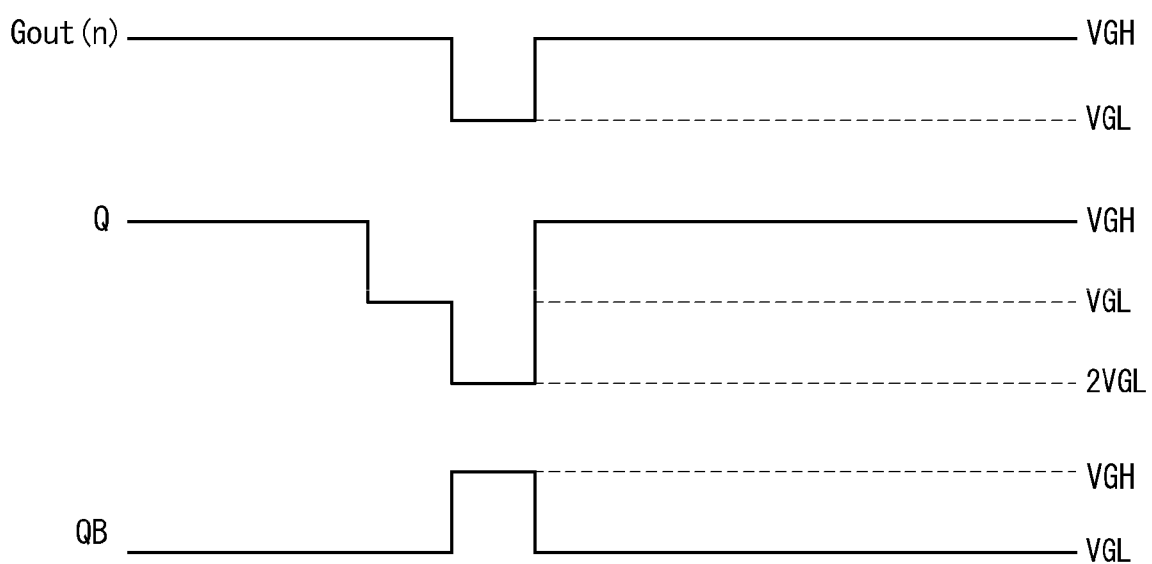
FIG. 10 is a waveform diagram showing a Q node voltage, a QB node voltage, and an output voltage of an nth stage shown in FIG. 8.

In the pass-gate circuit, a clock CLK is input to a pull-up transistor Tup which is turned on or off according to a voltage of a first control node Q. On the other hand, the gate-on voltage VGL is supplied to the pull-up transistor Tup of the edge trigger circuit, and the gate start pulse VST and the shift clocks CLK1 to CLK4 are input to the edge trigger circuit. A pull-down transistor Tdn is turned on or off according to a voltage of a second control node QB. In the pass-gate circuit, the first control node Q is floated according to a start signal in a state of being pre-charged. As shown in FIG. 10, when the clock CLK is applied to the pull-up transistor Tup in the state in which the first control node Q is floated, the voltage of the first control node Q is converted into a voltage 2VGL that is greater than the gate-on voltage VGL due to bootstrapping so that a voltage of the output signal Gout(n) is generated as a pulse of the gate-on voltage VGL.

Since the voltage of the output signal Gout(n) is converted into a voltage of the start signal in synchronization with an edge of the clock CLK, the edge trigger circuit generates the output signal Gout(n) in the same waveform as a phase of the start signal. When a waveform of the start signal is changed, the waveform of the output signal is changed accordingly. In the edge trigger circuit, an input signal may overlap the output signal.

FIG. 11 is a diagram illustrating a first shift register and a second shift register of the gate driver 120.

Referring to FIG. 11, the gate driver 120 may include a first shift register 120G and a second shift register 120E. The first shift register 120G may receive a start pulse GVST and shift clocks GCLK and sequentially output scan signals SCAN1 to SCAN2160. The second shift register 120E may receive a start pulse EVST and shift clocks ECLK and sequentially output EM signals EM1 to EM2160.

Figure 12:
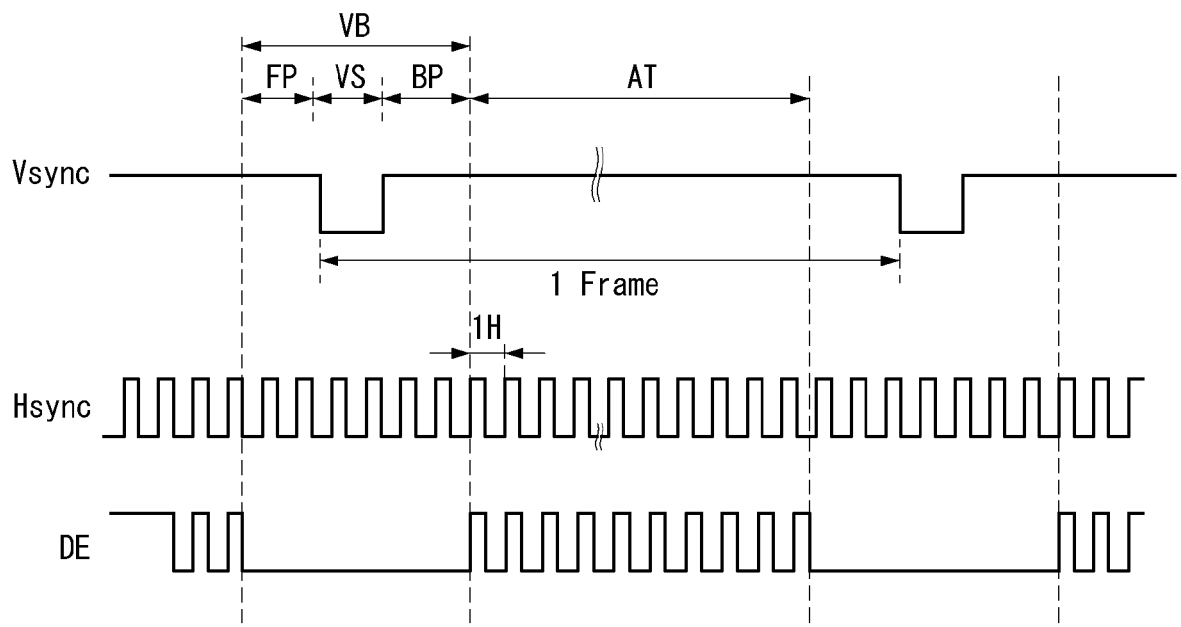
FIG. 12 is a detailed diagram illustrating an active interval and a vertical blank interval of one frame interval.

FIG. 12 is a detailed diagram illustrating an active interval and a vertical blank interval of one frame interval.

Referring to FIG. 12, one frame interval is divided into an active interval AT in which pixel data is input, and a vertical blank interval VB in which the pixel data is not present.

During the active interval AT, pixel data of one frame interval, which will be written in all the pixels P in the screens A, B, and C of the flexible display panel 100, is received by the drive IC 300 and written in the pixels P.

The vertical blank interval VB is a blank interval for which pixel data is not received by a timing controller between an active interval AT of a (N-1)$^{th}$ frame interval (N is a natural number) and an active interval AT of an N$^{th}$ frame interval. The vertical blank interval VB may include a vertical sync time VS, a vertical front porch FP, and a vertical back porch BP.

The vertical blank interval VB is a time from a falling edge of a last pulse in a data enable signal DE received during the (N-1)$^{th}$ frame interval to a rising edge of a first pulse in the data enable signal DE received during the N$^{th}$ frame interval. A start time of the N$^{th}$ frame interval is a rising timing of the first pulse of the data enable signal DE.

A vertical synchronization signal Vsync defines one frame interval. A horizontal synchronization signal Hsync defines one horizontal time. The data enable signal DE defines a write time of valid data including pixel data which will be displayed on the screen.

A pulse of the data enable signal DE is synchronized with the pixel data which will be written in the pixels P of the flexible display panel 100. One pulse period of the data enable signal DE is one horizontal time 1H.

Figure 13:
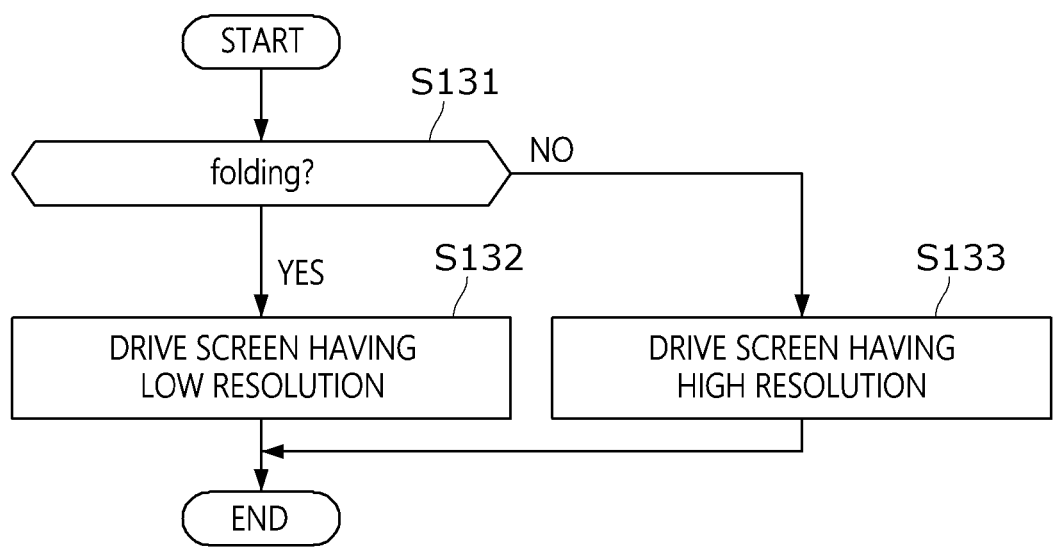
FIGS. 13 to 15 are diagrams illustrating a screen driving method when a foldable display is folded and unfolded.
Figure 14:
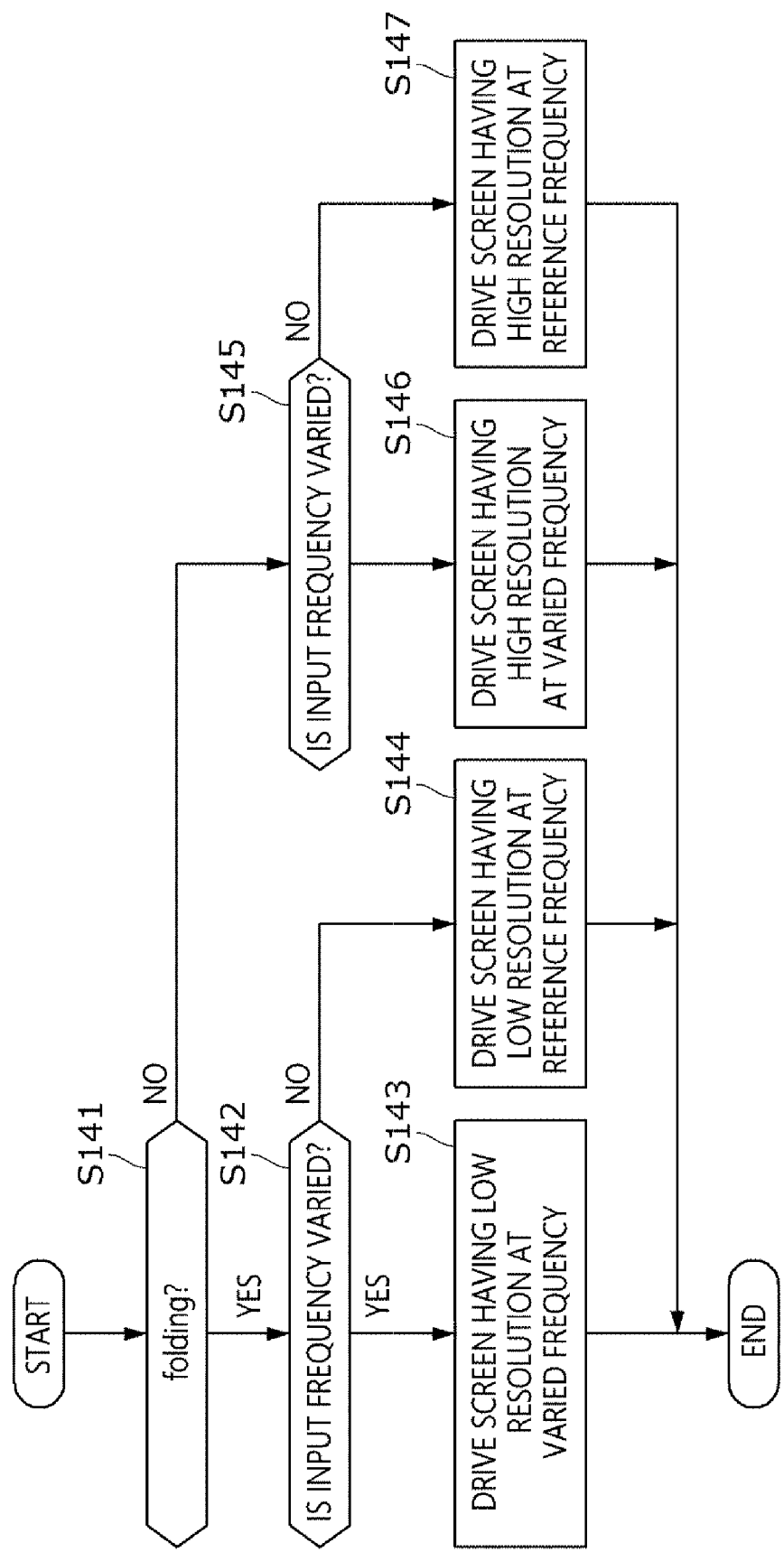
Figure 15:
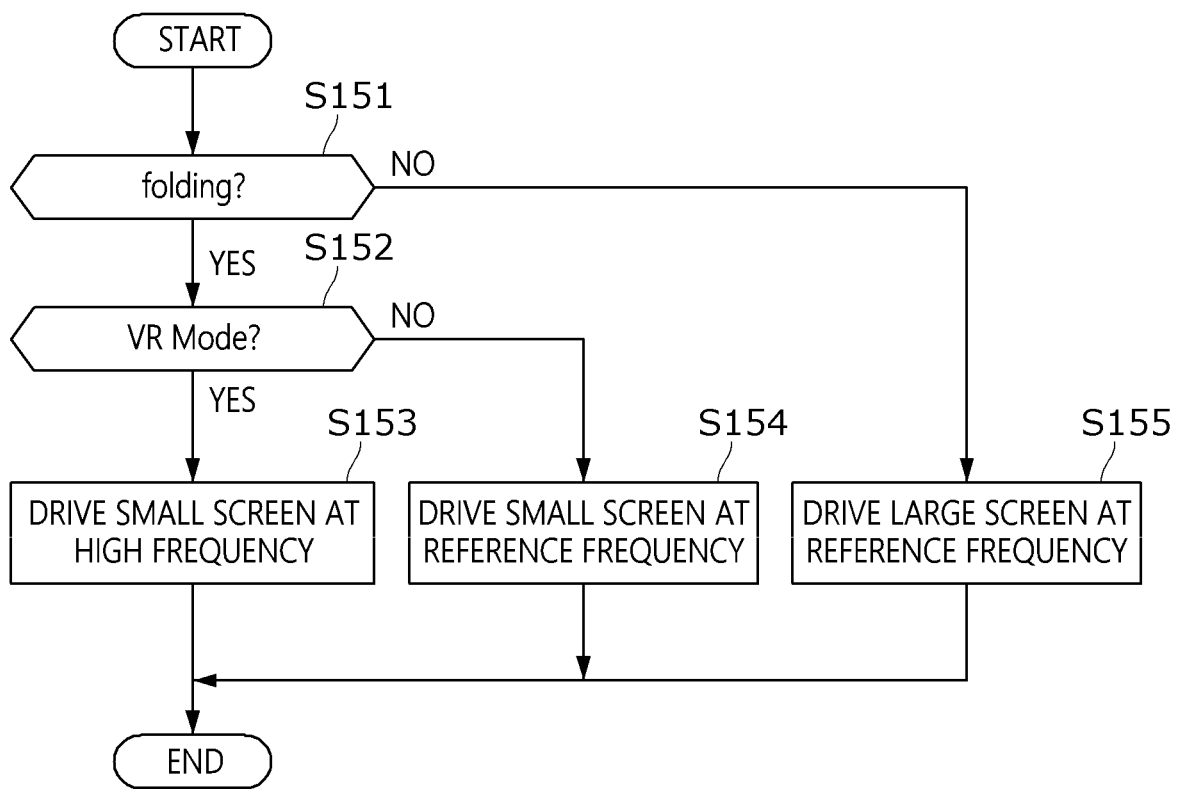

FIGS. 13 to 15 are diagrams illustrating a screen driving method when the foldable display is folded and unfolded.

Referring to FIG. 13, when the flexible display panel 100 is folded, the drive IC 300 drives a screen having a low resolution (S131 and S132). As shown in FIGS. 16A and 16B, the screen having the low resolution may be an activated area having a 2160*1080 resolution. The screen having the low resolution may be an activated area, at which the user looks, among the first screen A and the second screen B. The screen having the low resolution may be driven at a predetermined reference frequency or at a frequency different from a reference frequency. Here, the frequency different from the reference frequency may be a frequency that is higher or lower than the reference frequency. The reference frequency may be a frame frequency of 60 Hz.

In an unfolded state in which the flexible display panel 100 is unfolded, the drive IC 300 drives a screen having a high resolution (S131 and S133). The screen having the high resolution may be an activated screen of a maximum screen combining the first screen A, the folding boundary C, and the second screen B. As shown in FIG. 17, the screen having the high resolution may be driven at the reference frequency or driven at the frequency different from the reference frequency.

Referring to FIG. 14, when the flexible display panel 100 is folded, the drive IC 300 drives the screen having the low resolution (S141 to S144). In the folded state, a frame frequency of an image signal input to the drive IC 300 may be varied. In this case, the drive IC 300 detects the frame frequency of the input image signal and drives the screen having the low resolution at the varied frequency (S142 and S143). The varied frequency means the frame frequency different from the reference frequency. When the input frequency of the drive IC 300 is not varied in the folded state, the drive IC 300 drives the screen having the low resolution at the reference frequency (S142 and S144).

When the flexible display panel 100 is in the unfolded state in which the flexible display panel 100 is not folded, the drive IC 300 drives the screen having the high resolution (S145 to S147). In the unfolded state, the frame frequency of the image signal input to the drive IC 300 may be varied. In this case, the drive IC 300 detects the frame frequency of the input image signal and drives the screen having the high resolution at the varied frequency (S145 and S146). When the input frequency of the drive IC 300 is not varied in the unfolded state, the drive IC 300 drives the screen having the high resolution at the reference frequency (S145 and S147).

The foldable display of the present disclosure may drive any one screen in a virtual reality (VR) mode in the folded state. As shown in FIG. 15, in the VR mode, in order to prevent a user from feeling motion sickness and fatigue when he or she moves, it is necessary to move an image by reflecting movement of the user in real time at a high frame frequency.

Referring to FIG. 15, when the flexible display panel 100 is folded, the drive IC 300 drives the screen having the low resolution (S151 to S154).

In the folded state, the user may select the VR mode in a state in which the foldable display is folded. In this case, the host system 200 transmits an image signal of VR content selected by the user to the drive IC 300. In response to an output signal of the tilt sensor, the host system 200 may generate and transmit an image signal of a high frame frequency to the drive IC 300 by rendering pixel data to which movement of the user is reflected. In the VR mode, the drive IC 300 receives an input image signal having a frequency that is higher than the reference frequency and drives the screen having the low resolution at the high frequency. The high frequency may be a frame frequency of 120 Hz (S152 and S153). When the VR mode is not selected in the folded state, the drive IC 300 drives the screen having the low resolution at the reference frequency (S152 and S154).

When the flexible display panel 100 is in the unfolded state in which the flexible display panel 100 is not folded, the drive IC 300 drives the screen having the high resolution at the reference frequency (S151 and S155).

FIG. 18 is a circuit diagram illustrating an operation of a pixel formed in a deactivated area. The deactivated area is the second screen B in the example of FIG. 16A and is the first screen A in the example of FIG. 16B.

Referring to FIG. 18, pixels in the deactivated area do not emit light and are each maintained in a black display state. When the flexible display panel 100 is being folded, the deactivated area may be a screen at which the user does not look.

In order to allow the deactivated area to be maintained in a black display, a pixel circuit of the deactivated area suppresses light emission of the light emitting element OLED. To this end, the sixth switching elements M6 of the deactivated area are turned on in response to the gate-on voltages VGL of the $N^{th}$ scan signals SCAN(N) to apply the initialization voltages Vini to anodes of the light-emitting elements OLED. When Vini is applied to the anode, since a voltage between the anode and the cathode is lower than the threshold voltage Vth, the light emitting element OLED is maintained in an off state to not emit light.

Figure 20:
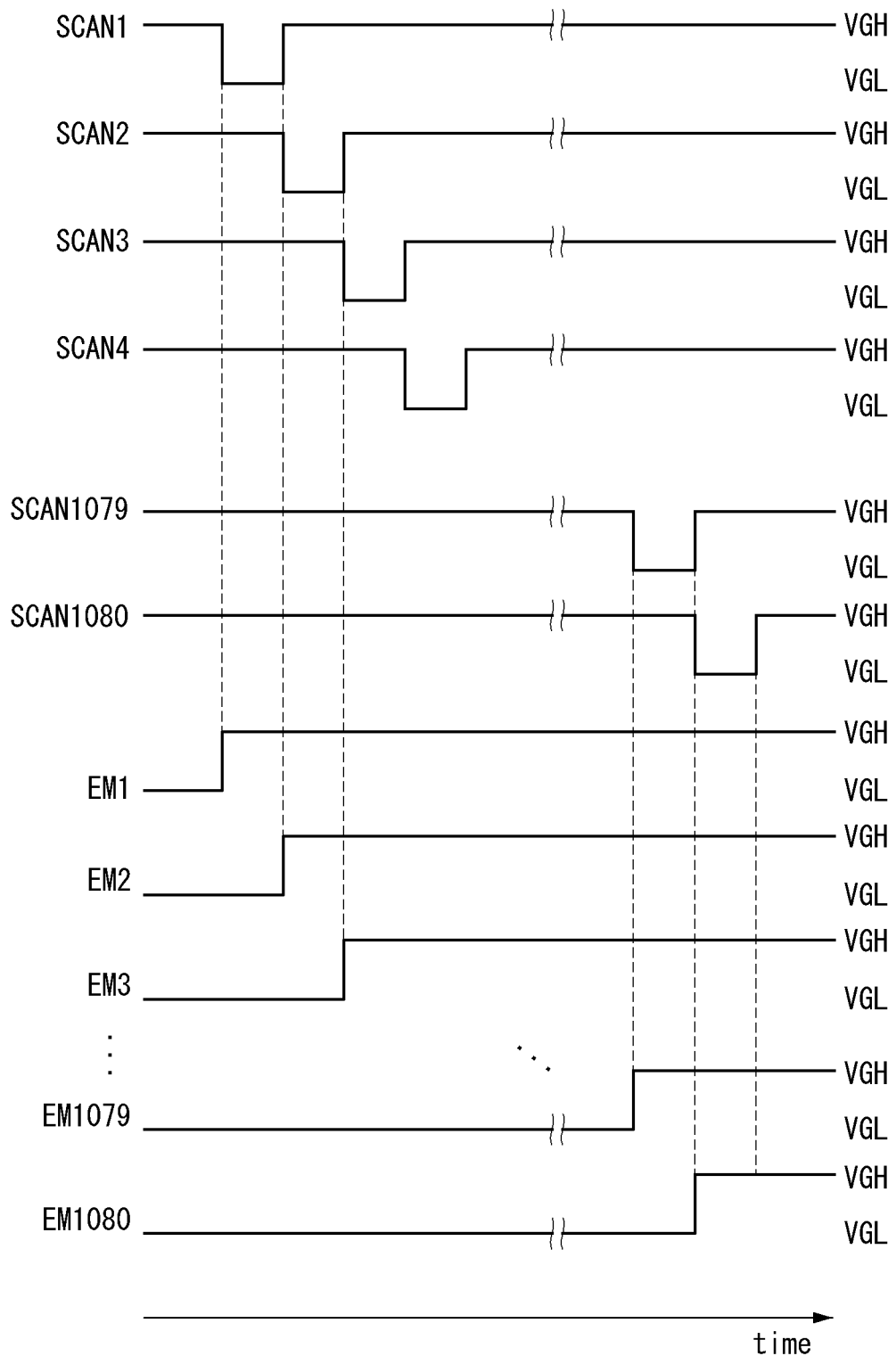
FIG. 20 is a diagram illustrating an example of the gate signal when the first screen is deactivated.

In the case of a deactivated screen, as illustrated in FIG. 20, the scan signal is sequentially applied to the deactivated screen to set the anode voltage of the OLED to Vini to control the pixels in a black color state for one frame period or more.

As shown in FIG. 20, the EM signals EM(N) applied to the pixels in the deactivated area are applied as the gate-off voltages VGH for one frame interval or more. This is due to a residual charge of the drive element DT, which is accumulated due to a previous data signal, being prevented from influencing on an anode potential of the light emitting element OLED by blocking a current path between the pixel driving voltage ELVDD and the drive element DT and a current path between the drive element DT and the light emitting element OLED. When the EM signals EM(N) of the gate-off voltage VGH are applied to the gates of the third and fourth switching elements M3 and M4, the third and fourth switching elements M3 and M4 are turned off.

The drive IC 300 supplies the data voltage Vdata only during a period in which the activated area is scanned. Only for a scanning time of the activated area, in synchronization with the data voltage Vdata, does the gate driver 120 sequentially supply output signals, that is, pulses of the scan signals SCAN(N-1) and SCAN(N) and pulses of the light emission control signals EM(N) to the gate lines of the activated area. Only the activated area is scanned in a progressive scan manner, and thus the data voltages Vdata are sequentially applied to the pixels one pixel line at a time.

For the remaining time in one frame interval except for the scanning time of the activated area, an output buffer of the data driver 306 is turned off to not output the data voltage Vdata, and the data output channel of the data driver 306 becomes a high impedance state Hi-Z. When the data output channel is in the high impedance state Hi-Z, the data output channel is electrically separated from the data line so that power consumption does not occur in the data output channel.

As shown in FIG. 18, in each pixel in the deactivated area, the first, second, and sixth switching elements M1, M2, and M6 may be turned on in response to the gate-on voltage VGL of the Nth scan signal SCAN(N). In each pixel of the deactivated area, the third, fourth, and fifth switching elements M3, M4, and M5 may be turned off in response to the gate off voltage VGH of the light emission control signal EM(N) and the (N-1)th scan signal SCAN(N-1). Whenever the Nth scan signal SCAN(N) is applied, voltages of the anodes of the light emitting elements OLED formed in the deactivated area are initialized at the initialization voltage Vini so that the light emitting elements OLED are turned off and do not emit light. Therefore, the pixels of the deactivated area may maintain the brightness of the black gradation due to the initialization voltage Vini applied to the anodes of the light emitting elements OLED without receiving separate black data voltages.

Figure 19:
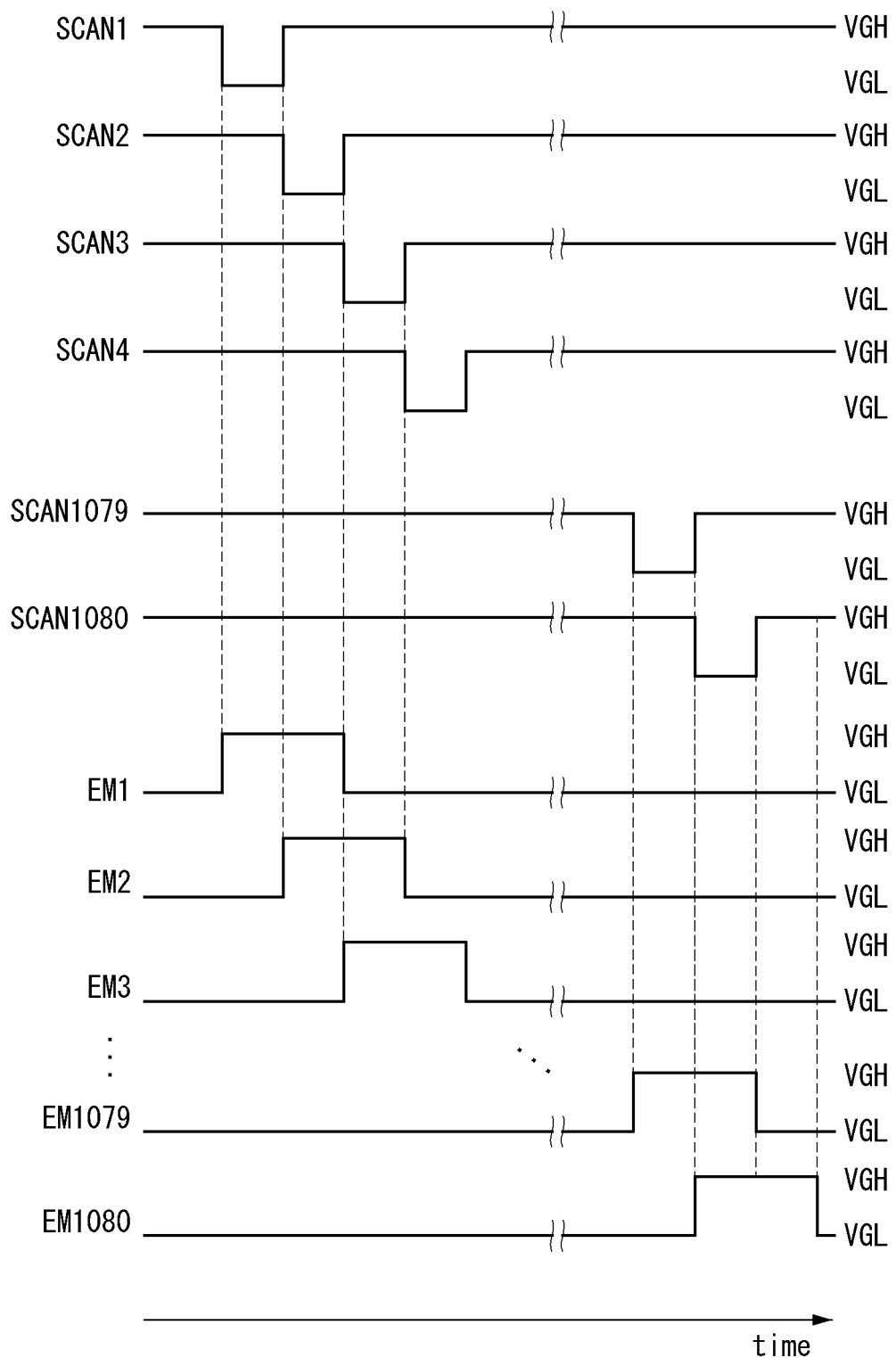
FIG. 19 is a diagram illustrating an example of a gate signal when a first screen is activated.

FIG. 19 is a diagram illustrating an example of a gate signal when the first screen A is activated.

Referring to FIG. 19, the first screen A is activated so that an image may be displayed on the first screen A. The data output channels of the drive IC 300 output the data voltage Vdata of the input image at a scanning time of the activated first screen A. The scan signals SCAN1 to SCAN1080 may be sequentially supplied to pixel lines of the first screen A due to a pulse of a gate-on voltage VGL synchronized with the data voltage Vdata. The EM signals EM1 to EM1080 may be generated as pulses of the gate-off voltage VGH synchronized with the (N-1)th and Nth scan signals SCAN (N-1) and SCAN(N). The EM signals EM1 to EM1080 may be inverted into the gate-on voltage VGL during the light emission time Tem to form the current path between the pixel driving voltage ELVDD and the light emitting element OLED.

FIG. 20 is a diagram illustrating an example of the gate signal when the first screen A is deactivated.

Referring to FIG. 20, when the first screen A is deactivated, the first screen A displays black. In this case, the data output channels of the drive IC 300 become the high impedance state Hi-Z at the scanning time of the first screen A and do not output the data voltage Vdata. The scan signals SCAN1 to SCAN1080 are sequentially supplied to the pixel lines of the first screen A. The sixth switching elements M6 of the first screen A are turned on in response to the scan signals SCAN1 to SCAN1080 to apply the initialization voltage Vini to the anodes of the light emitting elements OLED. The EM signals EM1 to EM1080 may be generated as pulses of the gate-off voltage VGH during one frame interval or more. Consequently, since the initialization voltage Vini is applied to the anodes of the light emitting elements OLED in all pixels, the deactivated first screen A displays a black gradation.

Figure 21:
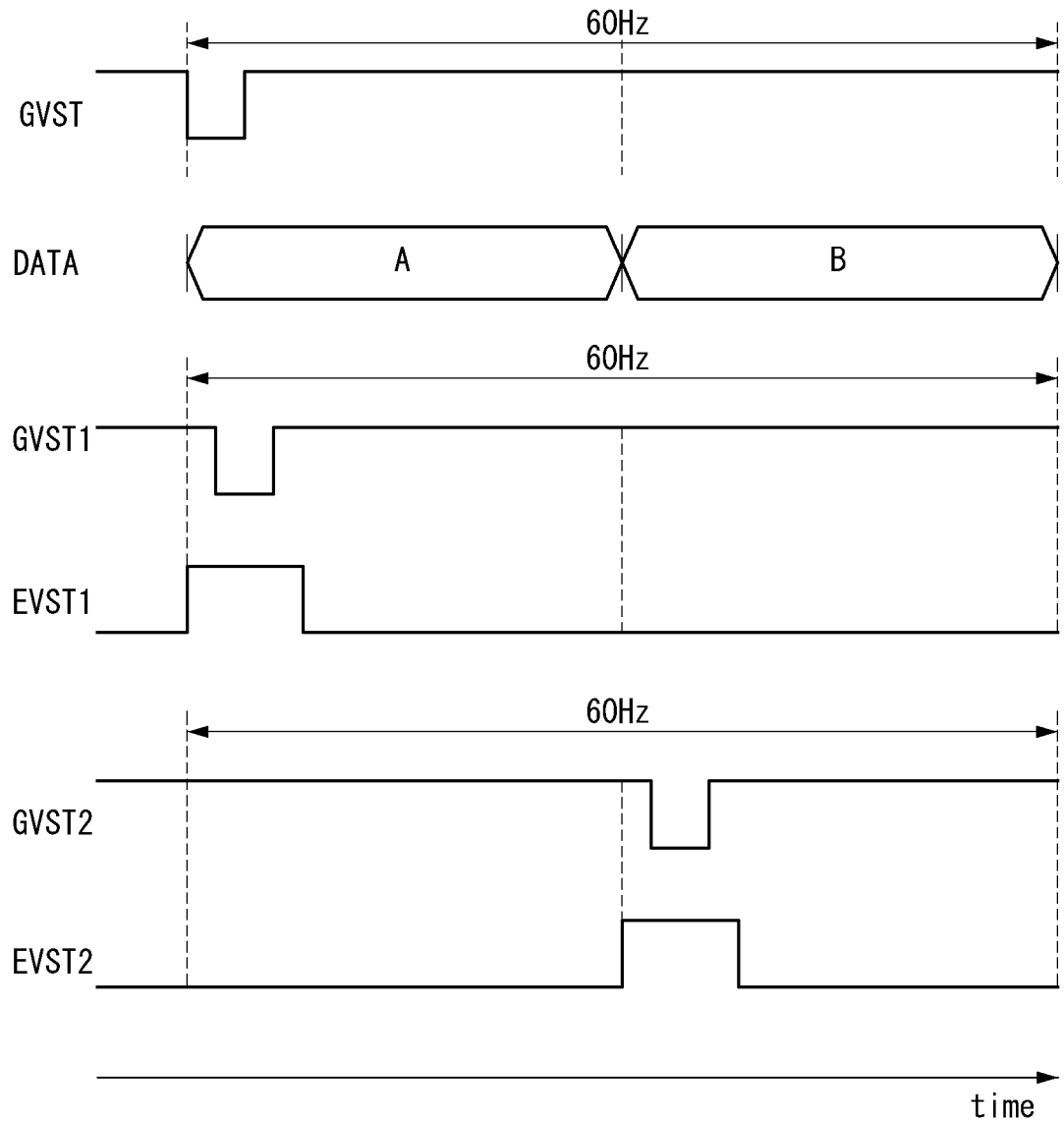
FIG. 21 is a waveform diagram illustrating a gate start pulse when all screens are activated.

FIG. 21 is a waveform diagram illustrating a start pulse when all the screens A, B, and C are activated. In the unfolded state in which the flexible display panel 100 is unfolded, an input image may be displayed on all the screens A, B, and C. FIG. 24 is a waveform diagram illustrating a data signal and a vertical synchronization signal when the entire screen is activated. In FIG. 24, #1, #2, . . . , and #2160 are pixel line numbers indicating data signals for the pixel lines.

Referring to FIGS. 21 and 24, a first-first start pulse GVST1 is generated as a pulse of the gate-on voltage VGL at the beginning of one frame interval. A second-first start pulse (EVST1) is generated as a pulse of gate-off voltage VGH at the beginning of one frame interval.

A first-second start pulse GVST2 is generated as a pulse of the gate-on voltage VGL at about half time of one frame interval. The second-second start pulse EVST2 is generated as a pulse of the gate-off voltage VGH at about half time of the one frame period.

While all the screens A, B, and C are activated, each of the first start pulses GVST1 and EVST1 and each of the second start pulses GVST2 and EVST2 may be generated at a frequency of 60 Hz.

FIGS. 22, 23, 25, and 26 are diagrams illustrating a method of driving only half of all the screens as an activated area.

Figure 22:
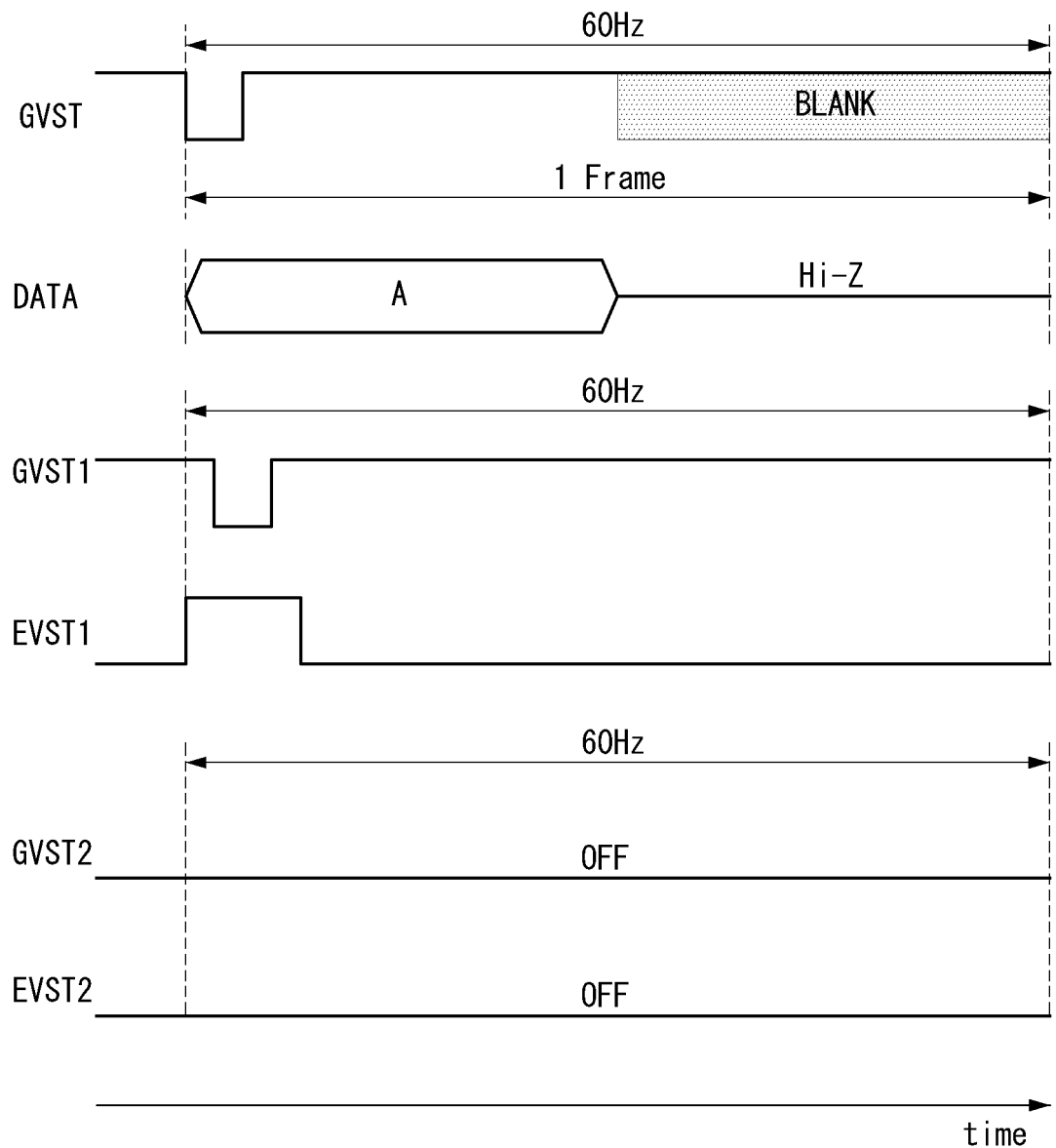
FIG. 22 is a waveform diagram illustrating a gate start pulse when the first screen is driven at a frame frequency of 60 Hz.

FIG. 22 is a waveform diagram illustrating a start pulse when the first screen A is driven at a frame frequency of 60 Hz which is set as a low power consumption mode. FIG. 25 is a waveform diagram illustrating a data signal and a vertical synchronization signal when the first screen A is driven at the frame frequency of 60 Hz.

In examples of FIGS. 22 and 25, the first screen A is activated and driven at the frequency of 60 Hz to display pixel data of an input image. The second screen B is deactivated to display black.

Referring to FIGS. 22 and 25, when only the first screen A is activated, each of the first gate start pulses GVST1 and EVST1 may be generated at a frequency of 60 Hz. In this case, the second gate start pulses GVST2 and EVST2 are not generated.

The first screen A displays the input image, whereas the second screen B displays black with a minimum brightness. The folding boundary C may be an activated area or a deactivated area. When the flexible panel is folded, an image different from the image displayed on the activated screen or a preset information may be displayed on the folding boundary C. When the flexible panel is folded, the folding boundary C may be controlled as the deactivated screen to display a black color.

During a half frame interval (8.3 ms) at the frame frequency of 60 Hz, the drive IC 300 outputs a data voltage Vdata supplied to the pixels of the first screen A through the data output channels. Subsequently, during the remaining half frame interval, the drive IC 300 turns output buffers of the data output channels off to maintain the data output channels at the high impedance Hi-Z.

After the first screen A is scanned, since the data voltage Vdata of the pixel data is not output from the drive IC 300, the pixel data of the input image is not written in the pixels of the second screen B. The gate driver 120 sequentially supplies the scan pulses SCAN(N) to the gate lines of the second screen B to which the data voltage Vdata is not applied and thus, as shown in FIG. 18, the initialization voltage Vini is applied to the anode of the light emitting element OLED so that light emission of the pixels is suppressed. Consequently, the second screen B displays a black gradation.

In one frame interval (16.67 ms) at the frame frequency of 60 Hz, since the data voltage Vdata is not supplied to the pixels during a second half interval, there is an effect in that the vertical blank interval (VB=BLANK) extends by as much as the second half interval. Accordingly, this driving method may obtain an impulsive or black data inversion (BDI) effect.

Figure 23:
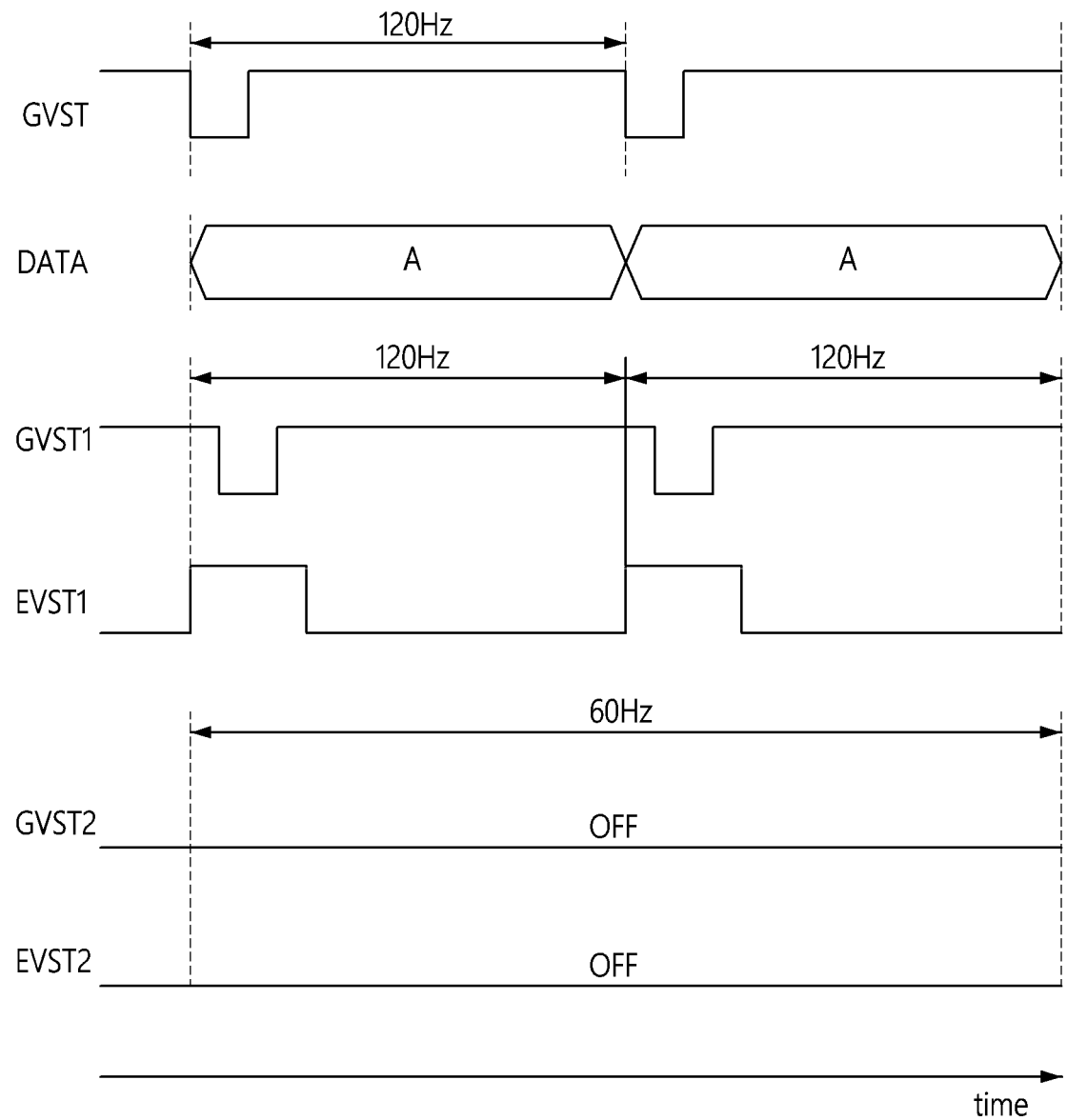
FIG. 23 is a waveform diagram illustrating a gate start pulse when the first screen is driven at a frame frequency of 120 Hz.

FIG. 23 is a waveform diagram illustrating a start pulse when the first screen A is driven at a frame frequency of 120 Hz. FIG. 26 is a waveform diagram illustrating a data signal and a vertical synchronization signal when the first screen A is driven at the frame frequency of 120 Hz.

Referring to FIGS. 23 and 26, when only the first screen A is activated, the first gate start pulses GVST1 and EVST1 may be generated at a frequency of 120 Hz. In this case, the second gate start pulses GVST2 and EVST2 are not generated.

The first screen A displays the input image, whereas the second screen B displays black with a minimum brightness. The folding boundary C may be an activated area or a deactivated area.

The drive IC 300 is driven at the frame frequency of 120 Hz, and, during the one frame interval (8.3 ms), the drive IC 300 outputs a data voltage Vdata supplied to the pixels of the first screen A through the data output channels.

Figure 27:
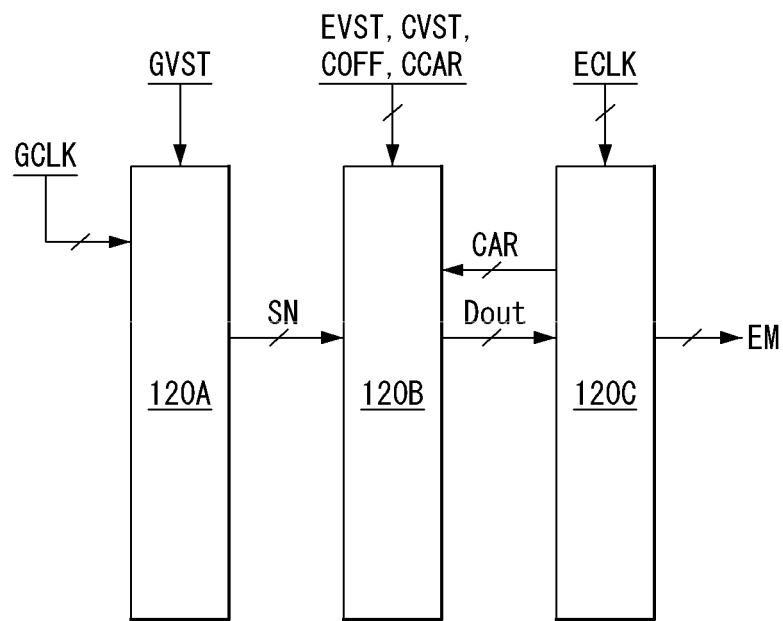
FIG. 27 is a diagram illustrating a first shift register, a second shift register, and a control block for connecting the first shift register to the second shift register according to an embodiment of the present disclosure.
Figure 28:
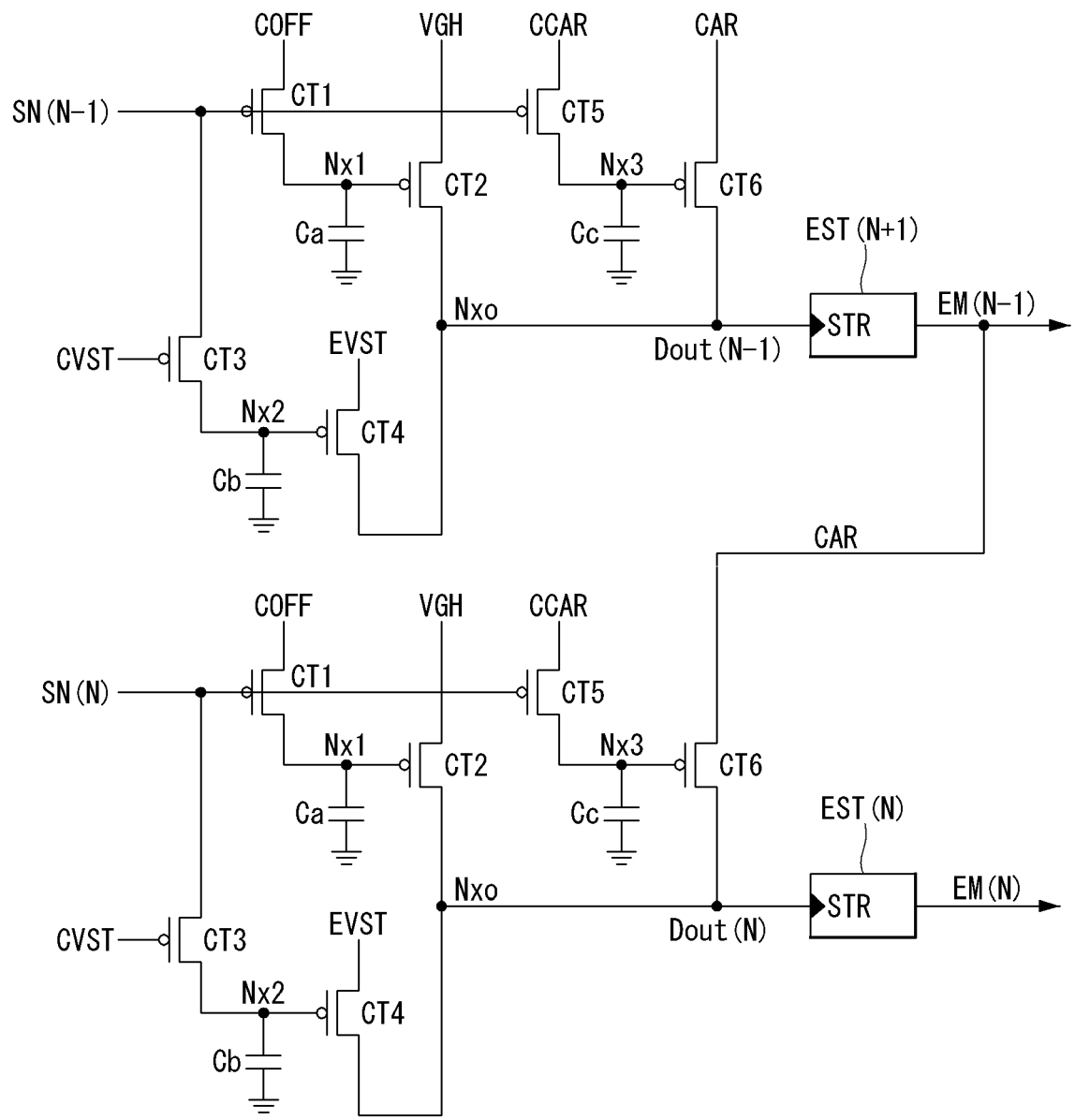
FIG. 28 is a diagram illustrating some controllers included in the control block.

FIG. 27 is a diagram illustrating a first shift register, a second shift register, and a control block for connecting the first shift register to the second shift register according to an embodiment of the present disclosure. FIG. 28 is a diagram illustrating some controllers included in the control block. In addition, FIG. 29 is a timing diagram illustrating driving the control block once.

Figure 29:
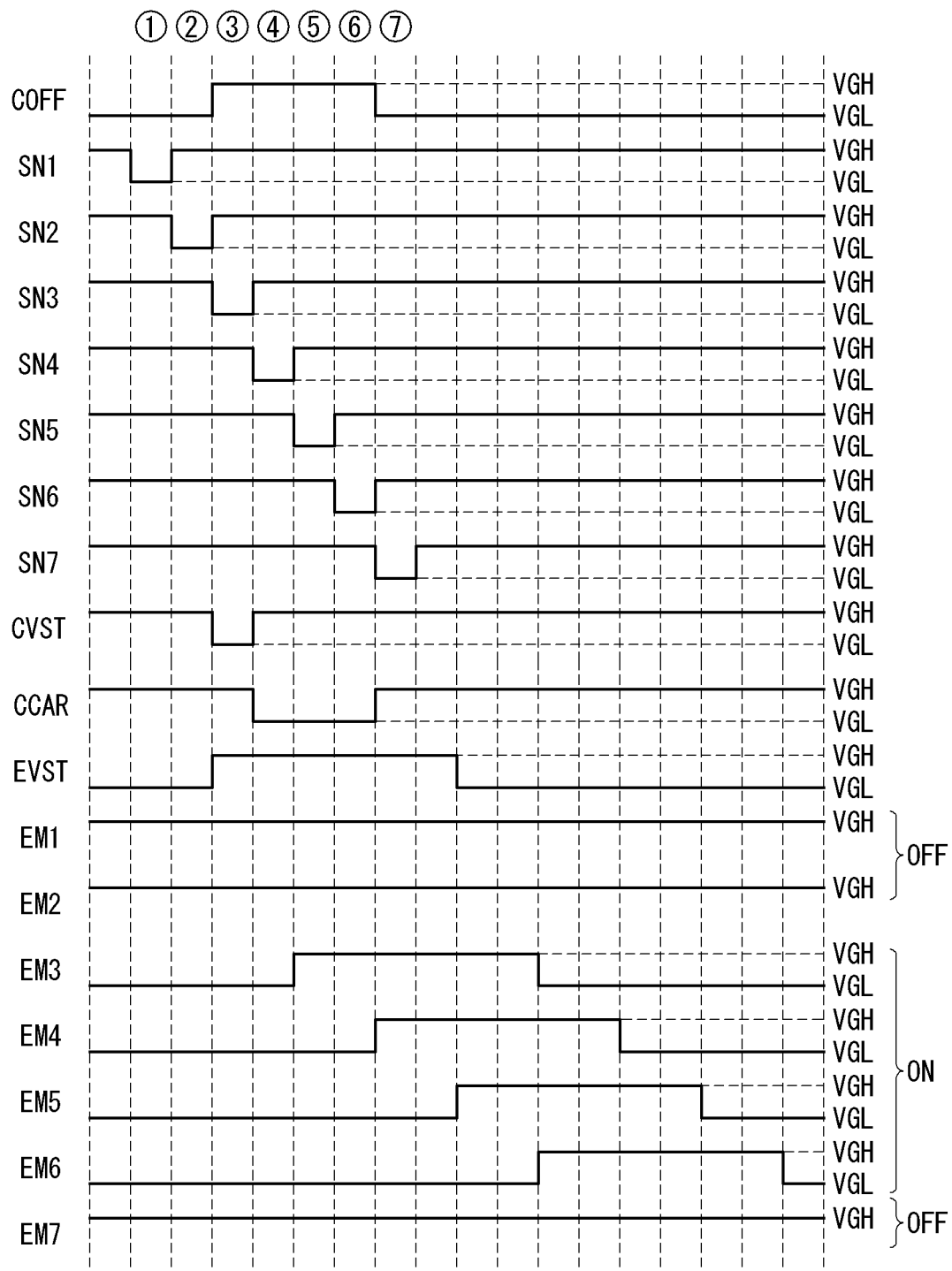
FIG. 29 is a timing diagram illustrating driving the control block once.

Referring to FIGS. 27 to 29, the gate driver of the present disclosure includes a first shift register 120A and a second shift register 120C, and a control block 120B for connecting the first shift register 120A to the second shift register 120C.

The first shift register 120A includes the signal transfer parts ST(n-1) to ST(n+2) of FIG. 8 and outputs scan signals SN of gate-on voltages of which phases are sequentially delayed. The first shift register 120A receives a scan start pulse GVST or a scan carry signal received from a previous signal transfer part as a start signal and generates a scan signal SN in synchronization with a rising edge of the scan shift clock GCLK.

The second shift register 120C includes a plurality of EM signal transfer parts EST which are connected in cascade through clock lines and carry signal lines. Each of the EM signal transfer parts EST operates as an off-driving signal transfer part, which outputs an EM signal of a gate-off voltage, or operates as an on-driving signal transfer part, which outputs an EM signal of a gate-on voltage, according to an EM output control signal Dout which is input to a start terminal STR. An EM shift clock ECLK is applied to each of the EM signal transfer parts EST.

The control block 120B includes a plurality of controllers connected to each of the EM signal transfer parts EST. An $n^{th}$ controller included in the control block 120B (n is a natural number) receives the $N^{th}$ scan signal SN(N) from the first shift register 120A, receives the EM start signal EVST, a first control signal COFF, a second control signal CVST, and a third control signal CCAR from the timing controller 303 of FIG. 6, and receives a carry signal CAR from an $(N-1)^{th}$ EM signal transfer part EST(N-1). The first control signal COFF serves to designate off-driving signal transfer parts and on-driving signal transfer parts among the EM signal transfer parts EST. The second control signal CVST serves to designate a first on-driving signal transfer part among the on-driving signal transfer parts. The third control signal CCAR serves to designate second to last on-driving signal transfer parts among the on-driving signal transfer parts.

The $n^{th}$ controller generates one among the gate-off voltage VGH, the EM start signal EVST, and the carry signal CAR from the $(N-1)^{th}$ EM signal transfer part EST(N-1) as an $N^{th}$ EM output control signal Dout(N) on the basis of the $N^{th}$ scan signal SN(N), the first control signal COFF, the second control signal CVST, and the third control signal CCAR and applies the $N^{th}$ EM output control signal Dout(N) to the start terminal STR of an $N^{th}$ EM signal transfer part EST(N).

As described above, in the folded state in which the flexible display panel 100 is folded, the control block 120B may control the activated area and the deactivated area of the screen. The activated area and the deactivated area of the screen may be determined due to the first control signal COFF, a first pixel line of the activated area may be determined due to the second control signal CVST, and second to last pixel lines of the activated area may be determined due to the third control signal CCAR. Thus, when the first control signal COFF, the second control signal CVST, and the third control signal CCAR, which are applied to the control block 120B, are varied, the activated area and the deactivated area of the screen may be freely selected. Consequently, even when the number of folding times of the foldable display is varied, responsiveness (model compatibility) with respect to the variation is improved, and, when a resolution is changed according to a change of the activated area (a driving area) in the rollable display, it is possible to provide an optimal driving solution.

The first shift register 120A may output the scan signals SN of the gate-on voltage VGL to both of the activated area and the deactivated area of the screen. As shown in FIG. 18, in the deactivated area, in response to the $N^{th}$ scan signal SCAN(N), the sixth switching element M6 reduces an anode voltage of the light emitting element OLED to the initialization voltage Vini, thereby suppressing light emission of the light emitting element OLED. Consequently, the pixels in the deactivated area maintain a brightness of a black gradation due to not emitting light. According to the present disclosure, a brightness of the deactivated area may be controlled to that of the black gradation only by turning the sixth switching element M6 on during the sampling period Tsam and applying the initialization voltage Vini to the anode of the light emitting element OLED.

The second shift register 120C outputs an EM signal of the gate-on voltage VGL to the activated area and outputs an EM signal of the gate-off voltage VGH to the deactivated area. In the deactivated area, since the third and fourth switching elements M3 and M4 are turned off due to the EM signal of the gate-off voltage VGH and influences of other nodes connected to the anode of the light emitting element OLED are blocked, driving stability may be further enhanced.

A specific connection configuration of the $n^{th}$ controller among the plurality of controllers included in the control block 120B will be described as follows.

The $n^{th}$ controller may include first to sixth transistors CT1 to CT6 and may further include first to third capacitors Ca, Cb, and Cc for driving stability.

The first transistor CT1 is turned on in response to the $N^{th}$ scan signal SN(N) to apply the first control signal COFF to a first node Nx1. The first transistor CT1 includes a gate electrode connected to an input terminal of the $N^{th}$ scan signal SN(N), a first electrode connected to an input terminal of the first control signal COFF, and a second electrode connected to the first node Nx1.

The second transistor CT2 is turned on in response to the first control signal COFF of the first node Nx1 to output the gate-off voltage VGH as the $N^{th}$ EM output control signal Dout (N). The second transistor CT2 includes a gate electrode connected to the first node Nx1, a first electrode connected to an input terminal of the gate-off voltage VGH, and a second electrode connected to the start terminal STR of the Nth EM signal transfer part EST(N) through an output node Nxo.

The third transistor CT3 is turned on in response to the second control signal CVST to apply the $N^{th}$ scan signal SN(N) to a second node Nx2. The third transistor CT3 includes a gate electrode connected to an input terminal of the second control signal CVST, a first electrode connected to an input terminal of the $N^{th}$ scan signal SN(N), and a second electrode connected to the second node Nx2.

The fourth transistor CT4 is turned on in response to the $N^{th}$ scan signal SN(N) of the second node Nx2 to output the EM start signal EVST as the $N^{th}$ EM output control signal Dout (N). The fourth transistor CT4 includes a gate electrode connected to the second node Nx2, a first electrode connected to an input terminal of the EM start signal EVST, and a second electrode connected to the start terminal STR of the $N^{th}$ EM signal transfer part EST(N) through the output node Nxo.

The fifth transistor CT5 is turned on in response to the $N^{th}$ scan signal SN(N) to apply the third control signal CCAR to a third node Nx3. The fifth transistor CT5 includes a gate electrode connected to an input terminal of the $N^{th}$ scan signal SN(N), a first electrode connected to an input terminal of the third control signal CCAR, and a second electrode connected to the third node Nx3.

The sixth transistor CT6 is turned on in response to the third control signal CCAR of the third node Nx3 to output the carry signal CAR from the $(N-1)^{th}$ EM signal transfer part EST(N-1) as the $N^{th}$ EM output control signal Dout(N). The sixth transistor CT6 includes a gate electrode connected to the third node Nx3, a first electrode through which the carry signal CAR is input from the $(N-1)^{th}$ EM signal transfer part EST(N-1), and a second electrode connected to the start terminal STR of the $N^{th}$ EM signal transfer part EST(N) through the output node Nxo.

The first capacitor Ca is connected to the first node Nx1 to store the first control signal COFF. The second capacitor Cb is connected to the second node Nx2 to store the $N^{th}$ scan signal SN(N). The third capacitor Cc is connected to the third node Nx3 to store the third control signal CCAR.

In FIG. 29, sections ① to ⑦ are synchronized with first to seventh scan signals SN1 to SN7 of the gate-on voltage. FIG. 29 illustrates an example in which, among first to seventh EM signal transfer parts generating first to seventh EM signals EM1 to EM7, the first, second, and seventh EM signal transfer parts operate as off-driving signal transfer parts which output EM signals of the gate-off voltage VGH, and the third to sixth EM signal transfer parts operate as on-driving signal transfer parts which output EM signals of the gate-on voltage VGL.

For the above operations, the first control signal COFF is input as the gate-on voltage VGL in the sections ①, ②, and ⑦ and input as the gate-off voltage VGH in the sections ③ to ⑥, thereby designating the off-driving signal transfer parts and the on-driving signal transfer parts among the first to seventh EM signal transfer parts. The first, second, and seventh EM signal transfer parts corresponding to the sections ①, ②, and ⑦ operate as the off-driving signal transfer parts, and the third to sixth EM signal transfer parts corresponding to the sections ③ to ⑥ operate as the on-driving signal transfer parts.

In addition, the second control signal CVST is input as the gate-on voltage VGL only in the section ③ to designate a first on-driving signal transfer part among the on-driving signal transfer parts. The third EM signal transfer part corresponding to the section ③ becomes the first on-driving signal transfer part among the on-driving signal transfer parts.

In addition, the third control signal CCAR is input as the gate-on voltage VGL in the sections ④, ⑤, and ⑥ to designate second to last on-driving signal transfer parts among the on-driving signal transfer parts. The fourth to sixth EM signal transfer parts corresponding to the sections ④, ⑤, and ⑥ become the second to last on-driving signal transfer parts among the on-driving signal transfer parts.

Figure 30:
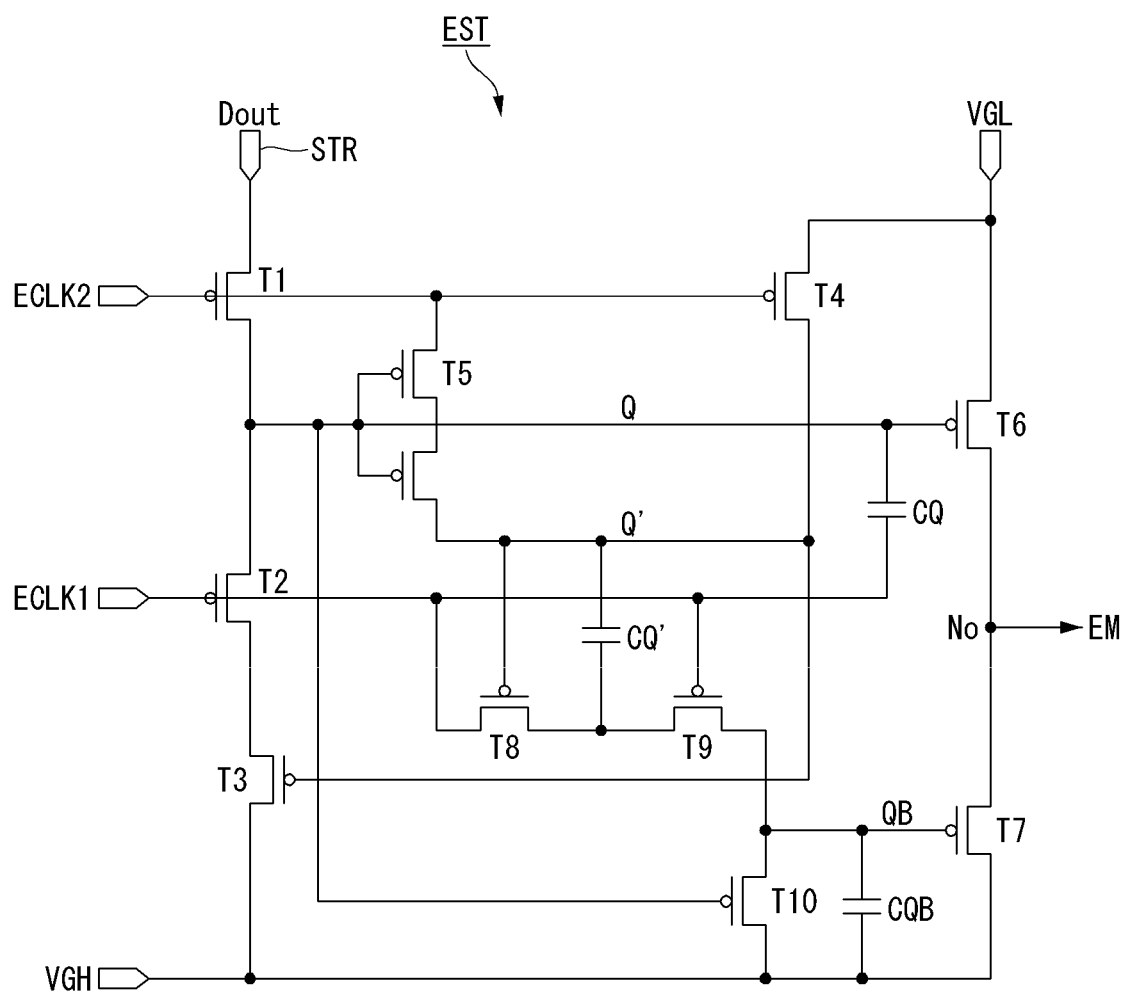
FIG. 30 is a circuit diagram illustrating a light emission (EM) signal transfer part of a second shift register connected to each controller of the control block.
Figure 31B:
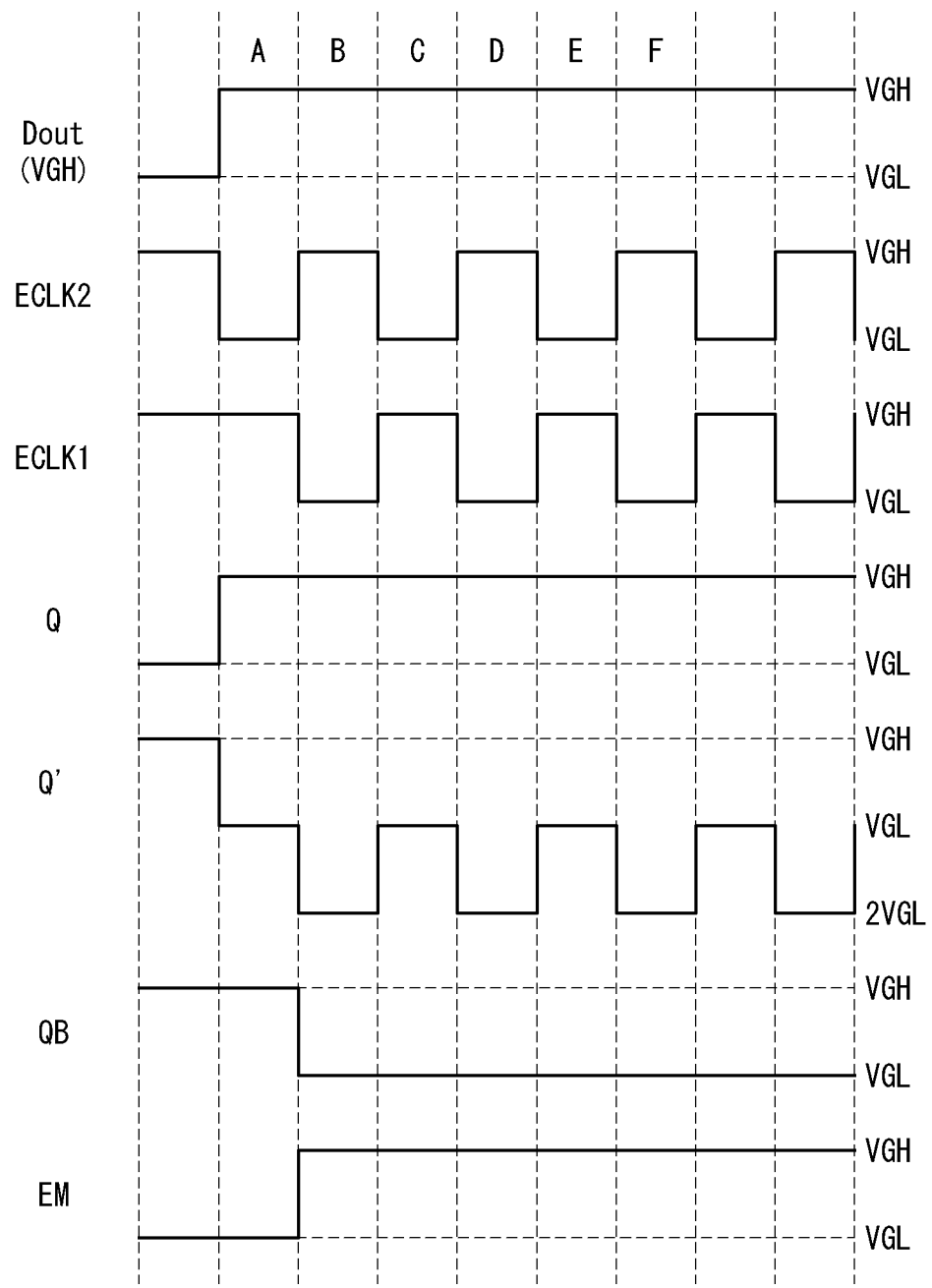
FIG. 31B is a timing diagram illustrating driving an EM signal transfer part, which drives a deactivated area, once.

FIG. 30 is a circuit diagram illustrating an EM signal transfer part of a second shift register connected to each controller of the control block. FIG. 31A is a timing diagram illustrating driving an EM signal transfer part, which drives an activated area, once. In addition, FIG. 31B is a timing diagram illustrating driving an EM signal transfer part, which drives a deactivated area, once.

Referring to FIG. 30, the EM signal transfer part EST includes a plurality of transistors T1 to T10 and a plurality of capacitors CQ, CQ', and CQB.

A first transistor T1 is turned on in response to a second EM clock ECLK2 to apply an EM output control signal Dout to a node Q. The first transistor T1 includes a gate electrode connected to an input terminal of the second EM clock ECLK2, a first electrode connected to the start terminal STR, and a second electrode connected to the node Q.

A second transistor T2 is turned on in response to a first EM clock ECLK1, of which a phase is opposite to that of the second EM clock ECLK2, to connect the node Q to one electrode of the third transistor T3. The second transistor T2 includes a gate electrode connected to an input terminal of the first EM clock ECLK1, a first electrode connected to the node Q, and a second electrode connected to one electrode of the third transistor T3.

A third transistor T3 is turned on in response to a voltage of a node Q' to apply the gate-off voltage VGH to the second electrode of the second transistor T2. The third transistor T3 includes a gate electrode connected to the node Q', a first electrode connected to the second electrode of the second transistor T2, and a second electrode connected to an input terminal of the gate-off voltage VGH.

A fourth transistor T4 is turned on in response to the second EM clock ECLK2 to apply the gate-on voltage VGL to the node Q'. The fourth transistor T4 includes a gate electrode connected to the input terminal of the second EM clock ECLK2, a first electrode connected to the input terminal of the gate-on voltage VGL, and a second electrode connected to the node Q'.

A fifth transistor T5 is turned on in response to a voltage of the node Q to apply the second EM clock ECLK2 to the node Q'. The fifth transistor T5 includes a gate electrode connected to the node Q, a first electrode connected to the input terminal of the second EM clock ECLK2, and a second electrode connected to the node Q'.

A sixth transistor T6 is turned on in response to the voltage of the node Q to apply the EM signal of the gate-on voltage VGL to an output node No. The sixth transistor T6 includes a gate electrode connected to the Q node, a first electrode connected to the input terminal of the gate-on voltage VGL, and a second electrode connected to the output node No.

A seventh transistor T7 is turned on in response to a voltage of a node QB to apply the EM signal of the gate-off voltage VGH to the output node No. The seventh transistor T7 includes a gate electrode connected to the node QB, a first electrode connected to an input terminal of the gate-off voltage VGH, and a second electrode connected to the output node No.

An eighth transistor T8 is turned on in response to the voltage of the node Q' to apply the first EM clock ECLK1 to one electrode of the ninth transistor T9. The eighth transistor T8 includes a gate electrode connected to the node Q', a first electrode connected to the input terminal of the first EM clock ECLK1, and a second electrode connected to one electrode of the ninth transistor T9.

A ninth transistor T9 is turned on in response to the first EM clock ECLK1 to connect the second electrode of the eighth transistor T8 to the node QB. The ninth transistor T9 includes a gate electrode connected to the input terminal of the first EM clock ECLK1, a first electrode connected to the second electrode of the eighth transistor T8, and a second electrode connected to the node QB.

A tenth transistor T10 is turned on in response to the voltage of the node Q to apply the gate-off voltage VGH to the node QB. The tenth transistor T10 includes a gate electrode connected to the node Q, a first electrode connected to the node QB, and a second electrode connected to the input terminal of the gate-off voltage VGH.

A first capacitor CQ is connected between the node Q and the input terminal of the first EM clock ECLK1. A second capacitor CQ' is connected between the node Q' and a node connecting the eighth transistor T8 to the ninth transistor T9. A third capacitor CQB is connected between the node QB and the input terminal of the gate-off voltage VGH.

A driving timing diagram when the EM signal transfer part EST drives the activated area of the screen is shown in FIG. 31A. In this case, the EM output control signal Dout may be input as the gate-off voltage VGH in sections A, B, and C and input as the gate-on voltage VGL in sections D, E, and F. The EM output control signal Dout may be the EM start signal EVST or the carry signal CAR.

Referring to FIG. 31A, the voltage of the Q node becomes the gate-off voltage VGH in sections A and C due to the EM output control signal Dout of the gate-off voltage VGH applied through the first transistor T1 and becomes the gate-off voltage VGH in sections B and D due to the gate-off voltage VGH applied through the second and third transistors T2 and T3. The voltage of the Q node becomes the gate-on voltage VGL in a section E due to the EM output control signal Dout of the gate-on voltage VGL applied through the first transistor T1 and becomes a boosting voltage 2VGL that is lower than the gate-on voltage VGL in a section F due to a coupling action of the first capacitor CQ connected to the first EM clock ECLK1. In the sections E and F, the sixth transistor T6 is turned on, and thus the EM signal of the gate-on voltage VGL is output to the output node No.

Referring to FIG. 31A, the voltage of the node Q' becomes the gate-on voltage VGL in the sections A, C, and E due to the gate-on voltage VGL applied through the fourth transistor T4 and becomes the boosting voltage 2VGL in the sections B and D due to a coupling action of the second capacitor CQ' connected to the first EM clock ECLK1 through the eighth transistor T8. Then, the voltage of the node Q' becomes the gate-off voltage VGH in the section F due to the second EM clock ECLK2 of the gate-off voltage VGH applied through the fifth transistor T5.

Referring to FIG. 31A, the voltage of the node QB becomes the gate-on voltage VGL in the sections B and D due to the first EM clock ECLK1 of the gate-on voltage VGL applied through the eighth and ninth transistors T8 and T9 and maintains the gate-on voltage VGL in the section C due to the third capacitor CQB. The voltage of the node QB becomes the gate-off voltage VGH in the sections E and F due to the gate-off voltage VGH applied through the tenth transistor T10. In the sections B, C, and D, the seventh transistor T7 is turned on, and thus the EM signal of the gate-off voltage VGH is output to the output node No.

Meanwhile, a driving timing diagram when the EM signal transfer part EST drives the deactivated area of the screen is shown in FIG. 31B. In this case, the EM output control signal Dout is continuously input as the gate-off voltage VGH in the sections A, B, C, D, E, and F.

Referring to FIG. 31B, the voltage of the Q node becomes the gate-off voltage VGH in sections A, C and E due to the EM output control signal Dout of the gate-off voltage VGH applied through the first transistor T1 and becomes the gate-off voltage VGH in sections B, D, and F due to the gate-off voltage VGH applied through the second and third transistors T2 and T3.

Referring to FIG. 31B, the voltage of the node Q' becomes the gate-on voltage VGL in the sections A, C, and E due to the gate-on voltage VGL applied through the fourth transistor T4 and becomes the boosting voltage 2VGL in the sections B, D, and F due to a coupling action of the second capacitor CQ' connected to the first EM clock ECLK1 through the eighth transistor T8.

Referring to FIG. 31B, the voltage of the node QB becomes the gate-on voltage VGL in the sections B, D, and F due to the first EM clock ECLK1 of the gate-on voltage VGL applied through the eighth and ninth transistors T8 and T9 and maintains the gate-on voltage VGL in the sections C and E due to the third capacitor CQB. In the sections B, C, D, E, and F, the seventh transistor T7 is turned on, and thus the EM signal of the gate-off voltage VGH is output to the output node No.

Figure 32A:
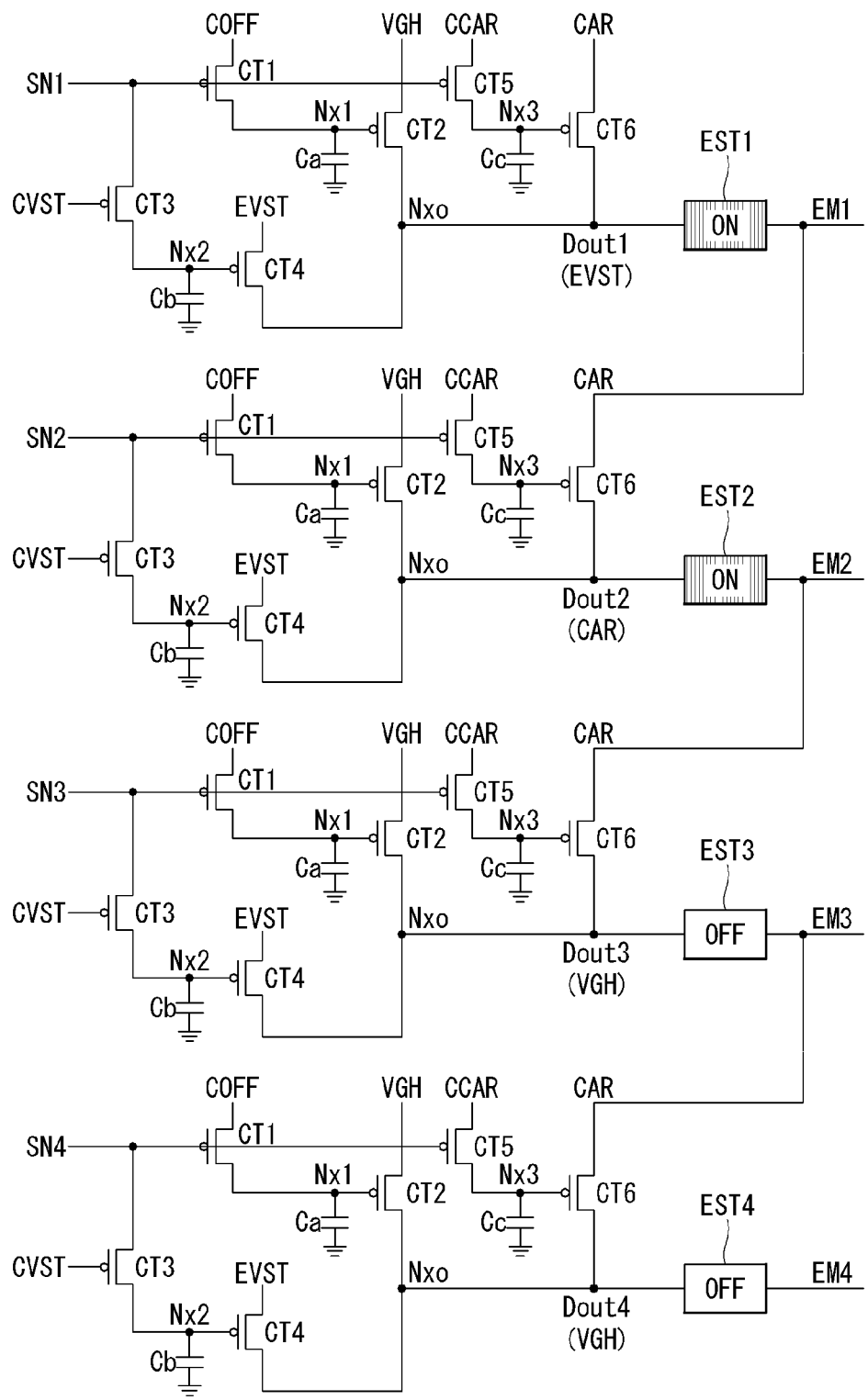
FIGS. 32A to 32C are diagrams for describing that EM signal transfer parts of the second shift register are selectively turned on or off in response to EM output control signals of the control block.
Figure 32B:
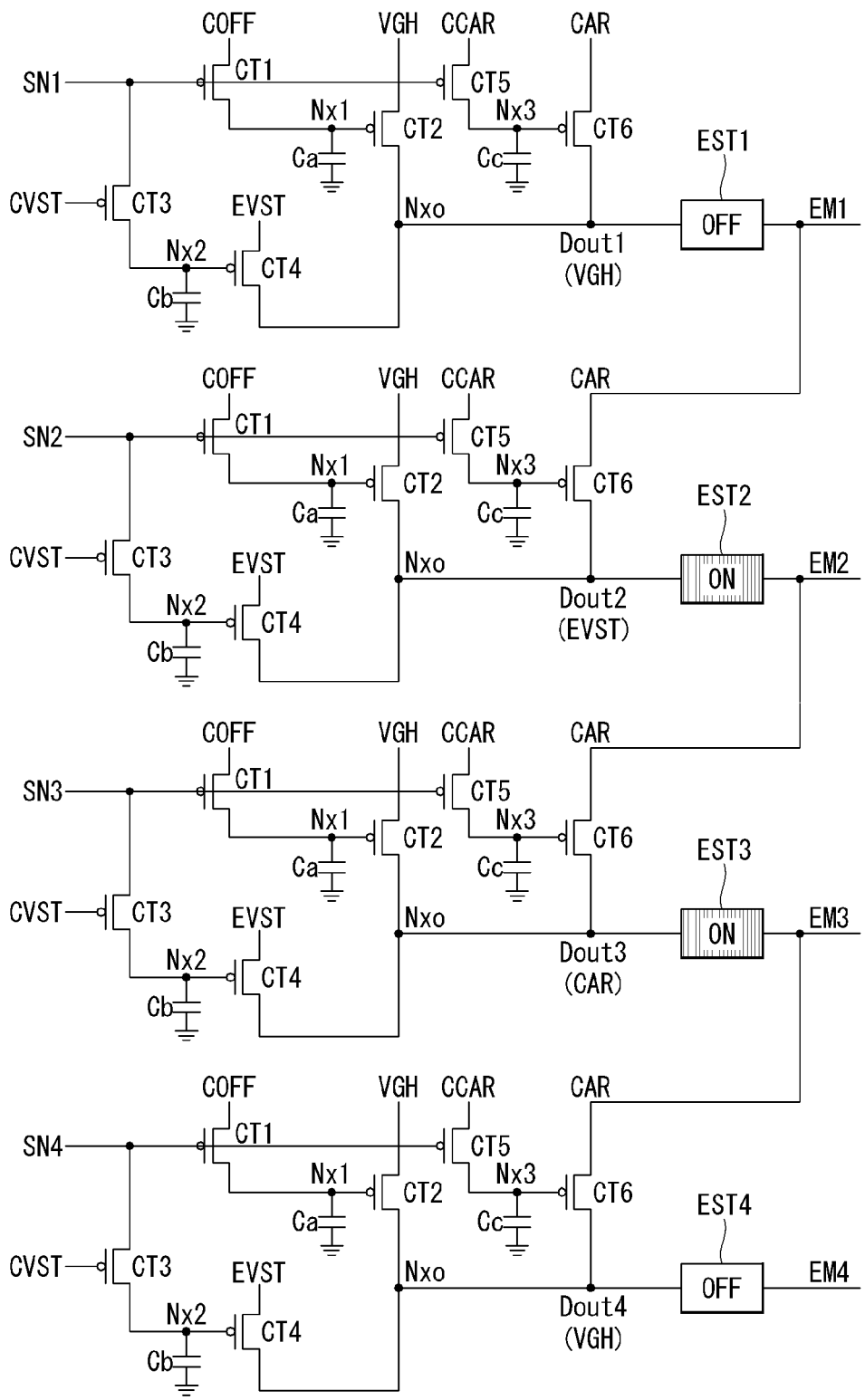
Figure 32C:
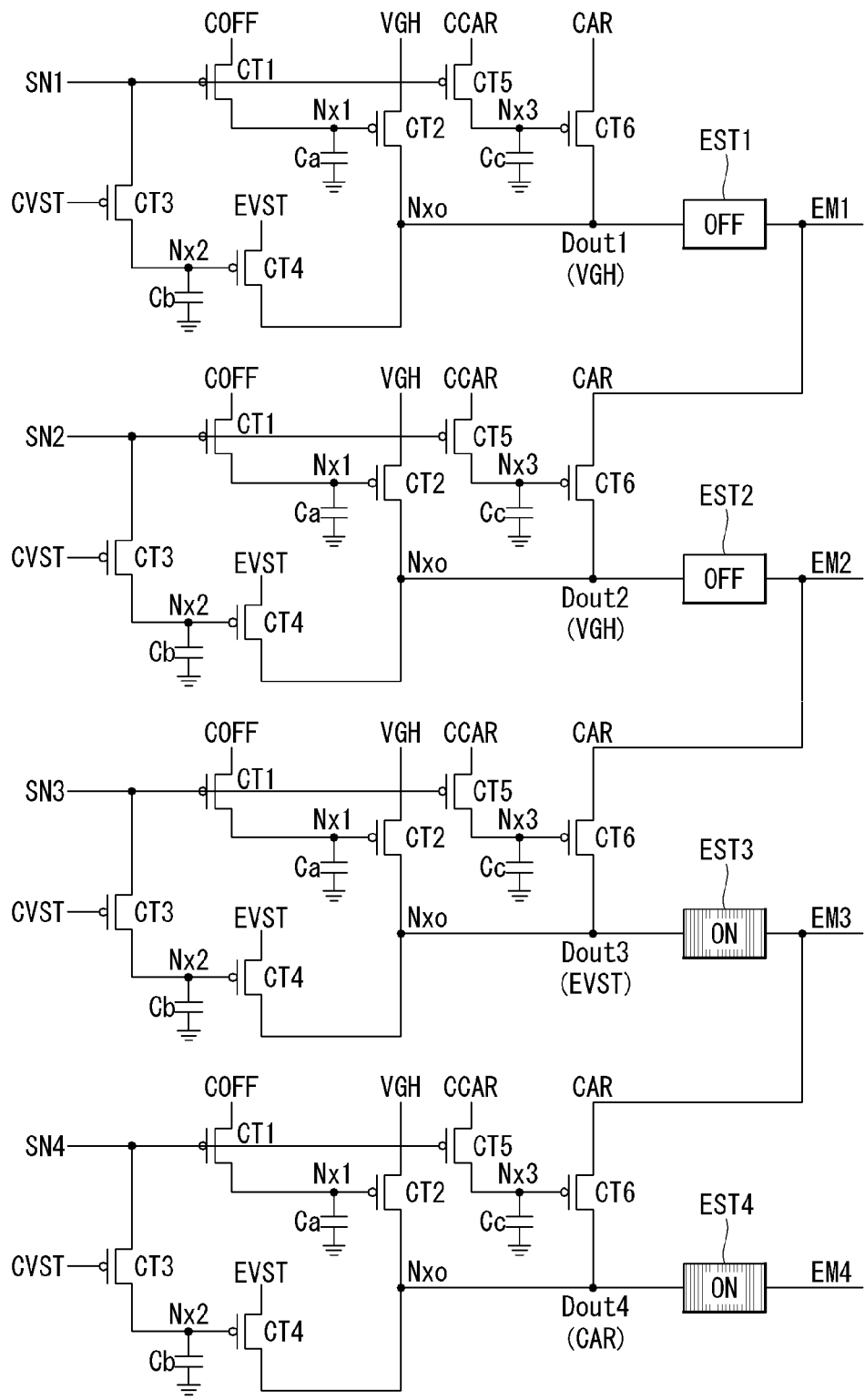

FIGS. 32A to 32C are diagrams for describing that EM signal transfer parts of the second shift register are selectively turned on or off in response to EM output control signals of the control block.

Referring to FIG. 32A, first and second EM signal transfer parts EST1 and EST2 may operate as on-driving signal transfer parts, and third and fourth EM signal transfer parts EST3 and EST4 may operate as off-driving signal transfer parts. To this end, a first EM output control signal Dout1 output from the first controller may be the EM start signal EVST, and a second EM output control signal Dout2 output from a second controller may be the carry signal CAR from the first EM signal transfer part EST1. In addition, a third EM output control signal Dout3 output from a third controller and a fourth EM output control signal Dout4 output from a fourth controller may be gate-off voltages VGH.

Referring to FIG. 32B, the second and third EM signal transfer parts EST2 and EST3 may operate as on-driving signal transfer parts, and the first and fourth EM signal transfer parts EST1 and EST4 may operate as off-driving signal transfer parts. To this end, the second EM output control signal Dout2 output from the second controller may be the EM start signal EVST, and the third EM output control signal Dout3 output from the third controller may be the carry signal CAR from the second EM signal transfer part EST2. In addition, the first EM output control signal Dout1 output from the first controller and the fourth EM output control signal Dout4 output from the fourth controller may be gate-off voltages VGH.

Referring to FIG. 32C, the first and second EM signal transfer parts EST1 and EST2 may operate as off-driving signal transfer parts, and the third and fourth EM signal transfer parts EST3 and EST4 may operate as on-driving signal transfer parts. To this end, the third EM output control signal Dout3 output from the third controller may be the EM start signal EVST, and the fourth EM output control signal Dout4 output from the fourth controller may be the carry signal CAR from the third EM signal transfer part EST3. In addition, the first EM output control signal Dout1 output from the first controller and the second EM output control signal Dout2 output from the second controller may be gate-off voltages VGH.

FIGS. 33A to 36B are diagrams for sequentially describing that first and fourth EM signal transfer parts of the second shift register are driven to be turned off and second and third EM signal transfer parts thereof are driven to be turned on.

Figure 33A:
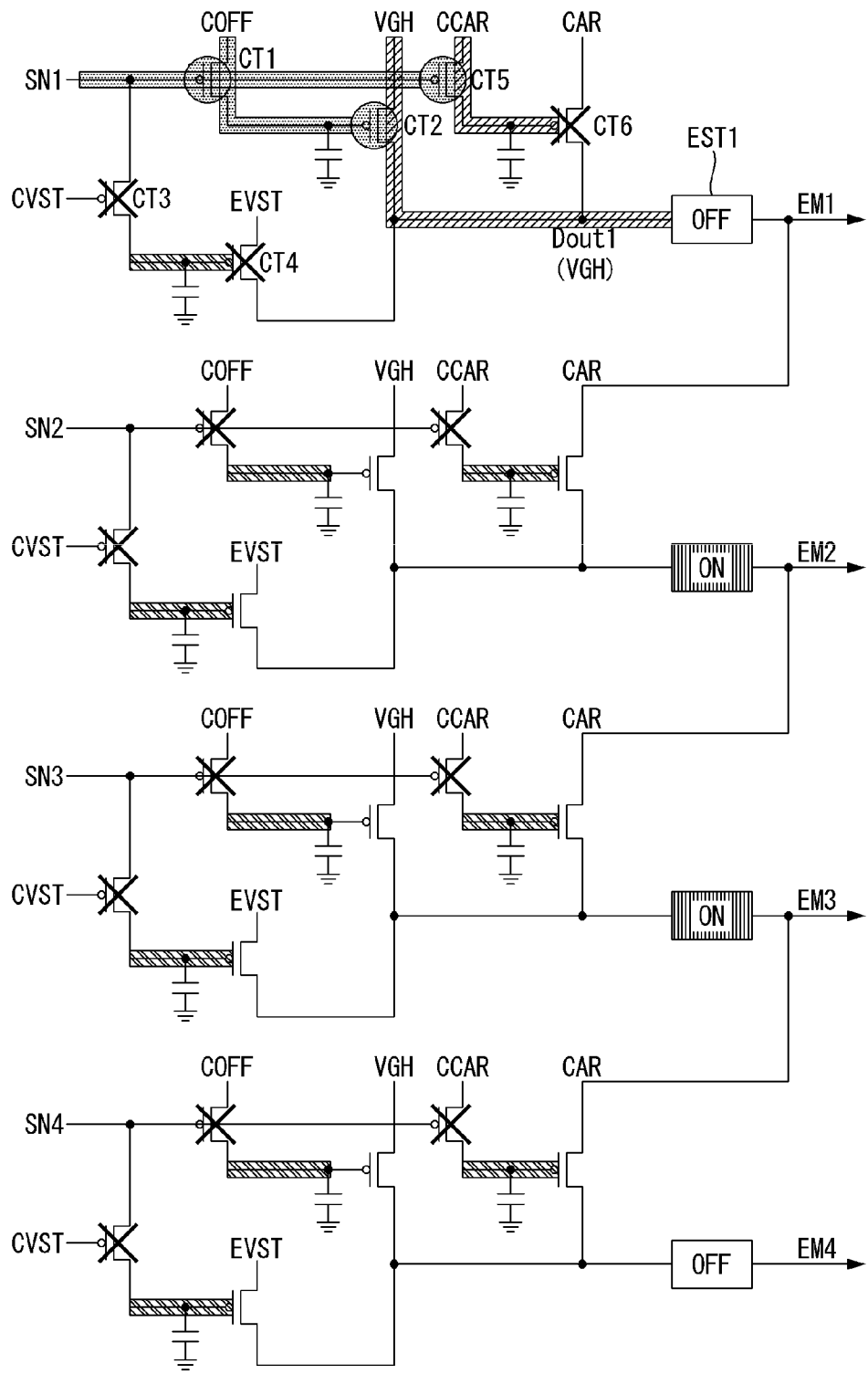

Referring to FIGS. 33A and 33B, the first controller operates in the section ①. In the section ①, a first transistor CT1 is turned on due to the first scan signal SN1 of the gate-on voltage VGL, and a second transistor CT2 is turned on due to the first control signal COFF of the gate-on voltage VGL. Then, the gate-off voltage VGH is applied to the start terminal STR of the first EM signal transfer part EST1 as the first EM output control signal Dout1, and the first EM signal transfer part EST1 is driven to be turned off to output the first EM signal EM1 of the gate-off voltage VGH. In the section ①, the second control signal CVST is input as the gate-off voltage VGH, and thus a third transistor CT3 and a fourth transistor CT4 are turned off and the third control signal CCAR is input as the gate-off voltage VGH so that a sixth transistor CT6 is turned off.

Figure 34A:
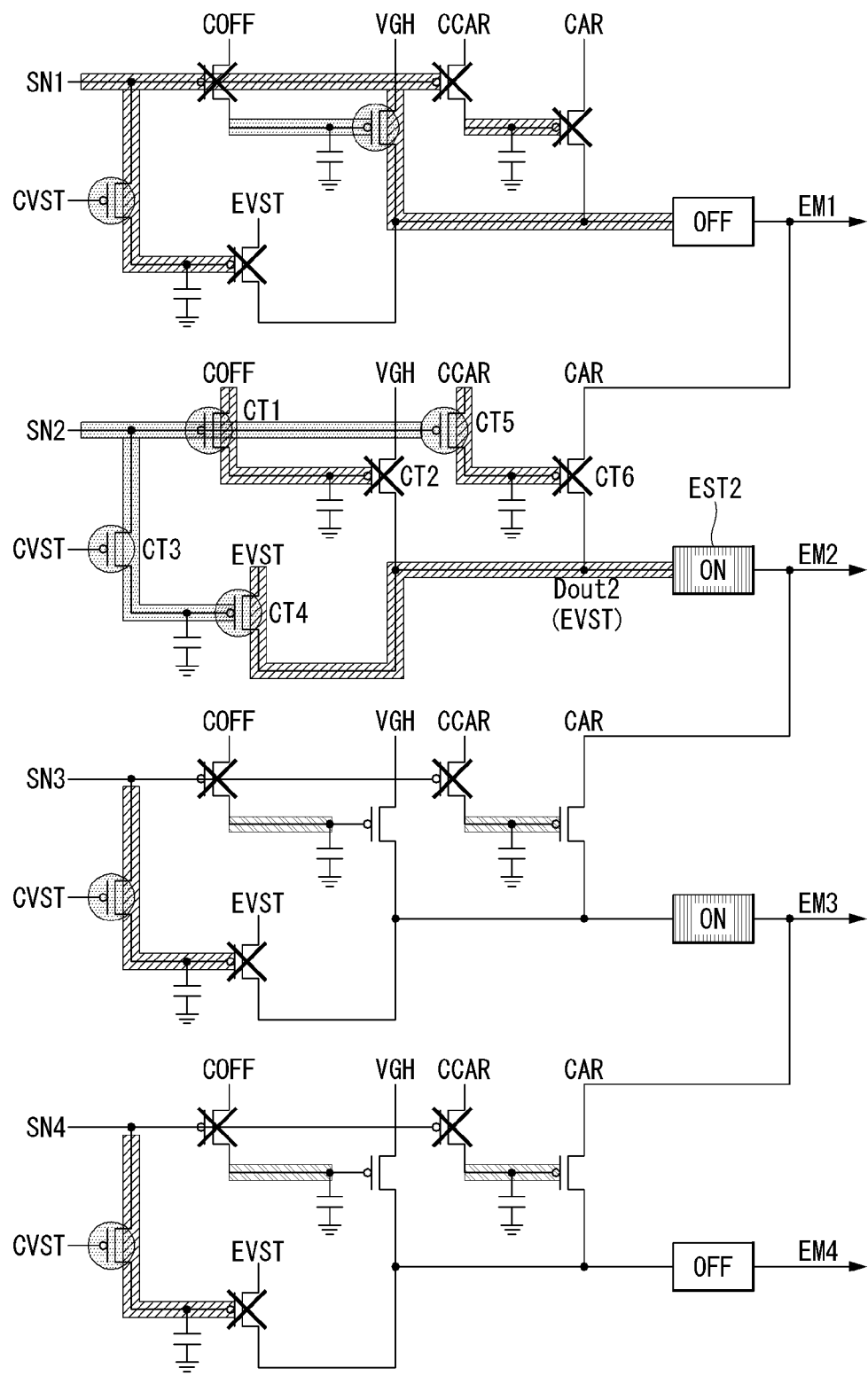
Figure 34B:
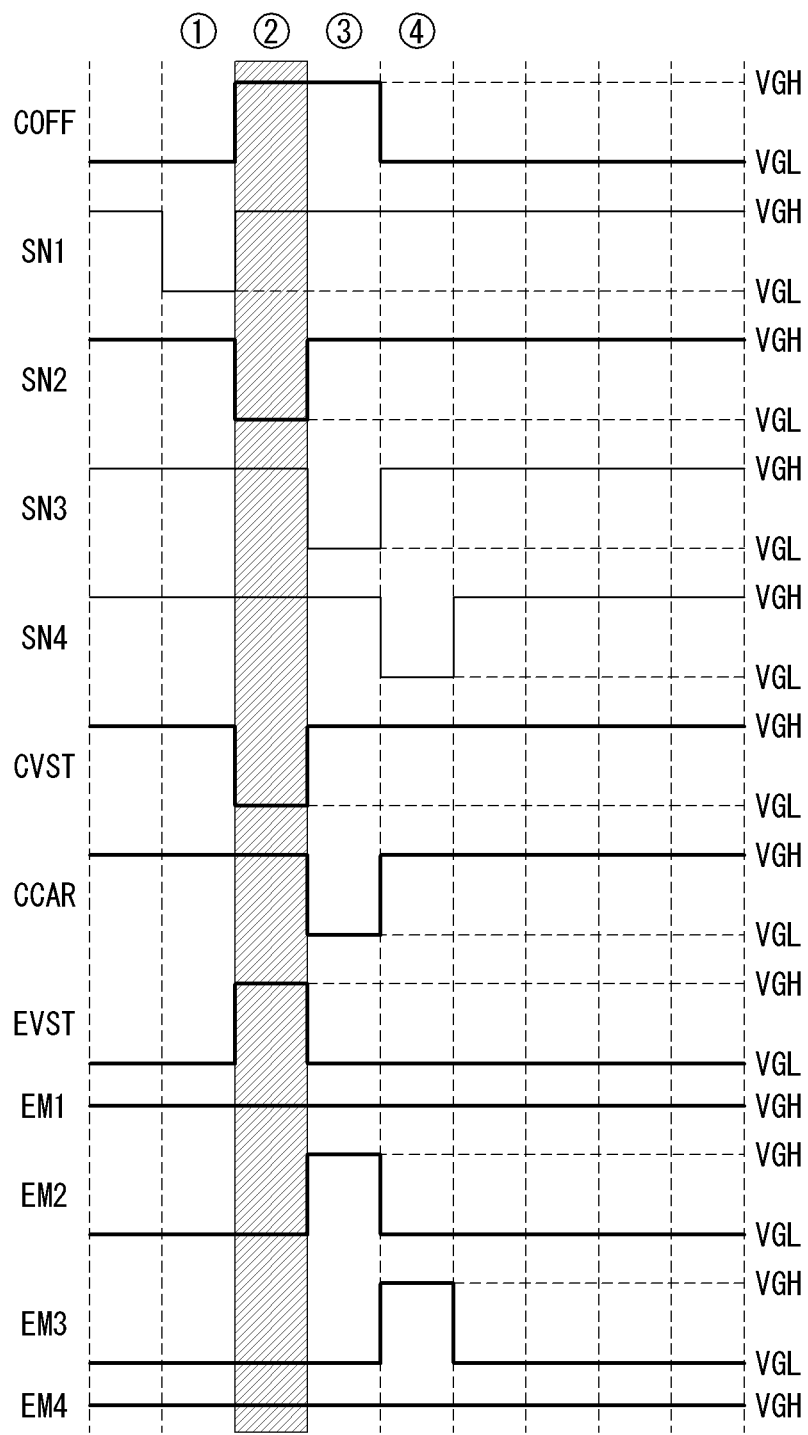

Referring to FIGS. 34A and 34B, the second controller operates in the section ②. In the section ②, the third transistor CT3 is turned on due to the second control signal CVST of the gate-on voltage VGL. Then, the EM start signal EVST of the gate-off voltage VGH is applied to the start terminal of the second EM signal transfer part EST2 as the second EM output control signal Dout2, and the second EM signal transfer part EST2 is driven to be turned on to output the second EM signal EM2 including the gate-on voltage VGL. In the section ②, the first transistor CT1 is turned on due to the second scan signal SN2 of the gate-on voltage VGL, and the second transistor CT2 is turned off due to the first control signal COFF of the gate-off voltage VGH. Then, the sixth transistor CT6 is turned off due to the third control signal CCAR of the gate-off voltage VGH.

Figure 35A:
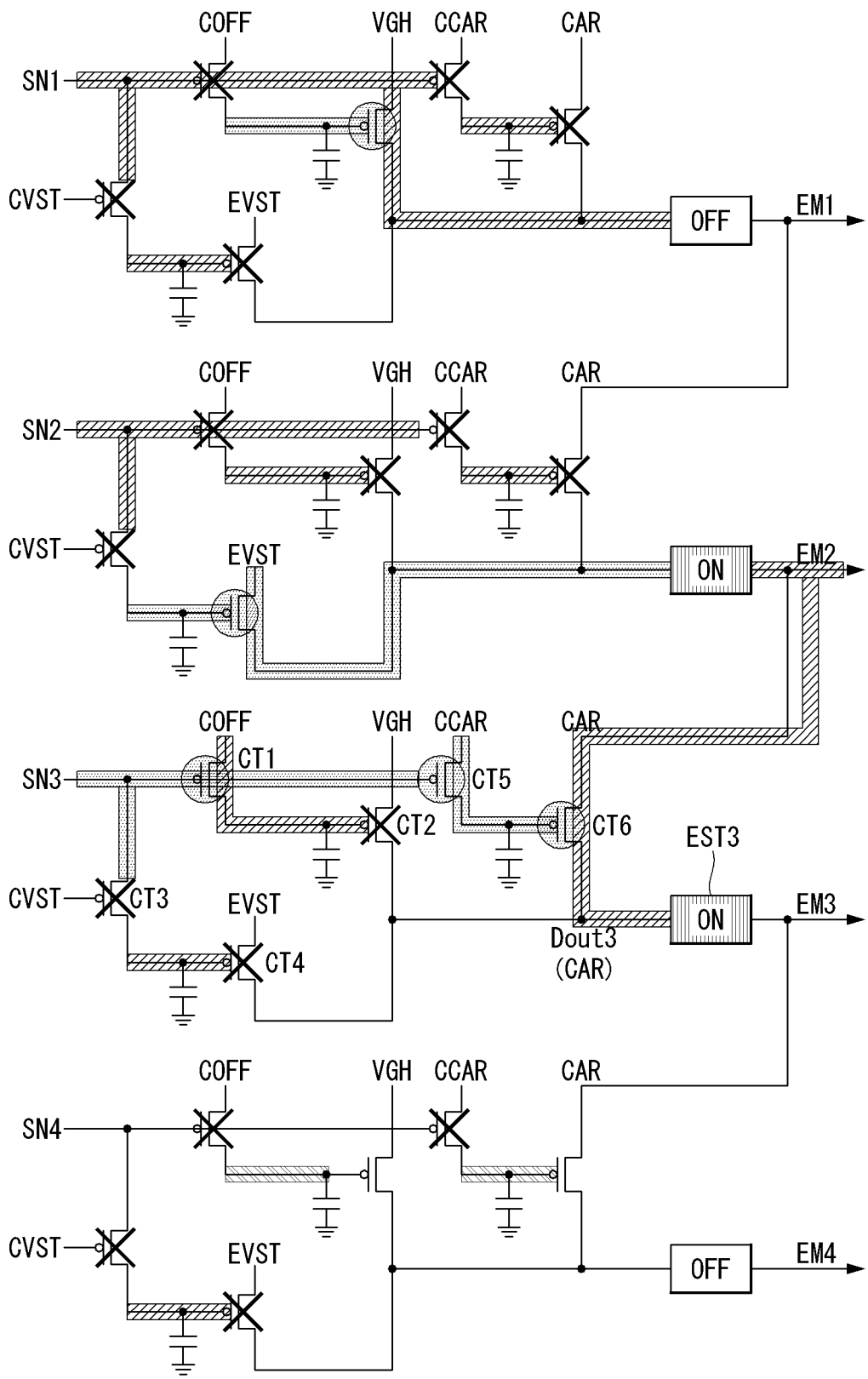
Figure 35B:
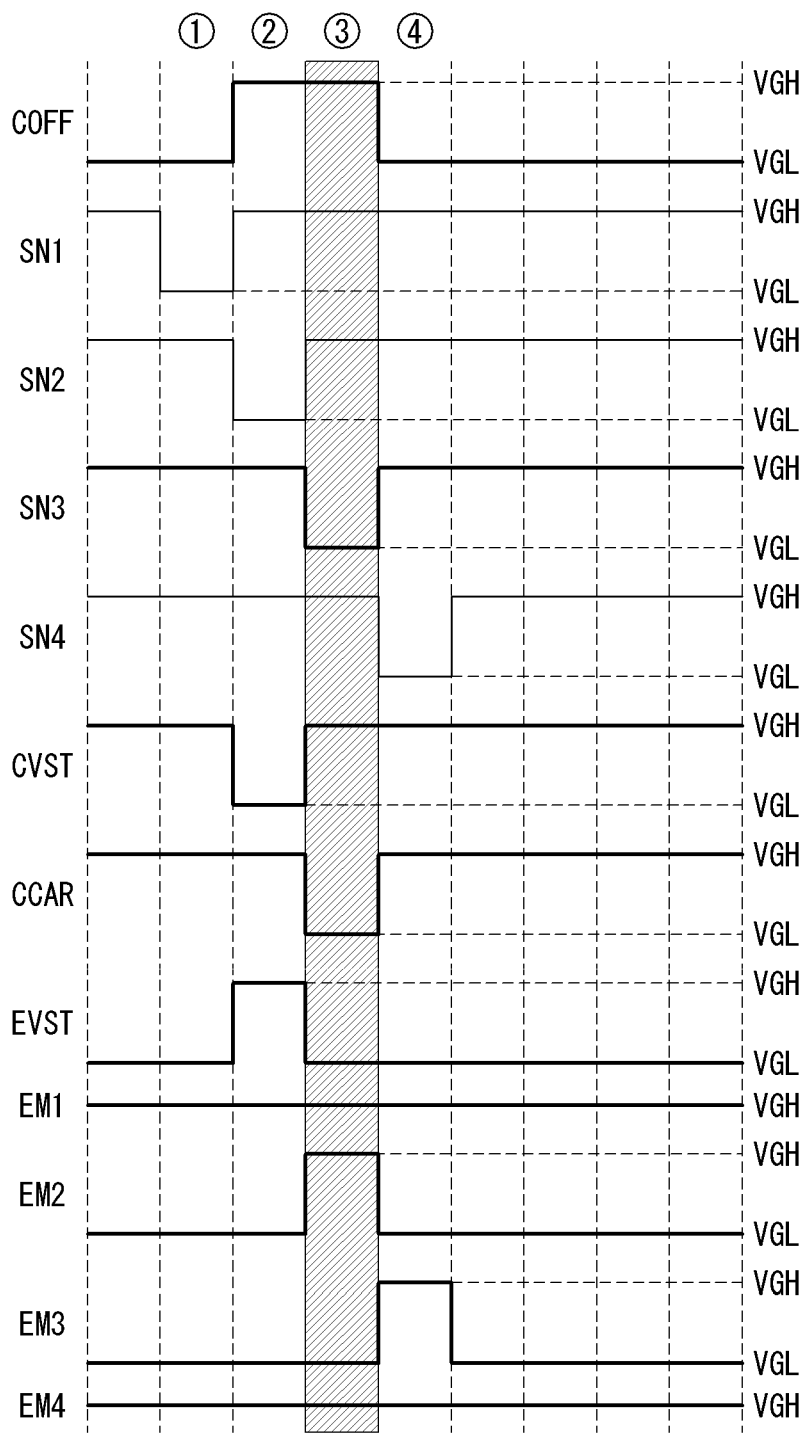

Referring to FIGS. 35A and 35B, the third controller operates in the section ③. In the section ③, the fifth transistor CT5 is turned on due to the third scan signal SN3 of the gate-on voltage VGL, and the sixth transistor CT6 is turned on due to the third control signal CCAR of the gate-on voltage VGL. Then, the carry signal CAR of the gate-off voltage VGH is applied to the start terminal of the third EM signal transfer part EST3 as the third EM output control signal Dout3, and the third EM signal transfer part EST3 is driven to be turned on to output the third EM signal EM3 including the gate-on voltage VGL. In the section ③, the first transistor CT1 is turned on due to the third scan signal SN3 of the gate-on voltage VGL, and the second transistor CT2 is turned off due to the first control signal COFF of the gate-off voltage VGH. Then, the third transistor CT3 and the fourth transistor CT4 are turned off due to the second control signal CVST of the gate-off voltage VGH.

Figure 36A:
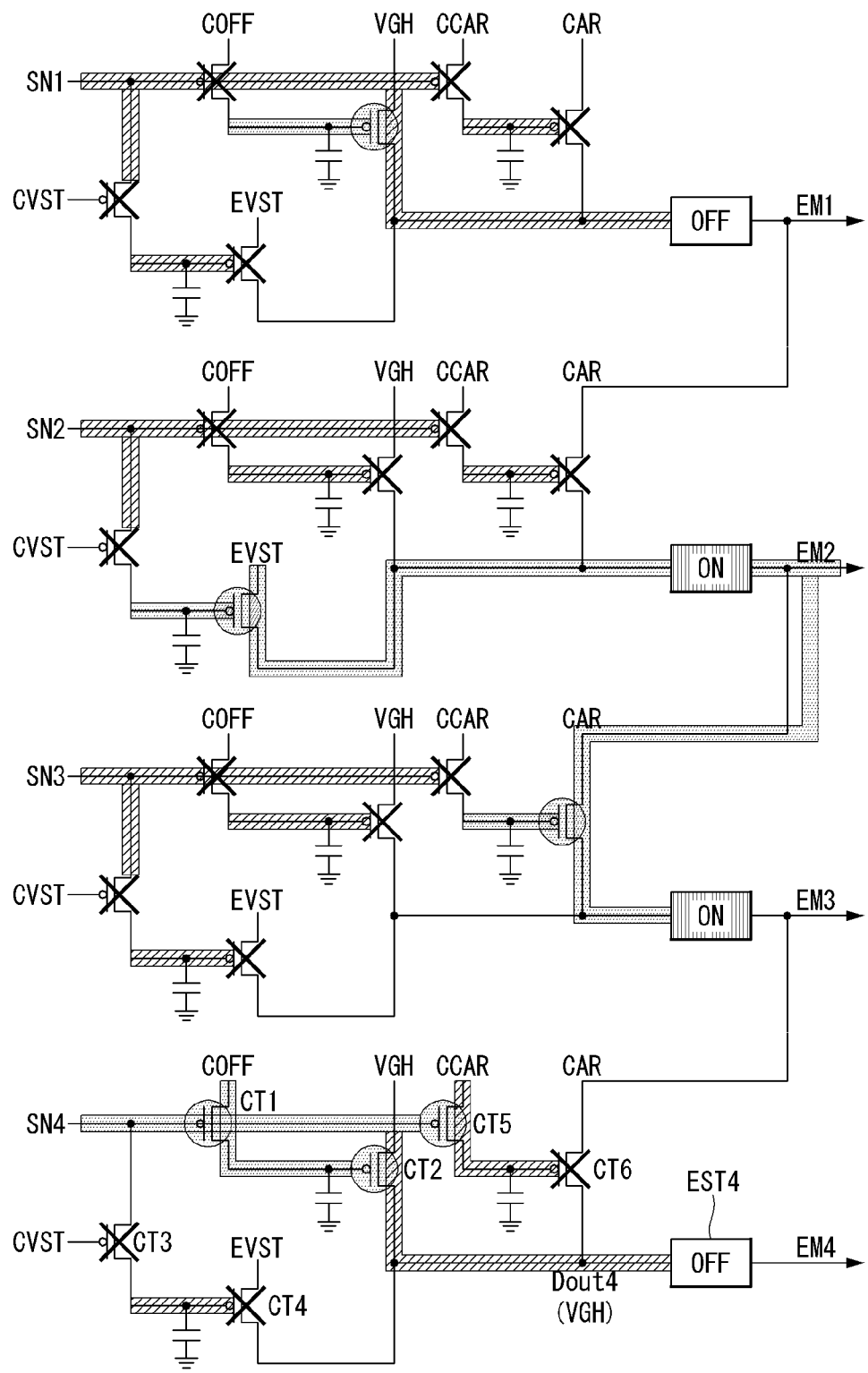

Referring to FIGS. 36A and 36B, the fourth controller operates in the section ④. In the section ④, the first transistor CT1 is turned on due to the fourth scan signal SN4 of the gate-on voltage VGL, and the second transistor CT2 is turned on due to the first control signal COFF of the gate-on voltage VGL. Then, the gate-off voltage VGH is applied to the start terminal STR of the fourth EM signal transfer part EST4 as the fourth EM output control signal Dout4, and the fourth EM signal transfer part EST4 is driven to be turned off to output the fourth EM signal EM4 of the gate-off voltage VGH. In the section ④, the second control signal CVST is input as the gate-off voltage VGH, and thus the third transistor CT3 and the fourth transistor CT4 are turned off and the third control signal CCAR is input as the gate-off voltage VGH so that the sixth transistor CT6 is turned off.

Figure 38:
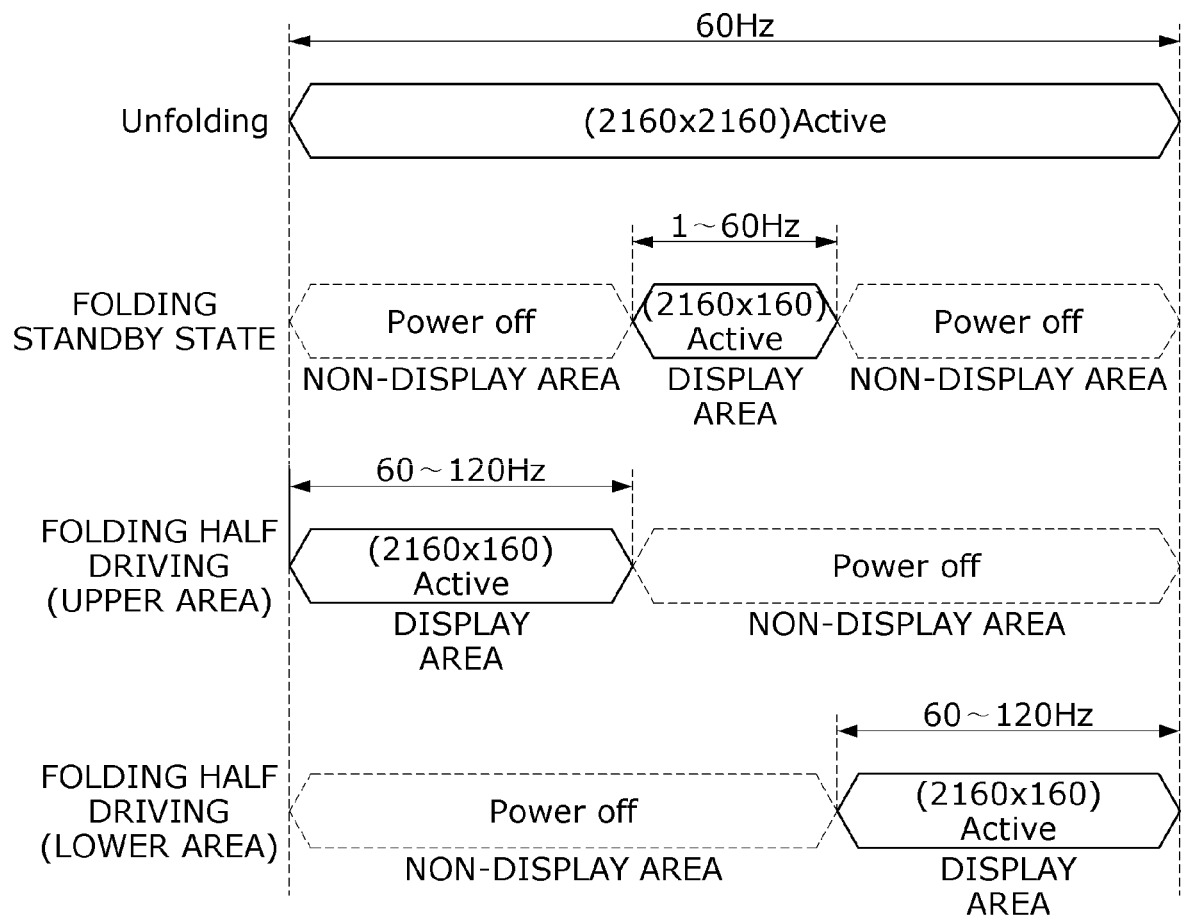

FIGS. 37 and 38 are diagrams illustrating a display state of a screen and data driving timing for reduction in power consumption during folding waiting and folding half driving.

When the configuration of the gate driver shown in FIGS. 27 to 36B is applied to the flexible display, a position and a resolution of the activated area may be freely adjusted. For example, as shown in FIGS. 37 and 38, the flexible display may include three folding driving areas, that is, a first screen area and a second screen area for half driving during folding, and a third screen area provided in a folding boundary between the first screen area and the second screen area. In a folding waiting state, the third screen area is an area in which a variation in image is low and may be driven at a fundamental frequency (e.g., 60 Hz) or at a frequency that is lower than the fundamental frequency. The third screen area may be a low-speed driving area.

On the other hand, in a folding half driving state in which an image is displayed on only one among the first screen area and the second screen area, an image display area may be driven at the fundamental frequency or at a frequency that is higher than the fundamental frequency. This screen area may be a high-speed driving area.

Figure 40:
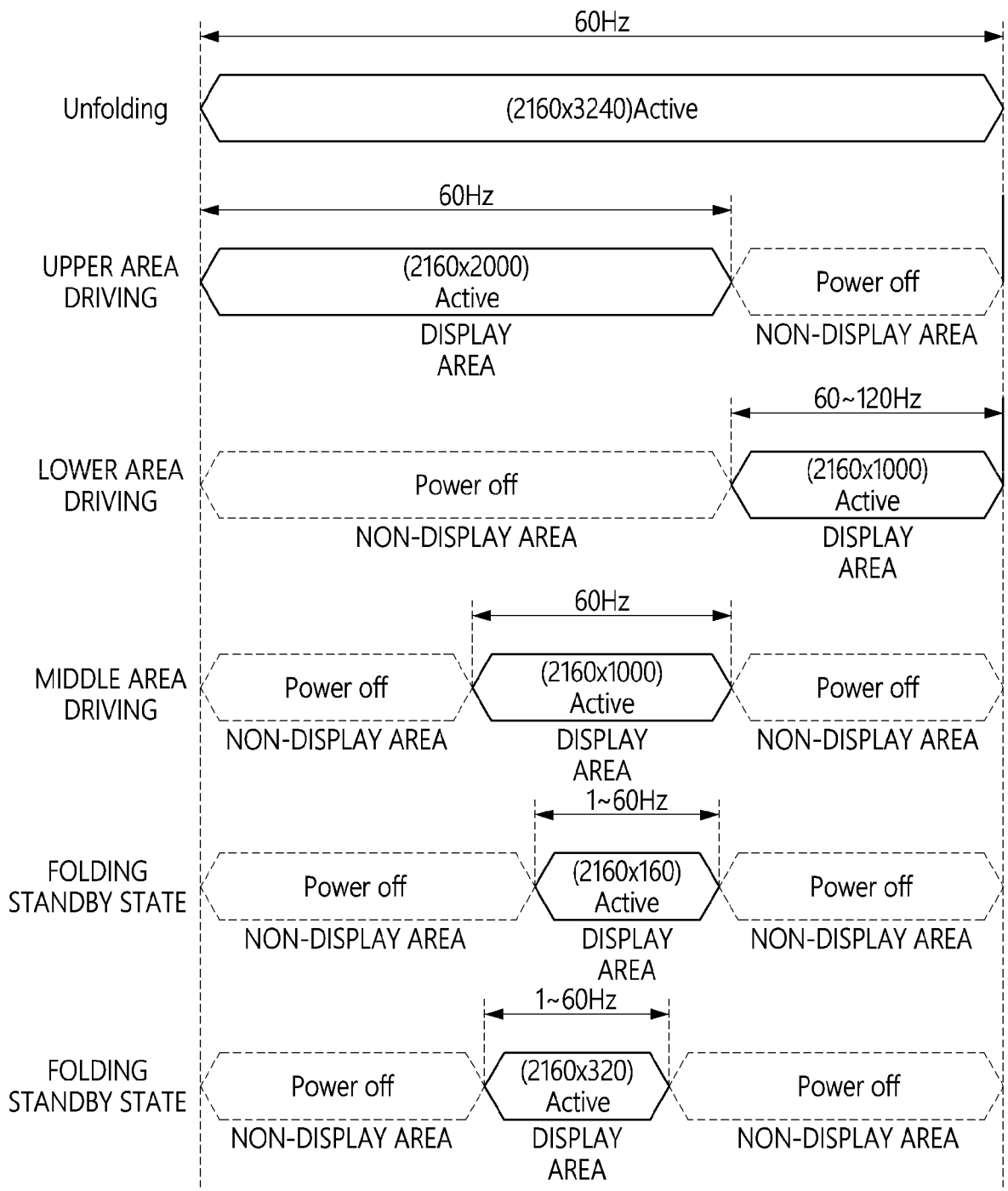

FIGS. 39 and 40 are diagrams illustrating a display state of the screen and data driving timing for reduction in power consumption during multi-folding.

When the configuration of the gate driver shown in FIGS. 27 to 36B is applied to the flexible display, a position and a resolution of the activated area may be freely adjusted. For example, as shown in FIGS. 39 and 40, the flexible display may include five folding driving areas, that is, a first screen area (or upper area), a second screen area (or middle area), and a third screen area (or lower area) for half driving during folding, and a fourth screen area and a fifth screen area provided in folding boundaries between the first screen area, the second screen area, and the third screen area.

In the folding waiting state, the fourth screen area or the fifth screen area is an area in which a variation in image is small and may be driven at a fundamental frequency (e.g., 60 Hz) or at a frequency that is lower than the fundamental frequency. This screen area may be a low-speed driving area.

On the other hand, in a folding half driving state in which an image is displayed on one or more among the first screen area, the second screen area, and the third screen area, an image display area may be driven at the fundamental frequency or a frequency that is higher than the fundamental frequency. This screen area may be a high-speed driving area.

In accordance with the present disclosure, a part of a screen not driven in a foldable display, for example, a screen at which a user does not look, is deactivated in a folded state, and a voltage which suppresses light emission of a light emitting element in the deactivated area is applied so that it is possible to reduce power consumption, increase a battery lifetime, and allow the deactivated screen to fully display black.

In accordance with the present disclosure, a gate driver is divided into two or more gate drivers to drive a screen without applying data voltages to pixels of the deactivated area in the folded state of the foldable display so that it is possible to sufficiently secure a blank interval for which the pixels are not driven.

In accordance with the present disclosure, the activated area at which the user looks can be driven on the foldable display at a high speed. In a VR mode, the screen is driven at a high speed so that it is possible to reduce motion sickness and fatigue of the user.

In accordance with the present disclosure, a control block is connected between a first shift register for outputting a scan signal and a second shift register for outputting an EM signal, and an output level of the EM signal is controlled using the control block so that it is possible to freely vary the activated area and the deactivated area of the screen and distribute a frequency. An area in which a variation in image change is low can be driven at a low speed, and an area in which a variation in image change is high can be driven at a high speed. Therefore, in accordance with the present disclosure, it is possible to implement a gate driving circuit capable of freely adjusting areas having different driving frequencies in the screen, and it is possible to reduce power consumption and vary a driving frequency in the screen using the gate driving circuit.

It should be noted that effects of the present disclosure are not limited to the above-described effect, and other effects of the present disclosure will be apparent to those skilled in the art from the appended claims.

Through the above description, those skilled in the art will appreciate that various changes and modifications are possible without departing from the technical idea of the present disclosure. Therefore, the technical scope of the present disclosure should not be limited to the contents described in the detailed description of the specification but should be determined by the scope of the appended claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A gate driving circuit, comprising:
a first shift register configured to output scan signals of a gate-on voltage, wherein phases of the scan signals of the gate-on voltage are sequentially delayed;
a second shift register having a plurality of light emission (EM) signal transfer parts which are connected in cascade through a clock line and a carry signal line, wherein each of the EM signal transfer parts operates as an off-driving signal transfer part which outputs an EM signal of a gate-off voltage or operates as an on-driving signal transfer part which outputs an EM signal including a gate-on voltage based on an EM output control signal input to a start terminal; and
a control block including a $n^{th}$ controller configured to generate one signal among the gate-off voltage, an EM start signal, or a carry signal from a $(n-1)^{th}$ EM signal transfer part as a $n^{th}$ EM output control signal to apply the $n^{th}$ EM output control signal to a start terminal of a $n^{th}$ EM signal transfer part, the $n^{th}$ controller configured to generate the $n^{th}$ EM output control signal based on a $n^{th}$ scan signal (n is a natural number) from the first shift register, a first control signal designating the off-driving signal transfer parts and the on-driving signal transfer parts among the EM signal transfer parts, a second control signal designating a first on-driving signal transfer part among the on-driving signal transfer parts, and a third control signal designating second to last on-driving signal transfer parts among the on-driving signal transfer parts.

2. The gate driving circuit of claim 1, wherein the $n^{th}$ controller includes:
a first transistor configured to be turned on in response to the $n^{th}$ scan signal and configured to apply the first control signal to a first node;
a second transistor configured to be turned on in response to the first control signal of the first node and configured to output the gate-off voltage as the $n^{th}$ EM output control signal;
a third transistor configured to be turned on in response to the second control signal and configured to apply the $n^{th}$ scan signal to a second node;
a fourth transistor configured to be turned on in response to the $n^{th}$ scan signal of the second node and configured to output the EM start signal as the $n^{th}$ EM output control signal;
a fifth transistor configured to be turned on in response to the $n^{th}$ scan signal and configured to apply the third control signal to a third node; and
a sixth transistor configured to be turned on in response to the third control signal of the third node and configured to output the carry signal from the $(n-1)^{th}$ EM signal transfer part as the $n^{th}$ EM output control signal.

3. The gate driving circuit of claim 2, wherein the $n^{th}$ controller further includes:
a first capacitor connected to the first node and configured to store the first control signal;
a second capacitor connected to the second node and configured to store the $n^{th}$ scan signal; and
a third capacitor connected to the third node and configured to store the third control signal.

4. The gate driving circuit of claim 2, wherein:
the first transistor includes a first gate electrode connected to an input terminal of the $n^{th}$ scan signal, a first electrode connected to an input terminal of the first control signal, and a second electrode connected to the first node;
the second transistor includes a second gate electrode connected to the first node, a third electrode connected to an input terminal of the gate-off voltage, and a fourth electrode connected to the start terminal of the $n^{th}$ EM signal transfer part through an output node;
the third transistor includes a third gate electrode connected to an input terminal of the second control signal, a fifth electrode connected to the input terminal of the $n^{th}$ scan signal, and a sixth electrode connected to the second node;
the fourth transistor includes a fourth gate electrode connected to the second node, a seventh electrode connected to the input terminal of the EM start signal, and an eighth electrode connected to the start terminal of the $n^{th}$ EM signal transfer part through the output node;
the fifth transistor includes a fifth gate electrode connected to the input terminal of the $n^{th}$ scan signal, a ninth electrode connected to an input terminal of the third control signal, and a tenth electrode connected to the third node; and
the sixth transistor includes a sixth gate electrode connected to the third node, a eleventh electrode to which the carry signal is input from the $(n-1)^{th}$ EM signal transfer part, and a twelfth electrode connected to the start terminal of the $n^{th}$ EM signal transfer part through the output node.

5. The gate driving circuit of claim 1, wherein, when the gate-off voltage is input to the start terminal as the $n^{th}$ EM output control signal, the $n^{th}$ EM signal transfer part operates as the off-driving signal transfer part, and, when one of the EM start signal and the carry signal from the $(n-1)^{th}$ EM signal transfer part is input to the start terminal as the $n^{th}$ EM output control signal, the $n^{th}$ EM signal transfer part operates as the on-driving signal transfer part.

6. A flexible display, comprising:
a flexible display panel including a screen in which a plurality of data lines, a plurality of scan lines, and a plurality of light emission (EM) lines cross each other and a plurality of pixels are disposed;
a data driving circuit configured to supply data voltages to the data lines; and
a gate driving circuit configured to supply scan signals to the scan lines and supply EM signals to the EM lines, thereby supplying the data voltages to at least some of the pixels,
wherein the gate driving circuit includes:
a first shift register configured to output scan signals of a gate-on voltage, wherein phases of the scan signals of the gate-on voltage are sequentially delayed;
a second shift register having a plurality of light emission (EM) signal transfer parts which are connected in cascade through a clock line and a carry signal line, wherein each of the EM signal transfer parts operates as an off-driving signal transfer part which outputs an EM signal of a gate-off voltage or operates as an on-driving signal transfer part which outputs an EM signal including a gate-on voltage based on an EM output control signal input to a start terminal; and
a control block including a $n^{th}$ controller configured to generate one signal among the gate-off voltage, an EM start signal, or a carry signal from a $(n-1)^{th}$ EM signal transfer part as a $n^{th}$ EM output control signal to apply the $n^{th}$ EM output control signal to a start terminal of a $n^{th}$ EM signal transfer part, the $n^{th}$ controller configured to generate the $n^{th}$ EM output control signal based on a $n^{th}$ scan signal (n is a natural number) from the first shift register, a first control signal designating the off-driving signal transfer parts and the on-driving signal transfer parts among the EM signal transfer parts, a second control signal designating a first on-driving signal transfer part among the on-driving signal transfer parts, and a third control signal designating second to last on-driving signal transfer parts among the on-driving signal transfer parts.

7. The flexible display of claim 6, wherein the $n^{th}$ controller includes:
   a first transistor configured to be turned on in response to the $n^{th}$ scan signal and configured to apply the first control signal to a first node;
   a second transistor configured to be turned on in response to the first control signal of the first node and configured to output the gate-off voltage as the $n^{th}$ EM output control signal;
   a third transistor configured to be turned on in response to the second control signal and configured to apply the $n^{th}$ scan signal to a second node;
   a fourth transistor configured to be turned on in response to the $n^{th}$ scan signal of the second node and configured to output the EM start signal as the $n^{th}$ EM output control signal;
   a fifth transistor configured to be turned on in response to the $n^{th}$ scan signal and configured to apply the third control signal to a third node; and
   a sixth transistor configured to be turned on in response to the third control signal of the third node and configured to output the carry signal from the $(n-1)^{th}$ EM signal transfer part as the $n^{th}$ EM output control signal.

8. The flexible display of claim 7, wherein the $n^{th}$ controller further includes:
   a first capacitor connected to the first node and configured to store the first control signal;
   a second capacitor connected to the second node and configured to store the $n^{th}$ scan signal; and
   a third capacitor connected to the third node and configured to store the third control signal.

9. The flexible display of claim 7, wherein:
   the first transistor includes a gate electrode connected to an input terminal of the $n^{th}$ scan signal, a first electrode connected to an input terminal of the first control signal, and a second electrode connected to the first node;
   the second transistor includes a gate electrode connected to the first node, a first electrode connected to an input terminal of the gate-off voltage, and a second electrode connected to the start terminal of the $n^{th}$ EM signal transfer part through an output node;
   the third transistor includes a gate electrode connected to an input terminal of the second control signal, a first electrode connected to the input terminal of the $n^{th}$ scan signal, and a second electrode connected to the second node;
   the fourth transistor includes a gate electrode connected to the second node, a first electrode connected to the input terminal of the EM start signal, and a second electrode connected to the start terminal of the $n^{th}$ EM signal transfer part through the output node;
   the fifth transistor includes a gate electrode connected to the input terminal of the $n^{th}$ scan signal, a first electrode connected to the input terminal of the third control signal, and a second electrode connected to the third node; and
   the sixth transistor includes a gate electrode connected to the third node, a first electrode to which the carry signal is input from the $(n-1)^{th}$ EM signal transfer part, and a second electrode connected to the start terminal of the $n^{th}$ EM signal transfer part through the output node.

10. The flexible display of claim 6, wherein, when the gate-off voltage is input to the start terminal as the $n^{th}$ EM output control signal, the $n^{th}$ EM signal transfer part operates as the off-driving signal transfer part, and, when one of the EM start signal and the carry signal from the $(n-1)^{th}$ EM signal transfer part is input to the start terminal as the $n^{th}$ EM output control signal, the $n^{th}$ EM signal transfer part operates as the on-driving signal transfer part.

11. The flexible display of claim 6, wherein, in a folded state in which the flexible display panel is folded, the screen includes:
   an activated area in which light is emitted from the pixels; and
   a deactivated area in which light is not emitted from the pixels, wherein the first shift register is configured to output the scan signals of the gate-on voltage to the activated area and the deactivated area, and
   the second shift register is configured to output the EM signal including the gate-on voltage to the activated area and outputs the EM signal of the gate-off voltage to the deactivated area.

12. The flexible display of claim 11, wherein:
   the activated area and the deactivated area are determined by the first control signal;
   a first pixel line of the activated area is determined by the second control signal; and
   second to last pixel lines of the activated area are determined by the third control signal.

13. The flexible display of claim 11, wherein, during a period in which the scan signals of the gate-on voltage are supplied to the deactivated area in one frame interval, an output buffer of the data driving circuit is turned off, and a data output channel of the data driving circuit becomes a high impedance state (Hi-Z).

14. The flexible display of claim 11, wherein the activated area is driven at a predetermined reference frequency or at a frequency different from the predetermined reference frequency.

15. The flexible display of claim 11, wherein each of the pixels includes:
   a light emitting element;
   a driving element connected to the light emitting element and configured to supply a current to the light emitting element;
   a first switching element configured to switch, in response to the EM signal, a current path between the driving element and the light emitting element; and
   a second switching element configured to, in response to the scan signal, apply an initialization voltage to an anode of the light emitting element.

16. The flexible display of claim 15, wherein:
   in the activated area, in response to an $(n-1)^{th}$ scan signal of which a phase leads more than that of the $n^{th}$ scan signal, the second switching element is configured to supply the initialization voltage to the anode of the light emitting element prior to the data voltage;
   in the deactivated area, in response to the $n^{th}$ scan signal, the second switching element is configured to supply the initialization voltage to the anode of the light emitting element; and the initialization voltage is configured to set to a direct-current (DC) voltage that is lower than a threshold voltage of the light emitting element.

17. The flexible display of claim 16, wherein in the deactivated area, the first switching element is configured to be maintained in an off state based on the EM signal of the gate-off voltage.

* * * * *

UNITED STATES PATENT AND TRADEMARK OFFICE
CERTIFICATE OF CORRECTION

PATENT NO. : 11,462,171 B2
APPLICATION NO. : 17/116852
DATED : October 4, 2022
INVENTOR(S) : Dae Seok Oh et al.

Page 1 of 1

It is certified that error appears in the above-identified patent and that said Letters Patent is hereby corrected as shown below:

In the Claims

Column 29, Claim 1, Line 15:
"a n$^{th}$" should read: --an n$^{th}$--.

Column 29, Claim 1, Line 18:
"a n$^{th}$" should read: --an n$^{th}$--.

Column 29, Claim 1, Lines 19-20:
"a n$^{th}$" should read: --an n$^{th}$--.

Column 29, Claim 1, Lines 21-22:
"a n$^{th}$" should read: --an n$^{th}$--.

Column 30, Claim 6, Line 61:
"a n$^{th}$" should read: --an n$^{th}$--.

Column 30, Claim 6, Line 64:
"a n$^{th}$" should read: --an n$^{th}$--.

Column 30, Claim 6, Line 66:
"a n$^{th}$" should read: --an n$^{th}$--.

Column 31, Claim 6, Line 1:
"a n$^{th}$" should read: --an n$^{th}$--.

Signed and Sealed this
Fourth Day of June, 2024

Katherine Kelly Vidal
*Director of the United States Patent and Trademark Office*